(12) United States Patent
Kim et al.

(10) Patent No.: US 9,831,179 B2
(45) Date of Patent: Nov. 28, 2017

(54) SEMICONDUCTOR DEVICE AND METHOD OF MANUFACTURING A SEMICONDUCTOR DEVICE

(71) Applicants: Kyoung-hoon Kim, Seoul (KR); Woo-sung Yang, Gwangmyeong-si (KR); Jee-hoon Hwang, Hwaseong-si (KR)

(72) Inventors: Kyoung-hoon Kim, Seoul (KR); Woo-sung Yang, Gwangmyeong-si (KR); Jee-hoon Hwang, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/191,558

(22) Filed: Jun. 24, 2016

(65) Prior Publication Data

US 2017/0062327 A1    Mar. 2, 2017

(30) Foreign Application Priority Data

Aug. 25, 2015    (KR) ........................ 10-2015-0119814

(51) Int. Cl.

| | | |
|---|---|---|
| *H01L 23/48* | (2006.01) | |
| *H01L 23/528* | (2006.01) | |
| *H01L 21/033* | (2006.01) | |
| *H01L 21/768* | (2006.01) | |
| *H01L 21/311* | (2006.01) | |

(Continued)

(52) U.S. Cl.
CPC ........ *H01L 23/528* (2013.01); *H01L 21/0332* (2013.01); *H01L 21/0337* (2013.01); *H01L 21/31144* (2013.01); *H01L 21/3212* (2013.01); *H01L 21/7684* (2013.01); *H01L 21/76892* (2013.01); *H01L 27/11517* (2013.01); *H01L 27/11563* (2013.01)

(58) Field of Classification Search
CPC ..................................................... H01L 23/528
USPC ........................................................ 257/773
See application file for complete search history.

(56) References Cited

U.S. PATENT DOCUMENTS

| | | | |
|---|---|---|---|
| 7,964,510 B2 | 6/2011 | Heo | |
| 8,158,476 B2 | 4/2012 | Tran et al. | |

(Continued)

FOREIGN PATENT DOCUMENTS

| | | |
|---|---|---|
| JP | 2012-054557 | 3/2012 |
| JP | 2012-216846 | 8/2012 |

(Continued)

*Primary Examiner* — Long K Tran
(74) *Attorney, Agent, or Firm* — Muir Patent Law, PLLC

(57) ABSTRACT

A semiconductor device includes a plurality of line patterns formed apart from one another on a substrate, the plurality of line patterns having a first width and extending parallel to one another in a first direction. A first line pattern of the plurality of line patterns may include a wider portion having a second width in a second direction perpendicular to the first direction that is greater than the first width. One or more second line patterns may be located adjacent to the first line pattern and include a conformal portion conformally formed about the wider portion of the first line pattern. One or more third line patterns may be located adjacent to the second line pattern and include an end portion near the conformal portion of the one or more second line pattern.

20 Claims, 56 Drawing Sheets

(51) Int. Cl.
*H01L 21/321* (2006.01)
*H01L 27/11517* (2017.01)
*H01L 27/11563* (2017.01)

(56) References Cited

U.S. PATENT DOCUMENTS

| | | |
|---|---|---|
| 8,242,022 B2 | 8/2012 | Kim |
| 8,389,400 B2 | 3/2013 | Lee et al. |
| 8,524,605 B1 | 9/2013 | Chen |
| 8,541,306 B2 | 9/2013 | Yang et al. |
| 8,916,447 B2 | 12/2014 | Park et al. |
| 2012/0106282 A1* | 5/2012 | Shikata ............... H01L 23/5286 365/205 |
| 2013/0048603 A1 | 2/2013 | Kim et al. |
| 2014/0346677 A1* | 11/2014 | Sonoda ............. H01L 21/76838 257/774 |
| 2016/0035307 A1* | 2/2016 | Jeon ...................... H01L 27/124 345/211 |

FOREIGN PATENT DOCUMENTS

| KR | 10-0994715 | 11/2010 |
|---|---|---|
| KR | 10-1024712 | 3/2011 |
| KR | 10-2012-0022208 | 3/2012 |

\* cited by examiner

B - B'

FIRST DIRECTION
⊙ → SECOND DIRECTION

B - B'

FIRST DIRECTION
⊙⟶ SECOND DIRECTION

B - B'

FIRST DIRECTION
⊙⟶ SECOND DIRECTION

B - B'

FIRST DIRECTION
⊙⟶ SECOND DIRECTION

B - B'

FIRST DIRECTION
⊙⟶ SECOND DIRECTION

SEMICONDUCTOR DEVICE AND METHOD OF MANUFACTURING A SEMICONDUCTOR DEVICE

CROSS-REFERENCE TO RELATED APPLICATION

This application claims priority under 35 U.S.C. §119 to Korean Patent Application No. 10-2015-0119814, filed on Aug. 25, 2015, in the Korean Intellectual Property Office, the disclosure of which is incorporated by reference in its entirety.

BACKGROUND

The inventive concept relates to a semiconductor device and a method of manufacturing a semiconductor device. For example, the present disclosure relates to a semiconductor device including high-density patterns having ultrafine widths and pitches formed in a high-density region of the semiconductor device and a method of forming patterns of the semiconductor device.

The manufacture of highly scaled, highly integrated semiconductor devices may involve forming fine patterns having fine widths and intervals that exceed the resolution limit of a photolithography process. Thus, a technique of forming the fine patterns beyond the resolution limit of a photolithography process may be required.

SUMMARY

The disclosure provides a semiconductor device and a method of manufacturing a semiconductor device in which high-density patterns having ultrafine widths and pitches may be formed by using patterns having sizes that may be embodied below the resolution limit of a photolithography process.

The disclosure also provides a semiconductor device and a method of manufacturing a semiconductor device in which pads, for example electrical contact pads, may be formed during the formation of high-density patterns without an additional photolithography process for forming the pads.

Aspects of the inventive concept should not be limited by the above description, and other unmentioned aspects will be clearly understood by one of ordinary skill in the art from example embodiments described herein.

According to an aspect of the inventive concept, there is provided a semiconductor device including a plurality of line patterns spaced apart from one another formed on a substrate, the plurality of line patterns having a first width and extend parallel to one another in a first direction, a first line pattern of the plurality of line patterns, the first line pattern including a wider portion having a second width greater than the first width in a second direction perpendicular to the first direction, a second line pattern of the plurality of line patterns and located adjacent to the first line pattern, the second line pattern being spaced apart from the wider portion of the first line pattern and conformally formed about the wider portion of the first line pattern, and a third line pattern selected from the plurality of line patterns and located adjacent to the second line pattern, the third line pattern including an end portion, wherein the second line pattern is formed between the first line pattern and the third line pattern, and, with respect to a line extending in the second direction that intersects the third line pattern at the end portion of the third line pattern, the distance between the first line pattern and the second line pattern is substantially the same as the distance between the second line pattern and the third line pattern.

The plurality of line patterns may comprise a plurality of second line patterns and a plurality of third line patterns, the wider portion of the first line pattern protrude from both sidewalls of the first line pattern in the second direction, two second line patterns are respectively located on both sides of the wider portion, and the two second line patterns are spaced apart from the wider portion of the first line pattern and conformally formed about the wider portion of the first line pattern, and two third line patterns are located adjacent to the respective second line patterns, and include respective end portions, and, with respect to a line extending in the second direction that intersects the third line pattern at the respective end portions of the third line patterns, the distances between respective first line patterns and respective second line patterns are substantially the same as the distances between the respective second line patterns and the respective third line patterns. The two second line patterns may be in a mirror-image relationship to each other with respect to the wider portion of the first line pattern. The end portions of the two third line patterns may face the conformally formed portions of the two second line patterns in the first direction respectively. The end portions of the third line patterns may be spaced apart from the conformally formed portions of the second line patterns by a substantially same distance as the first width. The wider portion may protrude from one sidewall of the first line pattern, the second line pattern is located in a position facing the wider portion, and the end portion of the third line pattern is located near the conformally formed portion of the second line pattern.

The end portion of the third line pattern may face the conformally formed portion of the second line pattern in the first direction. The end portion of the third line pattern may be spaced apart from the conformally formed portion of the second line pattern by a substantially same distance as the first width in the first direction. A length of the third line pattern may be less than a length of the first line pattern and the second line pattern in the first direction. The plurality of line patterns may further comprise a dummy line pattern located opposite the end portion of the third line pattern across the conformally formed portion of the second line pattern in the first direction, wherein the dummy line pattern may have a substantially same width as the first width and is parallel to the first direction. A length of the dummy line pattern may be less than a length of the first line pattern and the second line pattern in the first direction. The wider portion of the first line pattern may have a third width in the first direction, the conformally formed portion of the second line pattern has a fourth width in the first direction, and the fourth width is greater than the third width. A fourth line pattern may be located adjacent to the third line pattern, and a minimum space between the fourth line pattern and the conformally formed portion of the second line pattern is substantially equal to the first width.

A fourth line pattern may be located adjacent to the third line pattern, and a minimum space between the fourth line pattern and the conformally formed portion of the second line pattern is greater than the first width. The plurality of line patterns may comprise a conductive material. The device may further comprise a plurality of insulating patterns between two adjacent line patterns of the plurality of line patterns. The plurality of insulating patterns may have a width substantially equal to the first width in the second direction. The plurality of line patterns may comprise a plurality of bit lines included in a memory device of the semiconductor device. The wider portion of the first line pattern may be located in a cell array region. The wider portion of the first line pattern may be located in a page buffer region.

According to an embodiment of the present disclosure, a semiconductor device comprises a plurality of line patterns formed on a substrate having a first width and extending in a first direction parallel to one another, the plurality of line patterns spaced apart from one another in a second direction perpendicular to the first direction, a first line pattern of the plurality of line patterns, the first line pattern including a first wider portion having a second width taken in the second direction greater than the first width taken in the second direction, a second line pattern of the plurality of line patterns located adjacent to the first line pattern, the second line pattern comprising a second wider portion having a third width greater than the first width in the second direction and a first conformal portion conformally formed about the first wider portion and spaced apart from the first wider portion, and a third line pattern of the plurality of line patterns and located adjacent to the second line pattern, the third line pattern comprising a third wider portion having a fourth width in the second direction greater than the first width, a second conformal portion conformally formed about the second wider portion and spaced apart from the second wider portion, and an end portion located near the first conformal portion, wherein the second line pattern is formed between the first line pattern and the third line pattern, and, with respect to a line extending in the second direction that intersects the third line pattern at the end portion of the third line pattern, the distance between the first line pattern and the second line pattern is substantially the same as the distance between the second line pattern and the third line pattern.

The first wider portion may protrude from one sidewall of the first line pattern, the second wider portion may protrude from one sidewall of the second line pattern, and the third wider portion may protrude from one sidewall of the third line pattern. The third line pattern may have a length less than each of the first line pattern and the second line pattern in the first direction. The end portion of the third line pattern may face the first conformal portion of the second line pattern. A distance between the second wider portion of the second line pattern and the first conformal portion in the first direction may be substantially equal to a distance between the third wider portion of the third line pattern and the second conformal portion in the first direction.

According to an embodiment of the disclosure, A method of manufacturing a semiconductor device comprises forming a plurality of mask layers sequentially stacked on a substrate, forming a first mask pattern including a plurality of mask line patterns on the plurality of mask layers, the plurality of mask line patterns spaced apart from one another and extending parallel to one another in a first direction, the plurality of mask line patterns each having a first width in a second direction perpendicular to the first direction, the plurality of mask line patterns comprising at least one first mask line pattern, each first mask line pattern having a varied width portion having a second width different from the first width in the second direction, sequentially patterning the plurality of mask layers by using quadruple patterning technology (QPT) using the first mask pattern to form a final mask pattern, covering the final mask pattern with a conductive layer, and removing the conductive layer until a top surface of the final mask pattern is exposed, to form a plurality of conductive line patterns spaced apart from one another, the plurality of conductive line patterns having a third width less than the first width and extending parallel to one another in the first direction.

The forming of the plurality of mask layers may comprise forming a third mask layer on the substrate, forming a second mask layer on the third mask layer, and forming a first mask layer on the second mask layer, wherein the forming of the final mask pattern may comprise forming a first spacer layer on the first mask layer and the first mask pattern, the first spacer layer having a thickness substantially equal to the third width, etching the first spacer layer to form first spacers on sidewalls of the first mask pattern, and removing the first mask pattern, etching the first mask layer by using the first spacers as an etch mask to form a second mask pattern, forming a second spacer layer on the second mask layer and the second mask pattern, the second spacer layer having a thickness substantially equal to the third width, etching the second spacer layer to form second spacers on sidewalls of the second mask pattern, and removing the second mask pattern, and etching the second mask layer by using the second spacers as an etch mask to form a final mask pattern.

During the forming of the plurality of conductive line patterns, the plurality of conductive line patterns may comprise, a first conductive line pattern comprising a first wider portion having a fourth width greater than the third width in the second direction, at least one second conductive line pattern located adjacent to the first conductive line pattern, the at least one second conductive line pattern including a conformal portion conformally formed about the first wider portion and spaced apart from the first wider portion, and at least one third conductive line pattern located adjacent to the second conductive line pattern, the at least one third conductive line pattern comprising an end portion near the conformal portion.

The plurality of conductive line patterns may comprise a plurality of second conductive line patterns and a plurality of third conductive line patterns, wherein conformal portions of the second conductive line patterns may be located about both sides of the first wider portion, and end portions of the third conductive line patterns may be located adjacent the conformal portions of the second conductive line patterns. The conformal portion of the second conductive line pattern may have a constant spacing away from a side of the first wider portion, and the end portion of the third conductive line pattern may be located adjacent the conformal portion of the second conductive line pattern. During the forming of the first mask pattern, a second width of the varied width portion in the second direction may be greater than the first width, and the varied width portion comprises protrusions that symmetrically protrude from both sidewalls of the first mask line pattern. During the forming of the first mask pattern, a second width of the varied width portion in the second direction may be greater than the first width, and the varied width portion comprises a protrusion that protrudes from one sidewall of the first mask line pattern, wherein another sidewall of the first mask line pattern opposite the one sidewall of first mask line pattern is flush with portions of the first mask line pattern having the first width. During the forming of the first mask pattern, a plurality of first mask line patterns may be formed each comprising a varied width portion having a second width in the second direction less than the first width to form a recess within the corresponding first mask line pattern, wherein two adjacent first mask line patterns may be symmetrical to each other in a mirror-image relationship at the recesses of the two adjacent first mask line patterns. During the forming of the first mask pattern, a second width of the varied width portion may be less than the first width in the second direction forming a recess in one sidewall of the first mask line pattern. During the forming of the plurality of conductive line patterns, the conductive layer may comprise a metal, and the removing of the conductive layer is performed by using a chemical mechanical polishing (CMP) process.

According to an embodiment of the disclosure, a method of manufacturing a semiconductor device comprises forming a plurality of mask layers sequentially stacked on a substrate, forming a first mask pattern on the plurality of mask layers by a photolithography process, forming a first spacer layer on the first mask pattern and a first mask layer of the plurality of mask layers, patterning the first spacer layer by an anisotropic etching process to form a first spacer, removing the first mask pattern, patterning the first mask layer to form a second mask pattern by an anisotropic etching process using the first spacer as an etch mask, removing the first spacer, forming a second spacer layer on the second mask pattern and a second mask layer of the plurality of mask layers, patterning the second spacer layer by an anisotropic etching process to form a second spacer, removing the second mask pattern, patterning the second mask layer to form a third mask pattern by an anisotropic etching process using the second spacer as an etch mask, removing the second spacer, forming a conductor layer on the third mask pattern and on the substrate, and removing an upper portion of the conductor layer to expose the third mask pattern and to form a plurality of conductor line patterns, wherein a first conductor line pattern of the plurality of conductor line patterns extends in a first direction and has a first width in a second direction that is substantially perpendicular to the first direction, the first conductor comprising a wider portion having a second width in the second direction that is greater than the first width, wherein a second conductor line pattern of the plurality of conductor line patterns extends in the first direction, the second conductor line pattern being spaced apart from the first conductor and formed conformally about the wider portion of the first conductor line pattern.

The wider portion of the first conductor line pattern may be a pad in a cell array region or in a page buffer region of a semiconductor device, and the method further comprises forming a conductive via in contact with the pad. A third conductor line pattern of the plurality of conductor line pattern may extend in the first direction and has an end portion, and the first, second, and third conductor line patterns extend in parallel to each other in the first direction at the end portion of the third conductor line pattern, wherein, with respect to a line extending in the second direction and intersecting the third conductor line pattern at the end portion of the third conductor line pattern, the distance between the first conductor line pattern and the second conductor line pattern in the second direction may be substantially the same as the distance between the second conductor line pattern and the third conductor line pattern. The conformally formed portion of the second conductor line pattern may be located between the wider portion of the first conductor line pattern and the end portion of the third conductor line pattern, and the distance between the conformally formed portion of the second conductor line pattern and the wider portion of the first conductor line pattern in the first direction may be substantially the same as the distance between the conformally formed portion of the second line pattern and the end portion of the third conductor line pattern in the first direction. The first mask pattern may comprise a first mask pattern extending in the first direction, and the first mask pattern may comprise a first portion having a third width in the second direction and a second portion having a fourth width in the second direction that is different from the third width.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
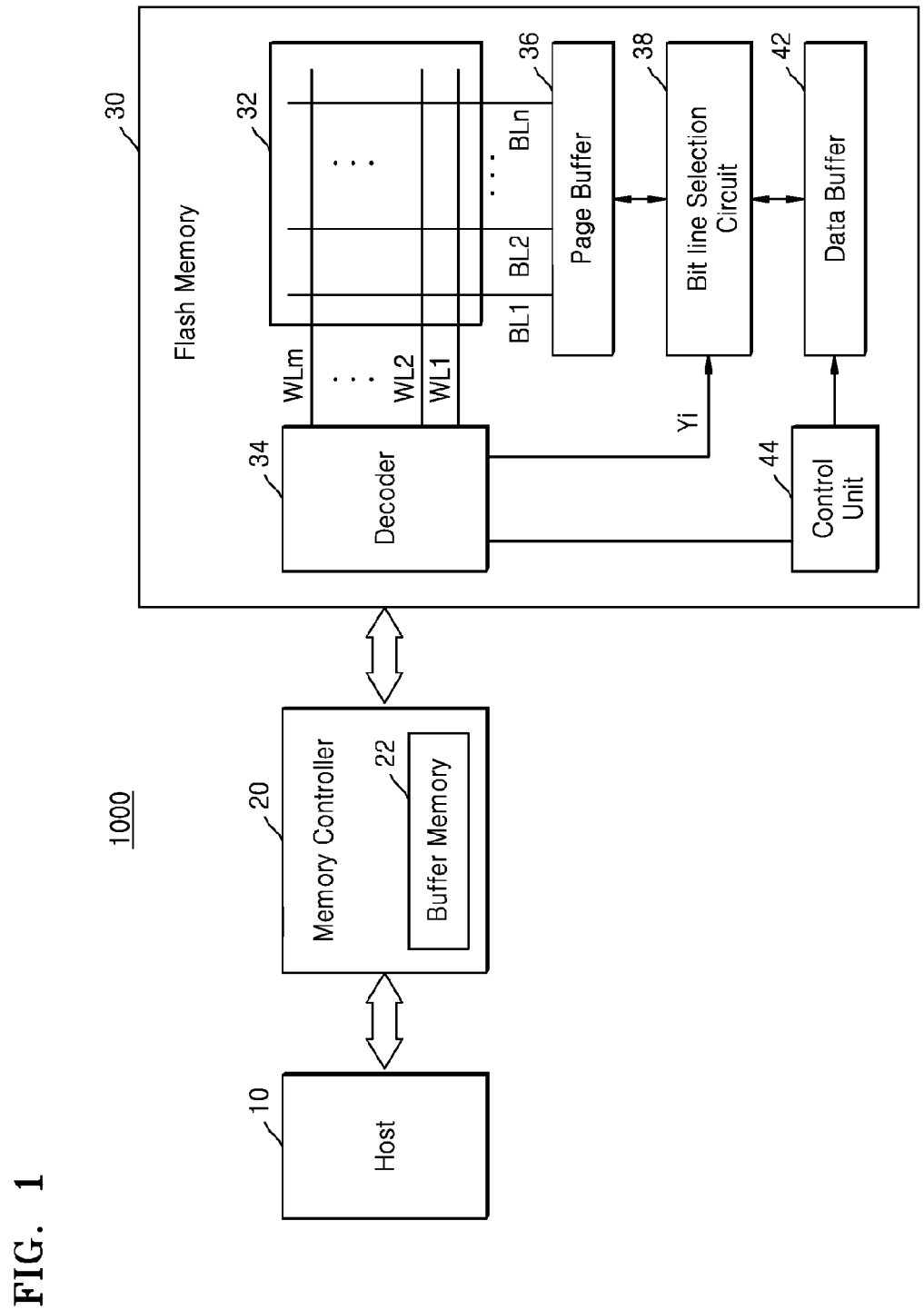
FIG. 1 is a schematic block diagram of a memory system of a semiconductor device according to an exemplary embodiment.

As used herein, expressions such as "at least one of," when preceding a list of elements, modify the entire list of elements and do not modify the individual elements of the list.

The inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity. Like reference numerals in the drawings denote like elements, and thus descriptions thereof will be omitted.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

When some embodiments may be embodied otherwise, respective process steps described herein may be performed otherwise. For example, two process steps described in a sequential order may be performed substantially the same time or in reverse order.

Variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing.

FIG. 1 is a schematic block diagram of a memory system 1000 of a semiconductor device according to some exemplary embodiments.

Referring to FIG. 1, the memory system 1000 of the semiconductor device may include a host 10, a memory controller 20, and a flash memory 30.

The memory controller 20 may serve as an interface between the host 10 and the flash memory 30 and include a buffer memory 22. Although not shown, the memory controller 20 may further include a central processing unit (CPU), read-only memory (ROM), random access memory (RAM), and interface blocks.

The flash memory 30 may further include a cell array 32, a decoder 34, a page buffer 36, a bit line selection circuit 38, a data buffer 42, and a control unit 44.

The host 10 may input data and a write command to the memory controller 20, and the memory controller 20 may control the flash memory 30 to write data to the cell array 32 in response to the input command. Also, the memory controller 20 may control the flash memory 30 to read data stored in the cell array 32 in response to a read command input by the host 10. The buffer memory 22 may temporarily store data transmitted between the host 10 and the flash memory 30.

The cell array 32 of the flash memory 30 may include a plurality of memory cells. The decoder 34 may be connected to the cell array 32 via word lines WL1, WL2 . . . and WLm. The decoder 34 may receive an address from the memory controller 20 and generate a selection signal Yi to select one of the word lines WL1, WL2 . . . and WLm or select one of bit lines BL1, BL2 . . . and BLn. The page buffer 36 may be connected to the cell array 32 via the bit lines BL1, BL2 . . . and BLn.

Figure 2:
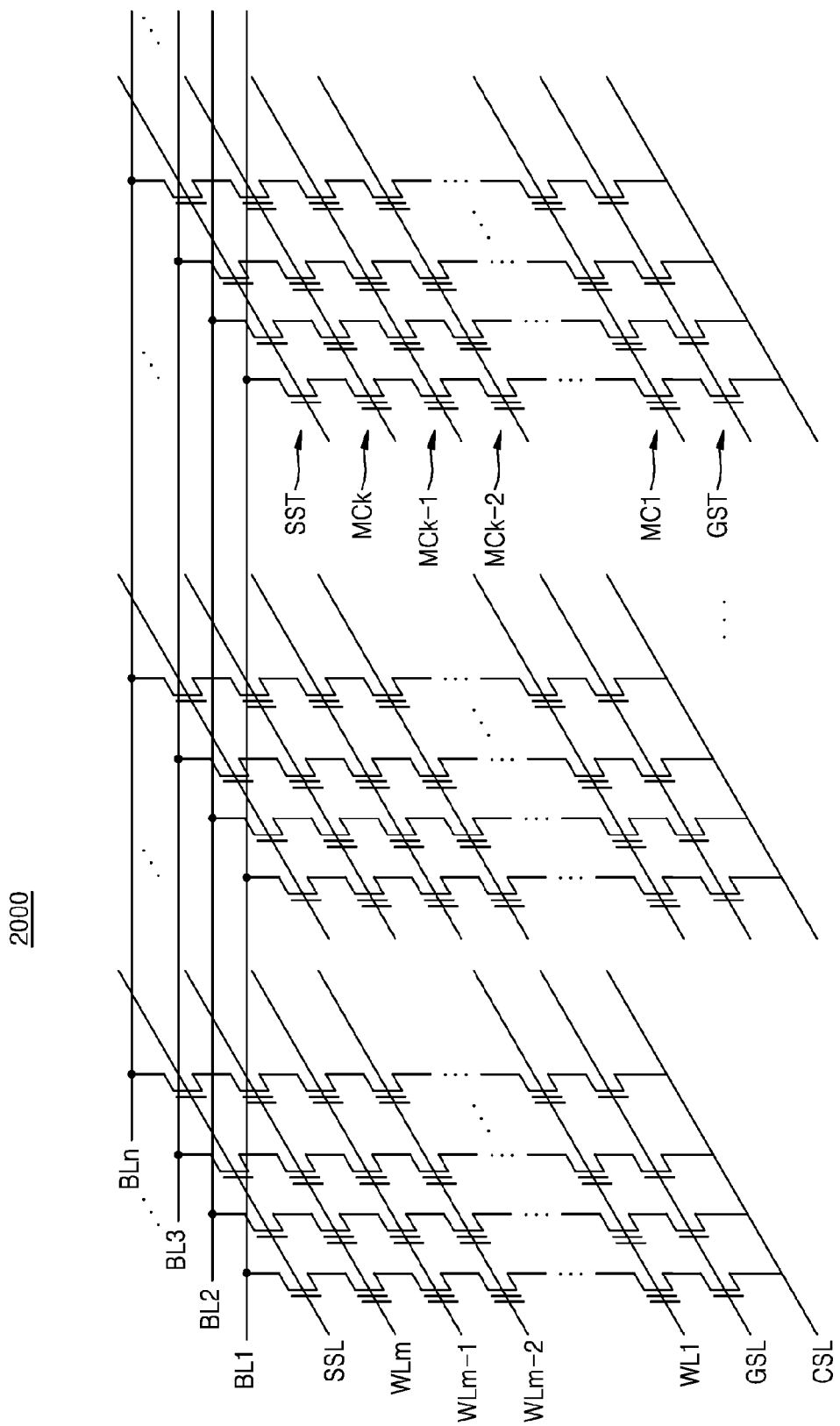
FIG. 2 is an equivalent circuit diagram of a vertical cell array of a semiconductor device according to an exemplary embodiment.

FIG. 2 is an equivalent circuit diagram of a vertical memory cell array 2000 of a semiconductor device according to an exemplary embodiment.

FIG. 2 is an equivalent circuit diagram of the cell array 32 of FIG. 1. A cell array of a semiconductor device according to an exemplary embodiment may be the vertical memory cell array 2000 having a three-dimensional (3D) structure shown in FIG. 2 or a 2D planar cell array (not shown). The vertical memory cell array 2000 of the semiconductor device according to the present embodiment may include a plurality of memory cell strings including k memory cell devices MC1, MC2, . . . , and MCk, which are connected in series, and a ground selection transistor GST and a string selection transistor SST, which are respectively connected in series to both ends of the k memory cell devices MC1, MC2, . . . , and MCk.

The k memory cell devices MC1, MC2 . . . and MCk, which are connected in series, may be respectively connected to the word lines WL1, WL2, WLm configured to select at least some of the memory cell devices MC1, MC2, . . . , and MCk.

A gate terminal of the ground selection transistor GST may be connected to a ground selection line GSL, and a source terminal of the ground selection transistor GST may be connected to a common source line CSL. Also, a gate terminal of the string selection transistor SST may be connected to a string selection line SSL, and a source terminal of the string selection transistor SST may be connected to a drain terminal of the memory cell device MCk.

One ground selection transistor GST and one string selection transistor SST may be connected to the k memory cell devices MC1, MC2 . . . and MCk that are connected in series. In another case, a plurality of ground selection transistors GST or a plurality of string selection transistors SST may be connected to the k memory cell devices MC1, MC2 . . . and MCk that are connected in series.

A drain terminal of the string selection transistor SST may be connected to the bit lines BL1, BL2 . . . and BLn. When a signal is applied to the gate terminal of the string selection transistor SST via the string selection line SSL, a signal applied via the bit lines BL1, BL2, . . . , and BLn may be transmitted to the k memory cell devices MC1, MC2, . . . , and MCk, which are connected in series, so that a data read operation or a data write operation may be enabled. Also, by applying a signal to the gate terminal of the ground selection transistor GST via the ground selection line GSL, an erase operation of removing all charges stored in the k memory cell devices MC1, MC2 . . . and MCk may be performed.

According to an exemplary embodiment, a vertical memory cell array 2000 is provided. The vertical memory cell array 2000 is monolithically formed in one or more physical levels of arrays of memory cells MC1, MC2 . . . and MCk having an active area provided above a silicon substrate and circuitry associated with the operation of the memory cells MC1, MC2 . . . and MCk, wherein such associated circuitry may be above or within the silicon substrate. The term "monolithic" means that layers of each level of the vertical memory cell array 2000 are directly deposited on the layers of each underlying level of the vertical memory cell array 2000.

In an exemplary embodiment, the vertical memory cell array 2000 having the 3D structure may include a vertical NAND (VNAND) strings in which at least one memory cell device MCk is located on another memory cell device MCk-1 in a vertical direction. The at least one memory cell device MCk may include a charge trap layer.

The following patent documents, which are hereby incorporated by reference, disclose suitable configurations for three-dimensional memory arrays, in which the three-dimensional memory array is configured at a plurality of levels, with word lines and/or bit lines shared between levels: U.S. Pat. Nos. 7,679,133; 8,553,466; 8,654,587; 8,559,235; and US Pat. Pub. No. 2011/0233648.

Among flash memory devices, a NAND flash memory device may have a relatively high integration density due to a structure in which a plurality of memory cells are connected in series. However, to shrink a chip size, it is often necessary to further reduce the design rule of the NAND flash memory device. Also, a reduction in the design rule has led reduction in the minimum pitch between patterns forming NAND flash memory devices. To form fine patterns of a semiconductor device according to the reduced design rule, embodiments herein provide a semiconductor device and a method of manufacturing a semiconductor device, by using patterns having sizes that may be obtained below the resolution limit of an exposure apparatus and exposure technology of presently developed photolithography technology. For example, certain embodiments of the present disclosure provide a semiconductor device and a method of manufacturing the same using current photolithography technology that may form fine conductive lines and pads having a size below the resolution limit of current photolithography technology.

Figure 3A:
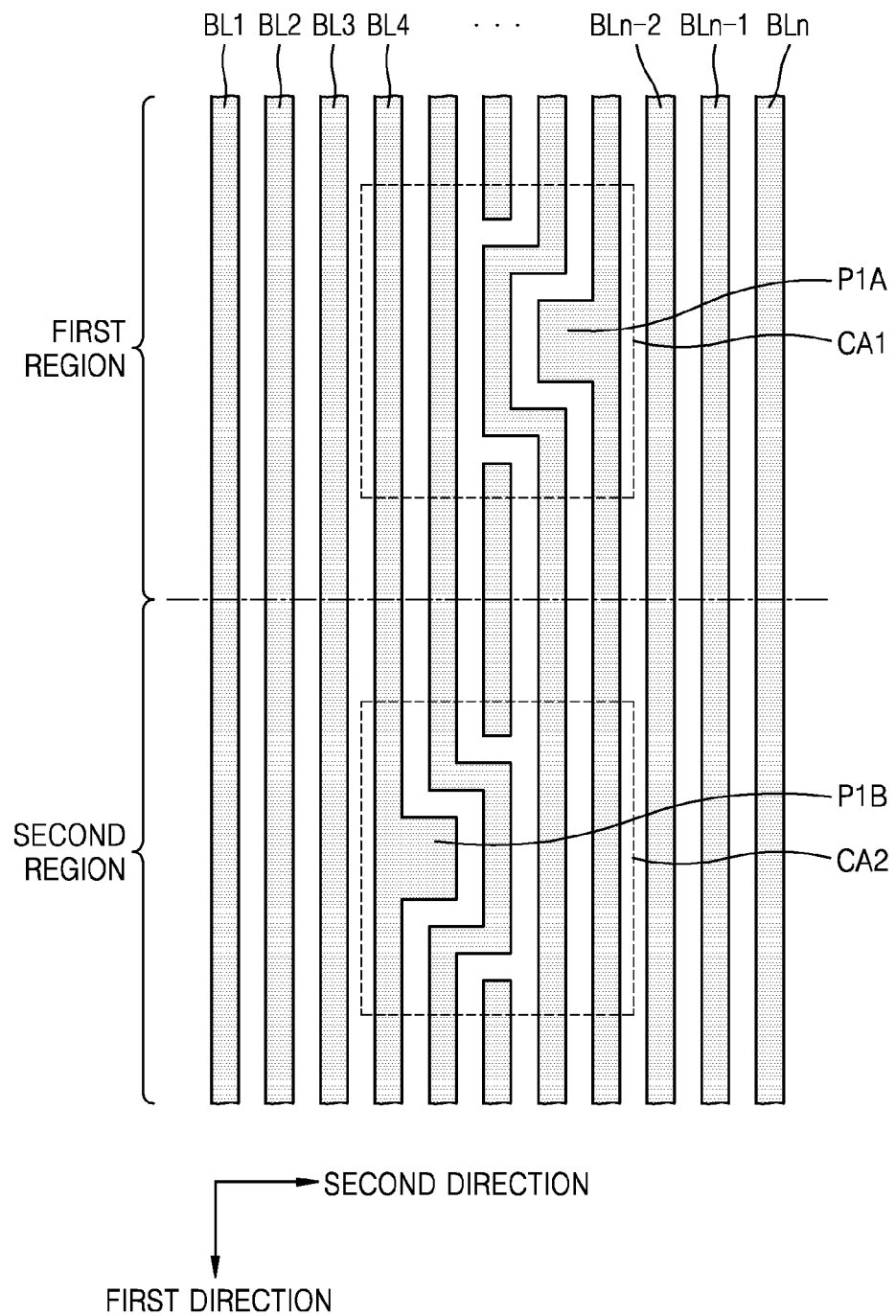
FIGS. 3A and 3B are schematic plan views of the arrangement of a conductive line pattern and a contact pad of a semiconductor device according to an exemplary embodiment.
Figure 3B:
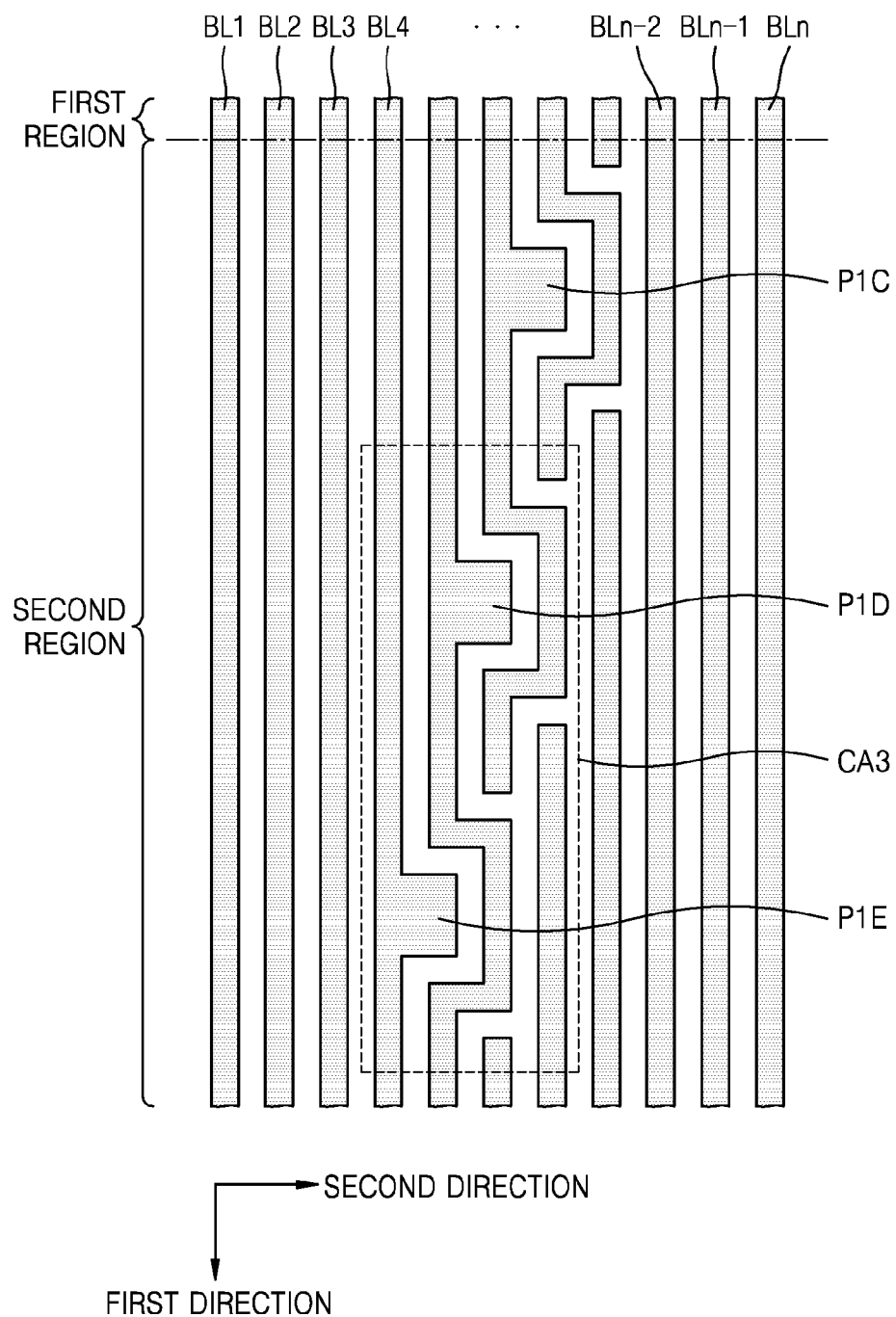

FIGS. 3A and 3B are schematic plan views of the arrangement of a conductive line pattern and a contact pad of a semiconductor device according to an exemplary embodiment.

FIG. 3A shows a first region and a second region in which conductive line patterns BL1, BL2, . . . , and BLn and contact pads P1A and P1B are formed, according to an exemplary embodiment.

The first region may be a cell array (refer to 32 in FIG. 1), and the second region may be a page buffer (refer to 36 in FIG. 1). Also, the conductive line patterns BL1, BL2 . . . and BLn may be bit lines.

The contact pads P1A and P1B may be located in the first region and/or the second region. For example, contact pad forming regions CA1 and CA2 may be located only in the cell array (refer to 32 in FIG. 1), only in the page buffer (refer to 36 in FIG. 1), or in both the cell array 32 and the page buffer 36. The contact pads may be in physical and electrical contact with conductive vias (not shown), that provide a vertical that to connect the conductive line patterns BL1 to wiring (e.g., metal conductor lines) at other layers of the semiconductor device or to conductive portions of the substrate of the semiconductor device (e.g., such as a S/D of a transistor). For example, when the conductive lines are bit lines (including sub bit lines used to connect main bit lines to a page buffer), vias may be used to extend between (and contact) the contact pads CA1 and CA2 and a node of the page buffer (e.g., a S/D of a pass transistor interposed between the bit line and the data latch and other remaining circuitry of the page puffer). As another example, when the conductive lines are bit lines, vias may be used to extend between (and contact) the contact pads CA1 and CA2 and an S/D of a string select transistor connected to a NAND cell string (e.g., comprising a group of serially connected EEPROM memory cell transistors). The inventive concept is not limited to FIG. 3A regarding the conductive line patterns BL1, BL2 . . . and BLn and the contact pads P1A and P1B. Positions, arrangements, shapes, directions, and numbers of the conductive line patterns BL1, BL2 . . . and BLn and the contact pads P1A and P1B and positional relationships between the contact pads P1A and P1B may vary depending on a design of a semiconductor device.

A process of manufacturing the conductive line patterns BL1, BL2, . . . , and BLn including the contact pads P1A and P1B will be described in detail later with reference to FIGS. 4A to 19F.

Referring to FIG. 3B, according to an exemplary embodiment, conductive line patterns BL1, BL2, . . . , and BLn may be formed in a first region and a second region, and contact pads P1C, P1D, and P1E may be formed in the second region.

Although FIG. 3B illustrates an example in which the contact pads P1C, P1D, and P1E are located only in the second region, the inventive concept is not limited thereto.

A process of manufacturing each of the contact pads P1C, P1D, and P1E will be described in detail later with reference to FIGS. 4A to 19F. Arrangement relationships among the contact pads P1C, P1D, and P1E will now be described.

The second region of the semiconductor device may include a large number of contact pads, and predetermined spaces for forming the contact pads may be allocated to form the large number of contact pads. In general, the contact pads may benefit from a larger width than conductive line patterns in a second direction (e.g., in a horizontal direction perpendicular the direction that the line patterns extend). Thus, according to some conventional designs, a pitch between the conductive line patterns is increased to accommodate the contact pads so that the resulting semiconductor device includes only a relatively small number of conductive line patterns in an area.

According to an exemplary embodiment, the contact pads P1C, P1D, and P1E may be located apart from one another in a stair shape in a first direction. The conductive line patterns BL1, BL2, . . . , and BLn may be formed such that a first conductive line pattern BL4 includes a first contact pad P1E, a second conductive line pattern BL5 located adjacent to BL4 includes a second contact pad P1D and a bent portion surrounding the first contact pad P1E, and a third conductive line pattern BL6 located adjacent to the second conductive line pattern BL5 simultaneously includes a third contact pad P1C, a bent portion surrounding the second contact pad P1D, and an end portion located near the bent portion. Thus, a relatively large number of conductive line patterns may be formed in the same area. The bent portions described above may be conformally formed about the profile of the contact pads (e.g., P1C and P1D) so that a constant spacing is maintained between the conductive line patterns, at locations without bent portions and at locations with bent portions.

For example, since conductive line patterns conform to bend around the contact pads of neighbouring conductive line patterns, the conductive line patterns may be formed closely to each other, and therefore, an increase in area or width per conductive line caused by the contact pads may be compensated by the formation of the bent portions so that a relatively large number of conductive line patterns (e.g., bit lines) may be formed in the same area (e.g., the conductive line patterns may be formed with a small pitch which need not increase due to the addition of the contact pads).

Respective characteristics of the first, second, and third conductive line patterns BL1, BL2, and BL3 will be described in detail with reference to FIGS. 4A to 19F.

FIGS. 4A to 14B are plan views and side-sectional views of a method of forming patterns of a semiconductor device, according to some exemplary embodiments, by using quadruple patterning technology (QPT).

FIGS. 4A to 14A are plan views of sequential operations of a process of forming patterns of a semiconductor device. FIGS. 4B to 14B are side-sectional views taken along lines B-B' of FIGS. 4A to 14A, respectively.

Figure 4A:
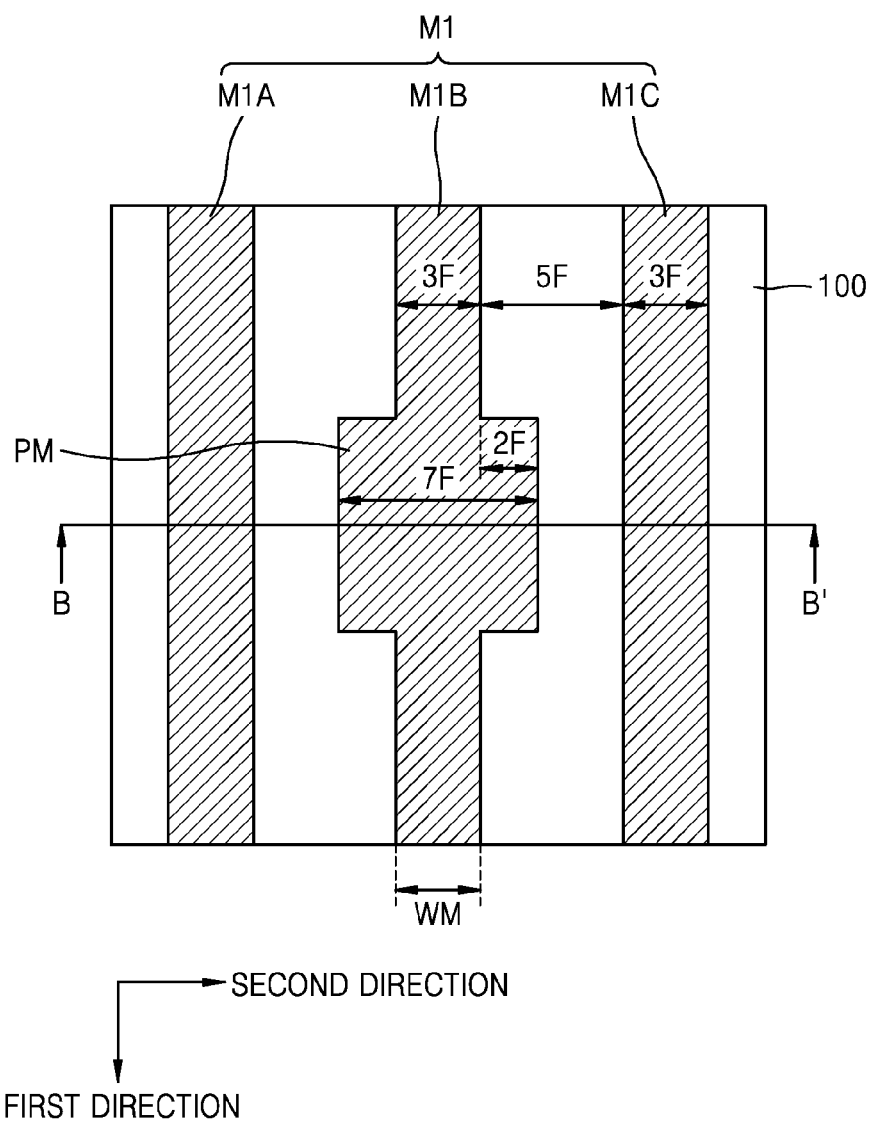
FIGS. 4A to 14B are plan views and side sectional views of a process of forming a pattern of a semiconductor device by using quadruple patterning technology (QPT) according to an exemplary embodiment.
Figure 5A:
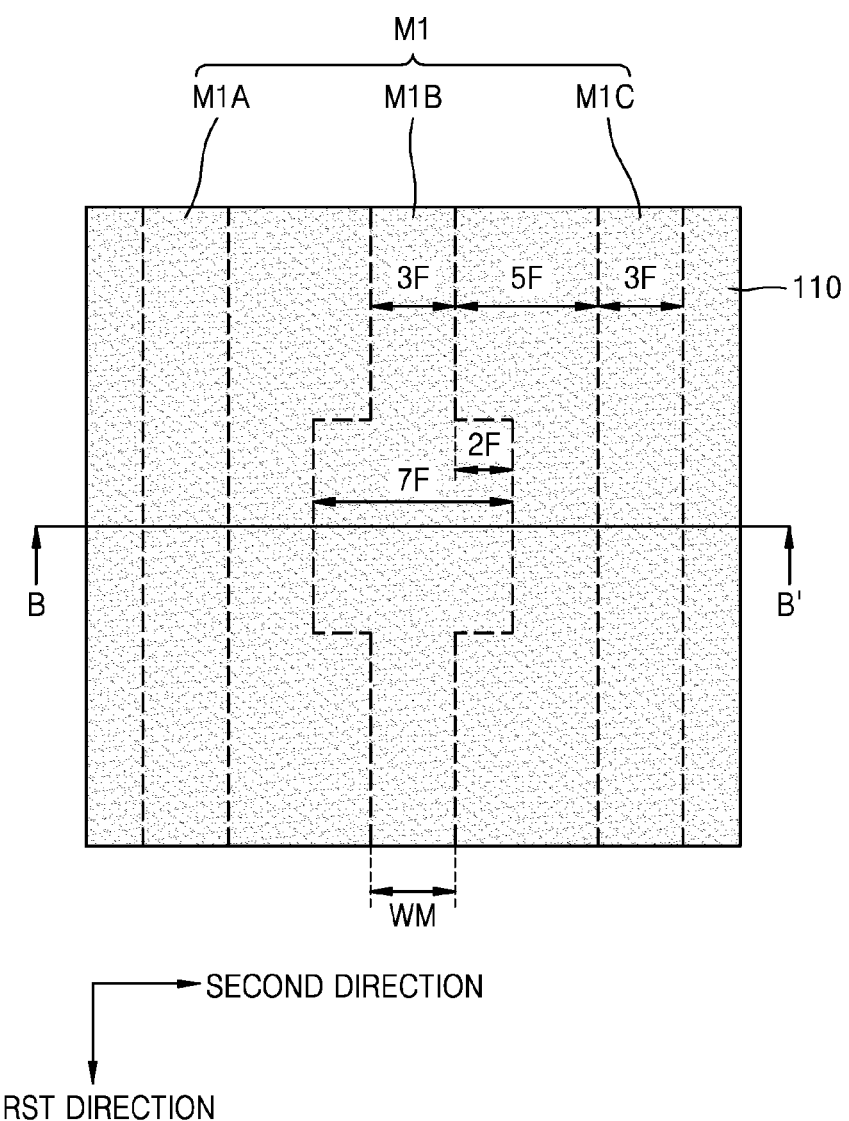

In FIGS. 4A, 5A . . . and 14A, two directions, which are parallel to a top surface of a substrate 400 and intersect each other, may be defined as a first direction and a second direction, respectively. For example, the first direction may intersect the second direction at a substantially right angle. In the drawings, a direction indicated by an arrow and an opposite direction thereto will be described as the same direction. The above-described definition of the directions will be applied likewise to all the following drawings.

Figure 4B:
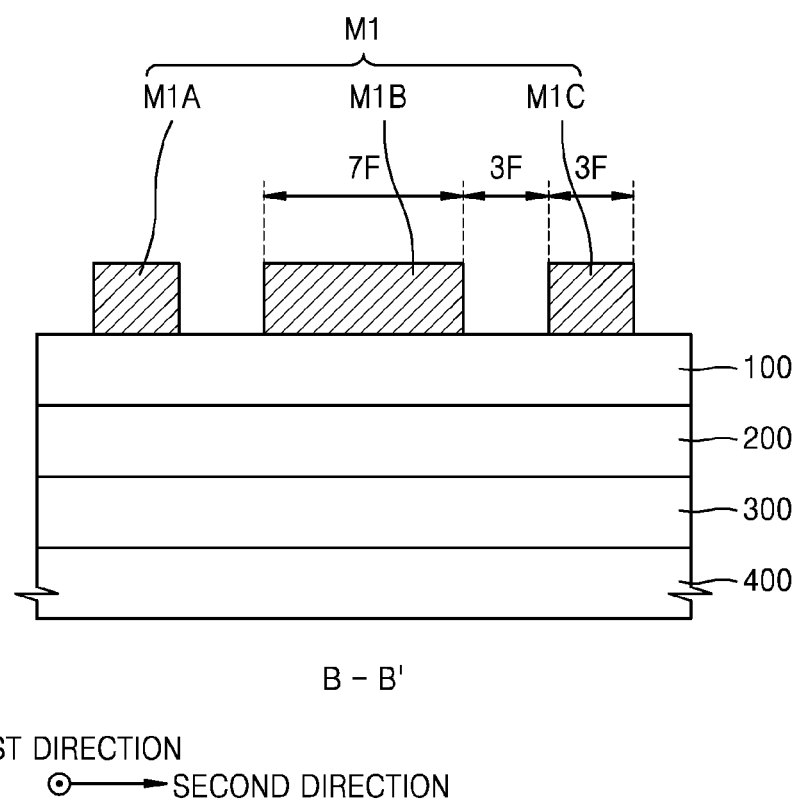

Referring to FIGS. 4A and 4B, a plurality of mask layers, for example, a first mask layer 100, a second mask layer 200, and a third mask layer 300 may be provided on the substrate 400. The first to third mask layers 100, 200, and 300 may be material layers for forming target patterns. The first to third mask layers 100, 200, and 300 may include the same material or different materials. When the first to third mask layers 100, 200, and 300 include different materials, the first to third mask layers 100, 200, and 300 may have the same etch rate, similar etch rates, or different etch rates.

The substrate 400 may include a semiconductor material, for example, a Group IV semiconductor, a Group III-V compound semiconductor, or a Group II-VI oxide semiconductor. For example, the Group IV semiconductor may include silicon (Si), germanium (Ge) or silicon-germanium (SiGe). The substrate 400 may be a bulk wafer or an epitaxial layer. Alternatively, the substrate 400 may be a semiconductor substrate, such as a silicon-on-insulator (SOI) substrate or a gallium arsenide (GaAs) substrate. Although not shown, unit devices, for example, various kinds of active devices or passive devices, may be formed on the substrate 400 to form a semiconductor device. Optionally, the substrate 400 may be an insulating substrate including $SiO_2$ or other inorganic oxides or a glass substrate.

Each of the first to third mask layers 100, 200, and 300 may be, for example, a polysilicon layer.

A material layer (not shown) may be formed on each of the first to third mask layers 100, 200, and 300. The material layer may include any material having a sufficient etch selectivity with respect to the first to third mask layers 100, 200, and 300. For example, the material layer may include a carbon-based material. For example, the material layer may be an amorphous carbon layer (ACL) or a spin-on hardmask (SOH). The SOH may include a hydrocarbon compound or derivatives thereof, which may contain a relatively high carbon content, for example, about 85% by weight to about 99% by weight of carbon, based on a total weight of the SOH.

The third mask layer 300 may be formed on the substrate 400, the second mask layer 200 may be formed on the third mask layer 300, and the first mask layer 100 may be formed on the second mask layer 200. A material layer may be formed on each of the first mask layer 100, the second mask layer 200, and the third mask layer 300. For example, material layers may be formed between the first to third mask layers and on top of the first mask layer 100.

A first mask pattern M1 may be formed on the first mask layer 100 or the material layer formed on the first mask layer 100. The first mask pattern M1 may include any material having an etch selectivity with respect to the material layer and a first spacer layer (refer to 110 in FIG. 5B) to be subsequently formed. The first mask pattern M1 may be, for example, a photoresist pattern. In this case, the formation of the first mask pattern M1 may include forming a photoresist layer and exposing and developing the photoresist layer. However, the first mask pattern M1 is not limited to the photoresist pattern.

When the first mask pattern M1 is a photoresist pattern, an anti-reflective layer (ARL) (not shown) may be further formed between the first mask layer 100 and the first mask pattern M1 to form a finer pattern. The ARL may include, for example, SiON.

The first mask pattern M1 may include a plurality of mask line patterns M1A, M1B, and M1C. The plurality of mask line patterns M1A, M1B, and M1C may be spaced apart from one another and have the same mask line width WM and extend parallel to one another in a first direction. The plurality of mask line patterns M1A, M1B, and M1C may include at least one first mask line pattern (e.g., M1B) including a varied width portion PM having a width different from the mask line width WM. Although one first mask line pattern M1B is illustrated, the inventive concept is not limited thereto and a plurality of first mask line patterns M1B may be provided. The varied width portion PM may have a width that is larger than the width WM of the remainder of the first mask line pattern M1B.

The mask line width MW of the plurality of mask line patterns M1A, M1B, and M1C may be greater than 1F (F may be a constant distance, such as the minimum feature size). For example, the mask line width WM may be 3F. Distances between the plurality of mask line patterns M1A, M1B, and M1C may be greater than the mask line width WM. For example, the distance between the plurality of mask line patterns M1A, M1B, and M1C may be 5F. The mask line width WM and the distance between the plurality of mask line patterns M1A, M1B, and M1C may be modified according to sizes and arrangements of conductive line patterns and contact pads to be finally formed. For example, the mask line width WM and the distance between the mask line patterns M1A, M1B, and M1C may have other values and/or forms than those in the FIG. 4A.

The varied width portion PM may be formed in a portion of the first mask line pattern M1B. The varied width portion PM may be formed on only one sidewall of the first mask line pattern M1B or both sidewalls thereof. The varied width portion PM may protrude from the first mask line pattern M1B or be recessed in the first mask line pattern M1B. The varied width portion PM may be formed in the portion of the first mask line pattern M1B and have a predetermined length in the first direction. Positions, sizes, and shapes of contact pads to be finally formed may depend on a position, size, and shape of the varied width portion PM.

The varied width portion PM shown in FIG. 4A may protrude from each of both sidewalls of the first mask line pattern M1B by an additional width of 2F. Thus, the varied width portion PM may have a total width of 7F and have a rectangular shape with a predetermined length in the first direction (it is expected that due to typical semiconductor process techniques, the rectangular shape will include variations from a true geometrical rectangle, such as including rounded corners). The varied width portion PM is not limited to the shape shown in the present embodiment and may have various other shapes as described below.

Figure 5B:
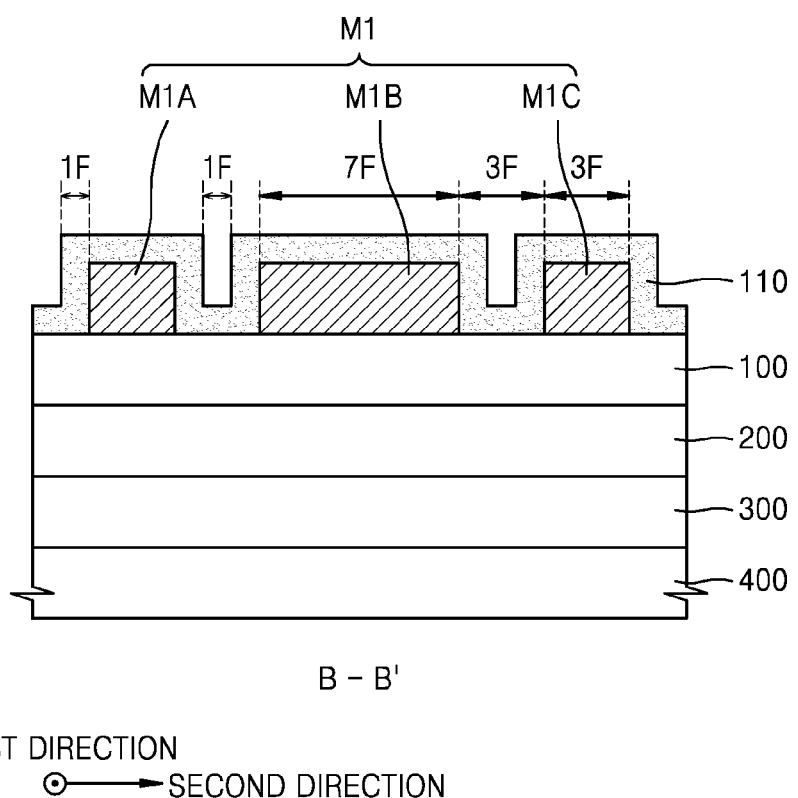

Referring to FIGS. 5A and 5B, a first spacer layer 110 may be conformally formed on an exposed surface of the first mask layer 100 and the entire surface of the first mask pattern M1. The first spacer layer 110 may be formed by using, for example, a CVD (chemical vapor deposition) process or an ALD (atomic layer deposition) process, but a method of forming the first space layer 110 is not limited thereto.

The first spacer layer 110 may include any material having an etch selectivity with respect to the first mask layer 100 and the first mask pattern M1. For example, the first spacer layer 110 may include silicon oxide.

The thickness of the first spacer layer 110 is not specifically limited. For example, the thickness of the first spacer layer 110 may be ⅓ of a mask line width WM of the plurality of mask line patterns M1A, M1B, and M1C. For example, the first spacer layer 110 may be formed to a thickness equal or similar to the width (i.e., 1F) of conductive line patterns to be finally formed.

Figure 6A:
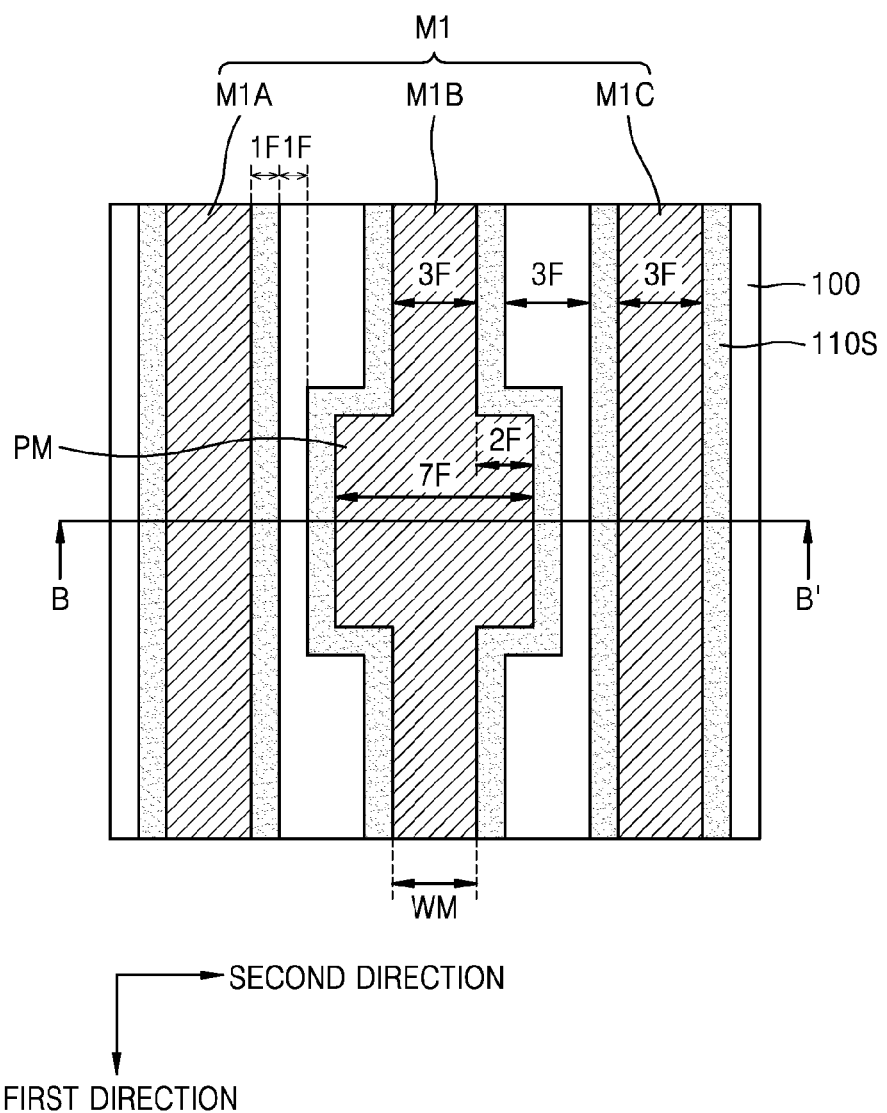
Figure 6B:
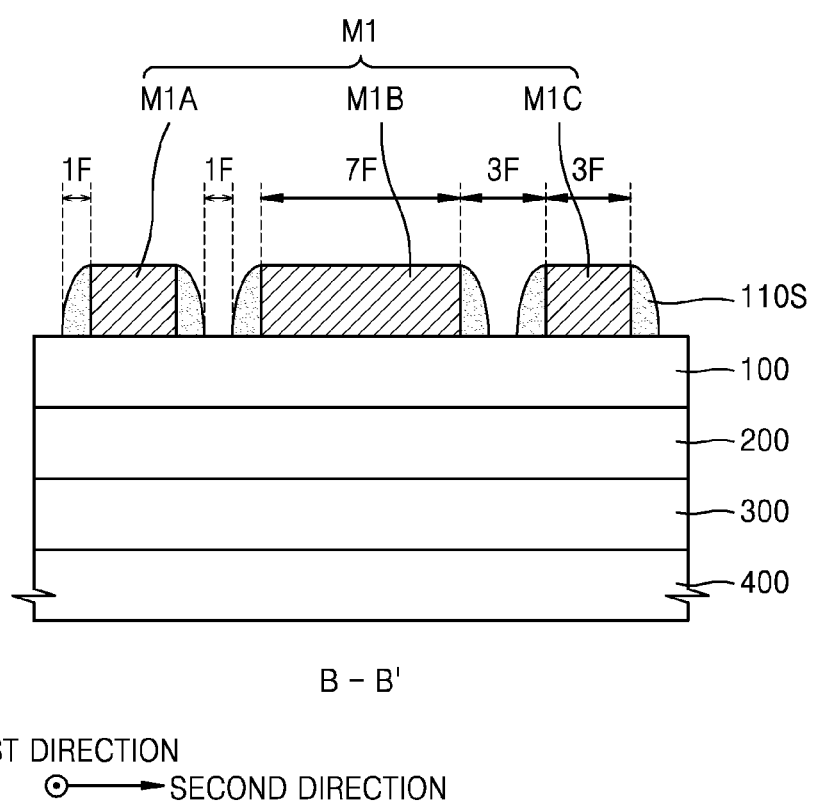

Referring to FIGS. 6A and 6B, the first spacer layer (refer to 110 in FIG. 5B) may be anisotropically etched to form first spacers 110S.

The first spacers 110S may be formed by using, for example, $C_xF_y$ gas or $CH_xF_y$ gas (Here, each of x and y is an integer ranging from 1 to 10) as a main etch gas. Alternatively, the first spacers 110S may be formed by mixing the main etch gas with at least one gas selected from $O_2$ gas and Ar gas.

The first spacer layer (refer to 110 in FIG. 5B) may be etched in a plasma atmosphere by generating plasma of an etch gas selected from the above-described etch gases in an etching chamber. Alternatively, the first spacer layer 110 may be etched in an atmosphere of the selected etch gas in an ion-energy-free state without generating plasma in the etching chamber. For example, the first spacer layer 110 may be etched by a gas state of the selected etch gas.

A width of the first spacers 110S may be equal or similar to a thickness of the first spacer layer 110. The width of the first spacers 110S may be about ⅓ a mask line width WM of the plurality of mask line patterns M1A, M1B, and M1C. For example, the first spacers 110S may be formed to a width equal or similar to the width (i.e., 1F) of the conductive line patterns to be finally formed.

Figure 7A:
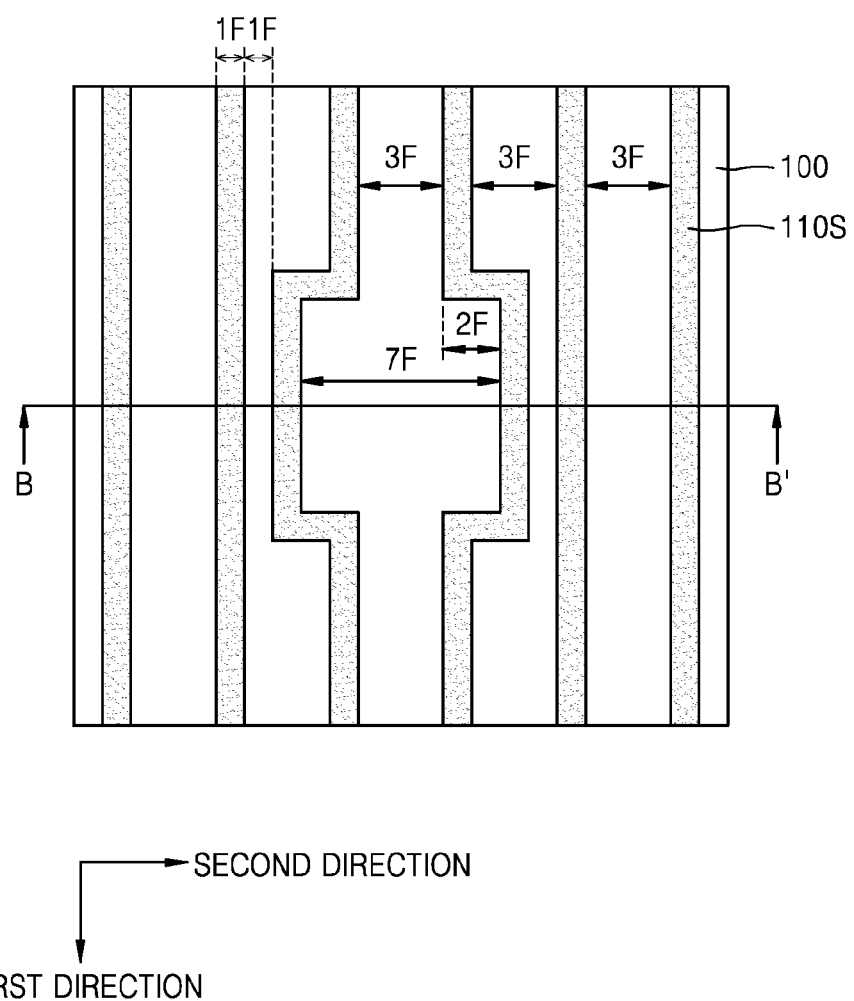
Figure 7B:
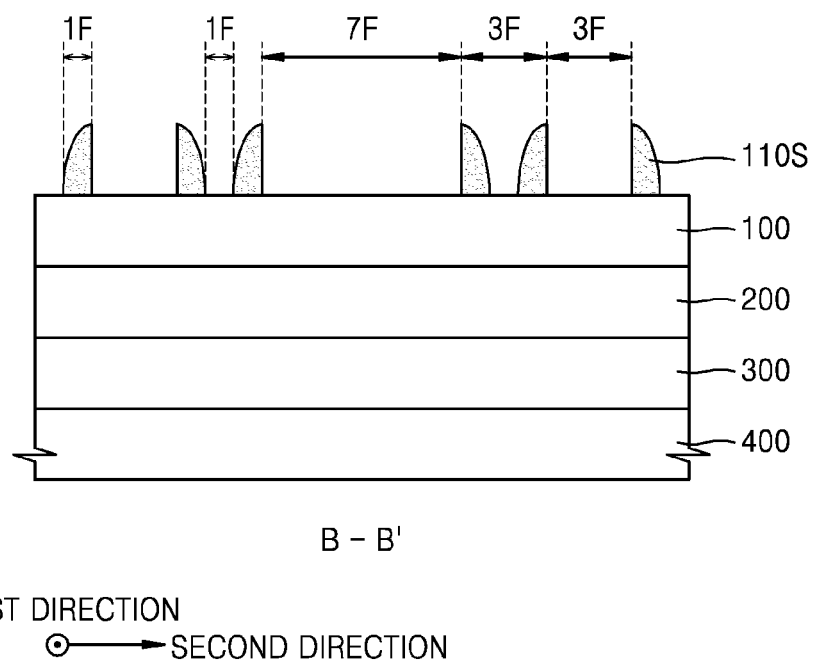

Referring to FIGS. 7A and 7B, after the first spacers 110S are formed, the first mask pattern (refer to M1 in FIG. 6B) may be removed.

After the first spacers 110S are formed, the first mask pattern M1 may be removed by using different processes according to constituent material of the first mask pattern M1. For example, when the first mask pattern M1 includes photoresist, the first mask pattern M1 may be removed by using an ashing process and a stripping process. The removal of the first mask pattern (refer to M1 in FIG. 6B) may be performed under a condition where the etching of the first spacers 110S and the first mask layer 100 is inhibited.

Figure 8A:
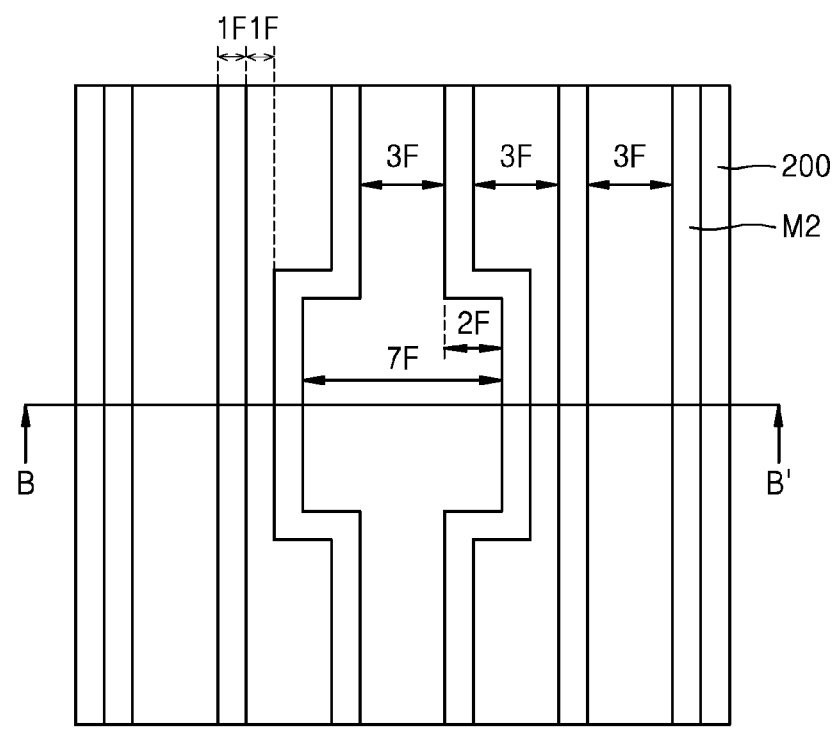
Figure 8B:
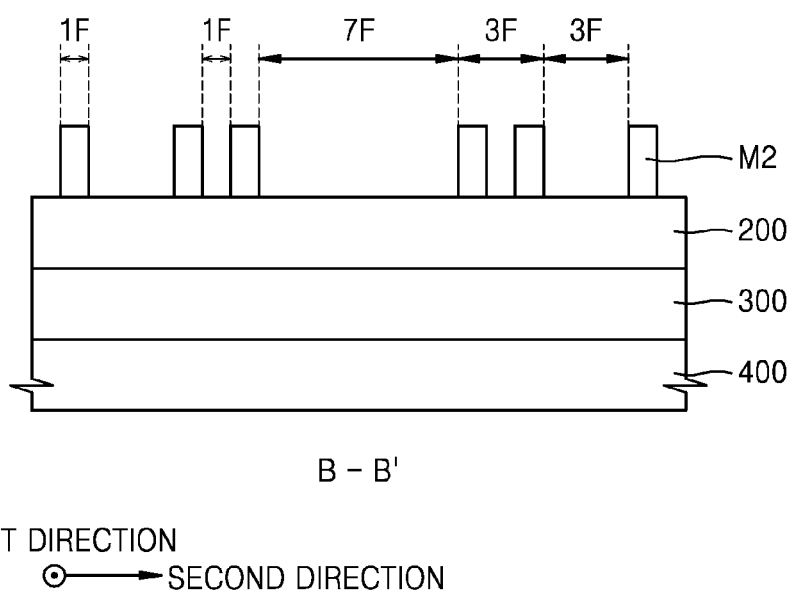

Referring to FIGS. 8A and 8B, the first mask layer (refer to 100 in FIG. 7B) may be anisotropically etched by using the first spacer 110S as an etch mask, thereby forming a second mask pattern M2. The anisotropic etching process for forming the second mask pattern M2 may be, for example, a reactive ion etching (RIE) process or an inductively coupled plasma (ICP) etching process.

In this case, residue of the first spacers (refer to 110S in FIG. 7B) may remain on the second mask pattern M2. The residue of the first spacers 110S may be removed for a subsequent process.

Figure 9A:
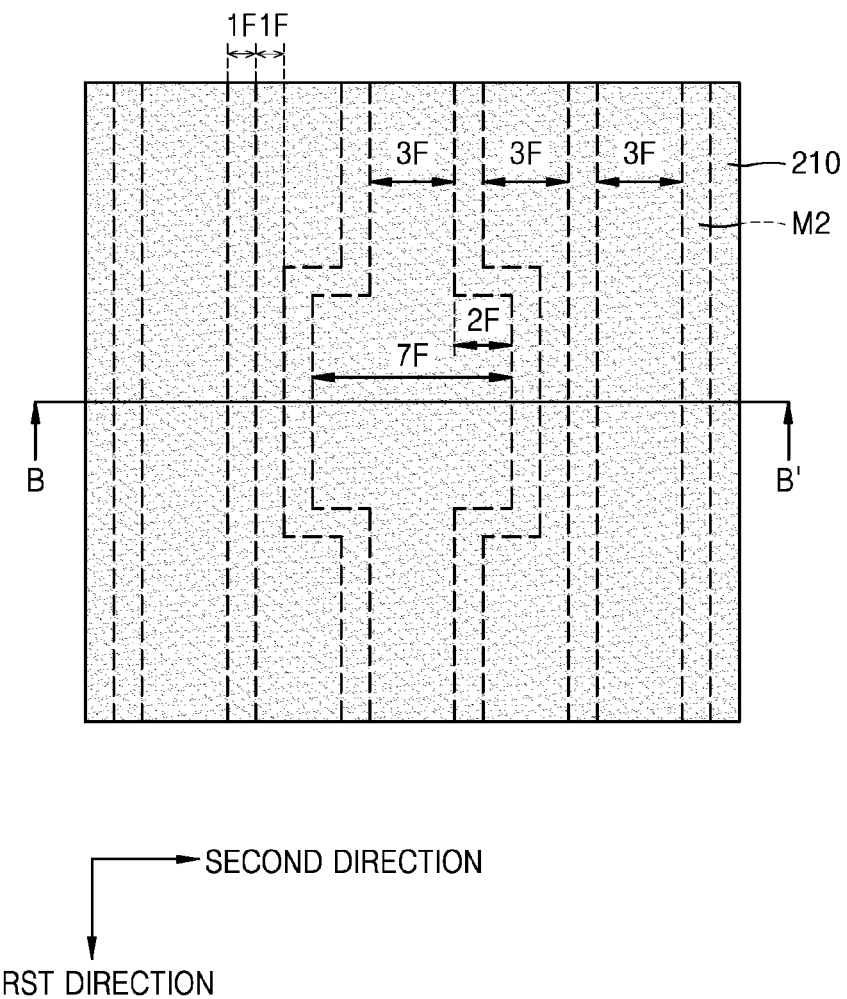
Figure 9B:
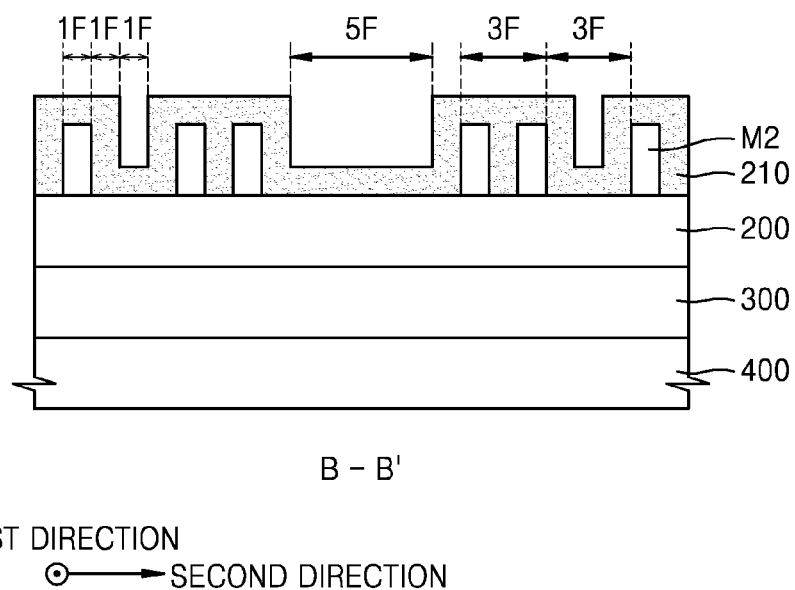

Referring to FIGS. 9A and 9B, a second spacer layer 210 may be conformally formed on an exposed surface of the second mask layer 200 and the entire surface of the second mask pattern M2. The second spacer layer 210 may be formed by using, for example, a CVD process or an ALD process, but a process of forming the second spacer layer 210 is not limited thereto.

The second spacer layer 210 may include a material having an etch selectivity with respect to the second mask pattern M2 and the second mask layer 200. For example, the second spacer layer 210 may include silicon oxide.

The thickness of the second spacer layer 210 is not specifically limited and may be, for example, ⅓ a mask line width WM of the plurality of mask line patterns (refer to M1A, M1B, and M1C in FIG. 4B). For example, the second spacer layer 210 may be formed to a thickness equal or similar to the width (i.e., 1F) of a conductive line pattern to be finally formed. Alternatively, the second spacer layer 210 may be formed to a thickness equal or similar to the width of the second mask pattern M2.

The first spacer layer (refer to 110 in FIG. 5B) may include the same material as the second spacer layer 210. Also, the first spacer layer (refer 110 in FIG. 5B) may be formed to the same thickness as the second spacer layer 210.

Figure 10A:
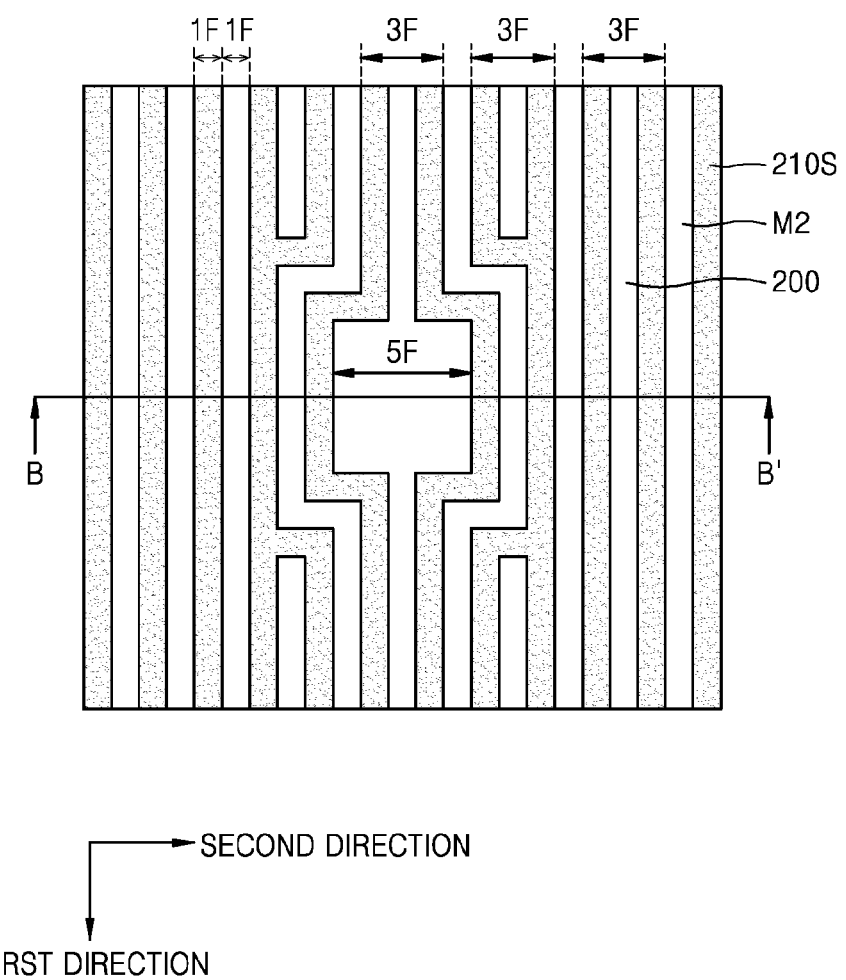
Figure 10B:
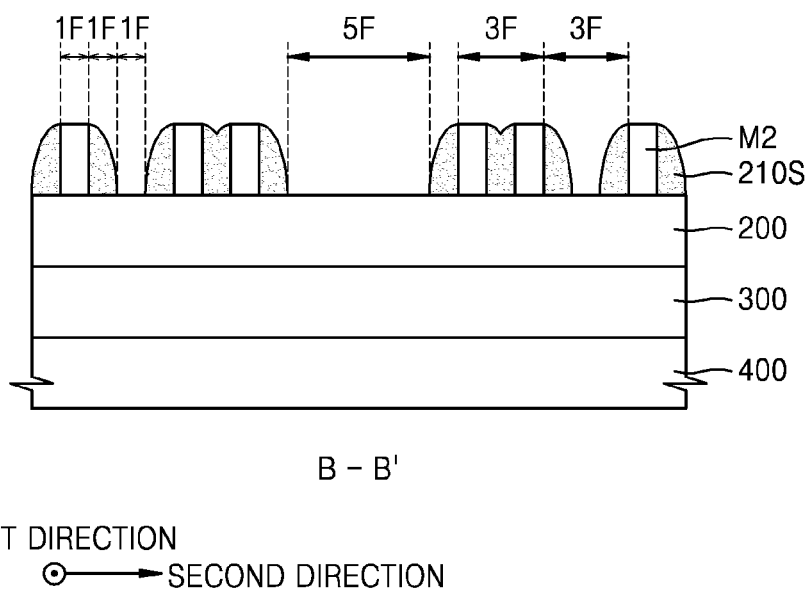

Referring to FIGS. 10A and 10B, the second spacer layer (refer to 210 in FIG. 9B) may be anisotropically etched to form second spacers 210S.

Since the method of forming the second spacers 210S by anisotropically etching the second spacer layer (refer to 210 in FIG. 9B), is the same as the method described with reference to FIGS. 6A and 6B, detailed descriptions thereof are omitted.

The second spacers 210S may be formed on both sidewalls of the second mask pattern M2 such that the proportion of the widths of the second spacers 210S, the second mask pattern M2, and an exposed portion of the second mask layer 200 is about 1:1:1. Also, each of the width of the second spacers 210S, the width of the second mask pattern M2, and the exposed width of the second mask layer 200 may be equal or similar to the width (i.e., 1F) of conductive line patterns to be finally formed.

Figure 11A:
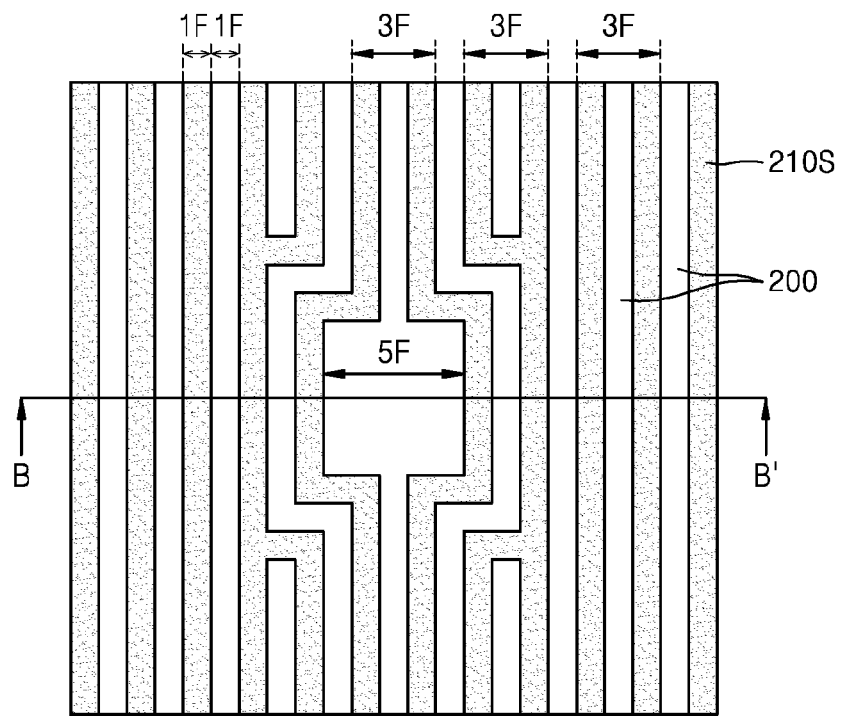
Figure 11B:
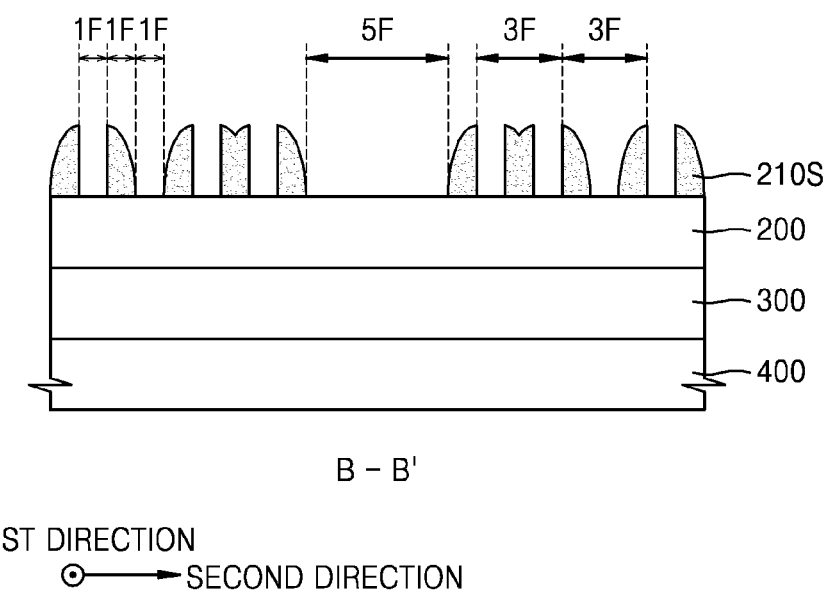

Referring to FIGS. 11A and 11B, after the second spacers 210S are formed, the second mask pattern (refer to M2 in FIG. 10B) may be removed.

The removal of the second mask pattern (refer to M2 in FIG. 10B) may be performed under a condition where the etching of the second spacers 210S and the second mask layer 200 is inhibited.

Figure 12A:
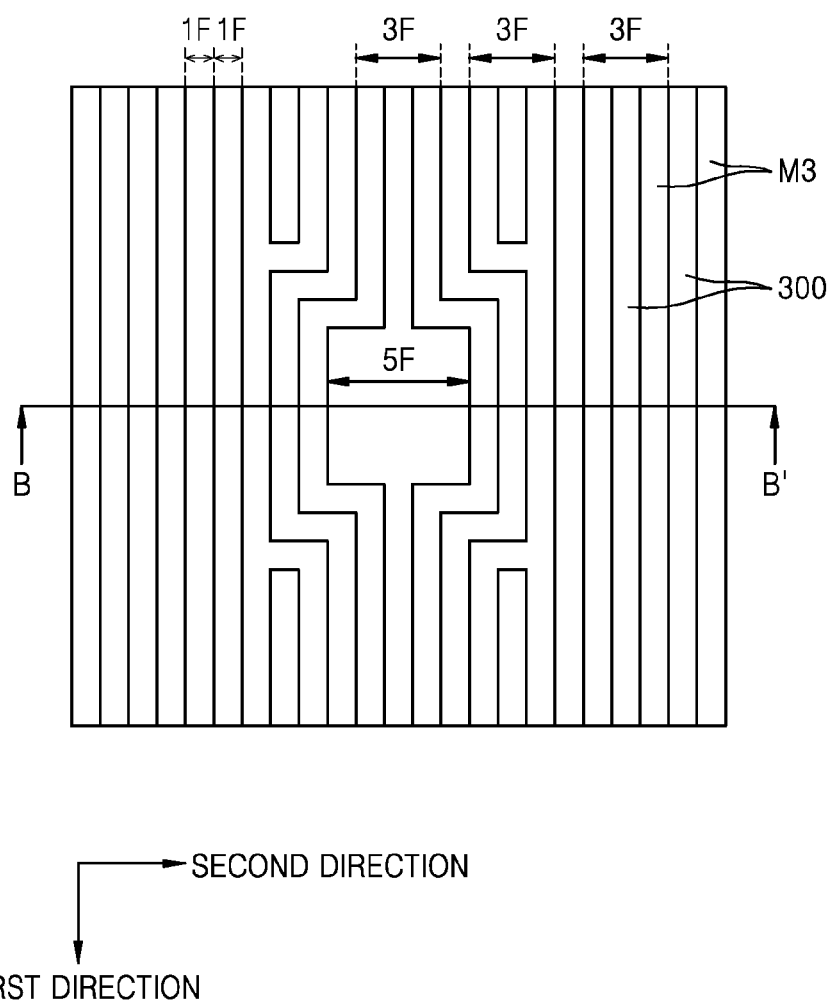
Figure 12B:
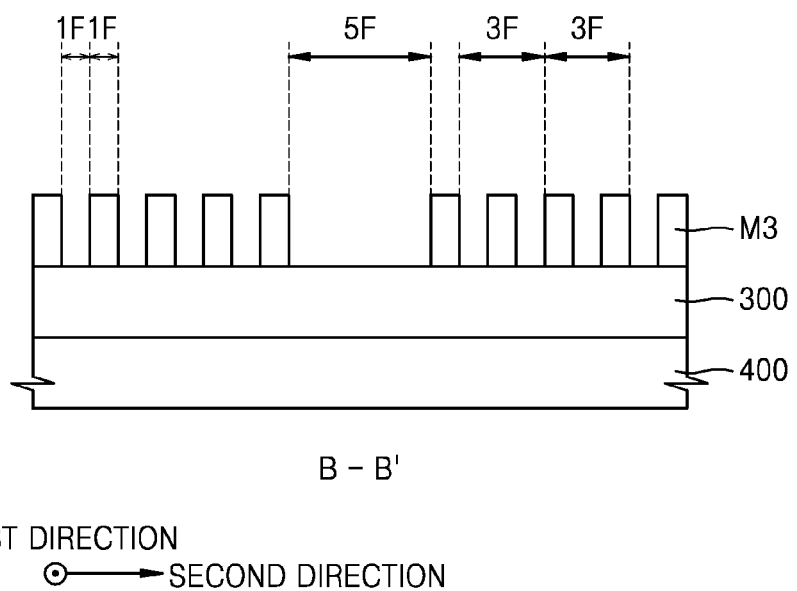

Referring to FIGS. 12A and 12B, the second mask layer (refer to 200 in FIG. 11B) may be anisotropically etched by using the second spacers 210S as an etch mask, thereby forming a third mask pattern M3. The anisotropic etching process for forming the third mask pattern M3 may be performed by using, for example, an RIE process or an ICP etching process.

In this case, residue of the second spacers (refer to 210S in FIG. 11B) may remain on the third mask pattern M3. The residue of the second spacers 210S may be removed for a subsequent process.

Figure 13A:
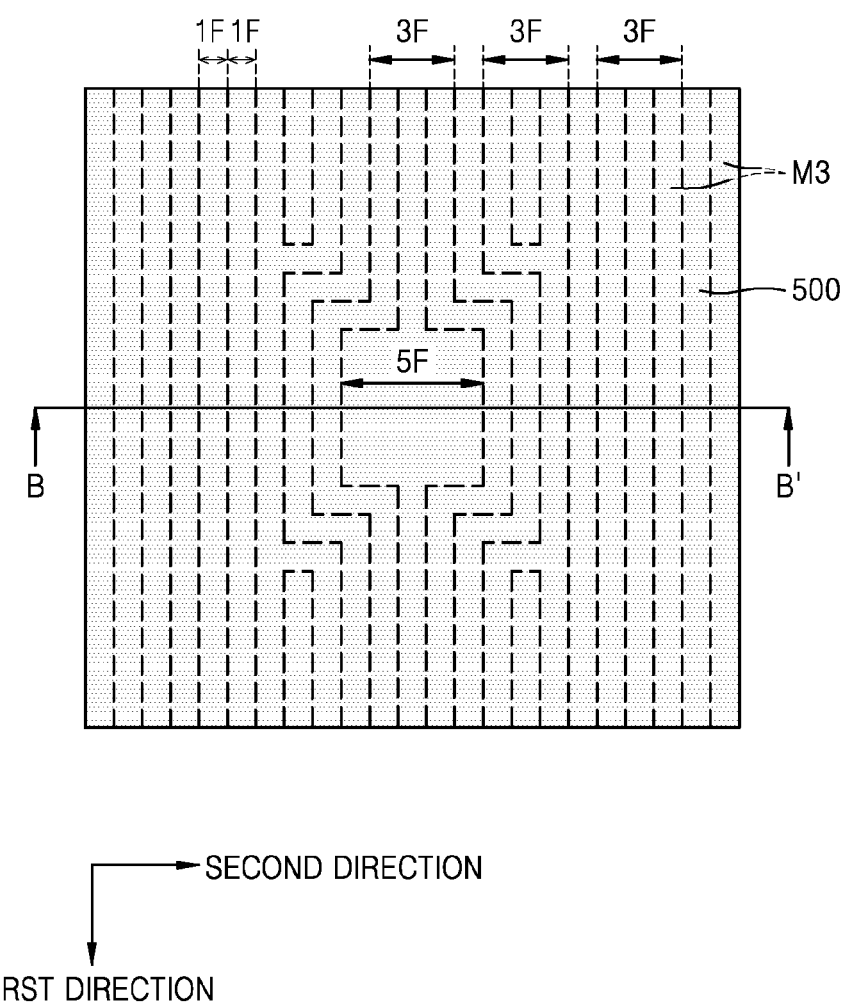
Figure 13B:
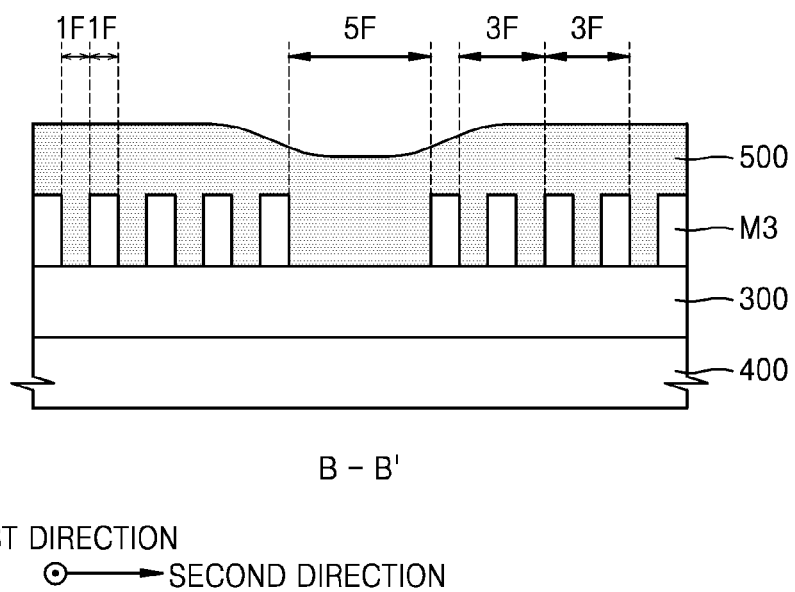

Referring to FIGS. 13A and 13B, an exposed surface of the third mask layer 300 and the entire surface of the third mask pattern M3 may be covered with a conductive layer 500. The conductive layer 500 may be formed to such a sufficient thickness as to fill spaces between mask line patterns included in the third mask pattern M3 and cover the third mask pattern M3.

The conductive layer 500 may include copper (Cu) or a copper alloy. After a copper (Cu) seed layer (not shown) is formed on the exposed surface of the third mask layer 300 and the third mask pattern M3, the conductive layer 500 may be formed on the copper seed layer by using an electroplating process. In another case, the third mask pattern M3 may be used as a seed layer for an electroplating process. In this case, the formation of the copper seed layer may be omitted.

For example, the conductive layer 500 may include aluminum (Al), tungsten (W), rhodium (Rh), osmium (Os), titanium (Ti), tantalum (Ta), palladium (Pd), platinum (Pt), molybdenum (Mo), a metal silicide, or a combination thereof.

Figure 14A:
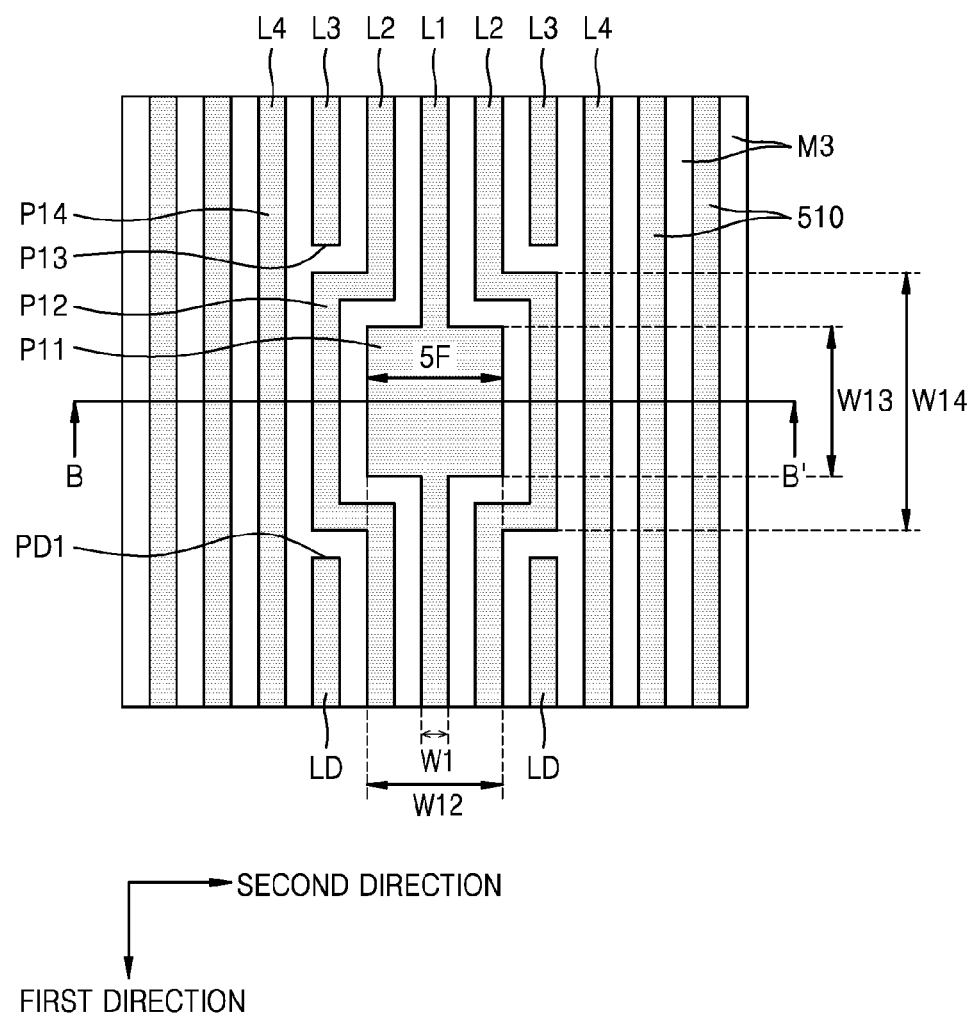
Figure 14B:
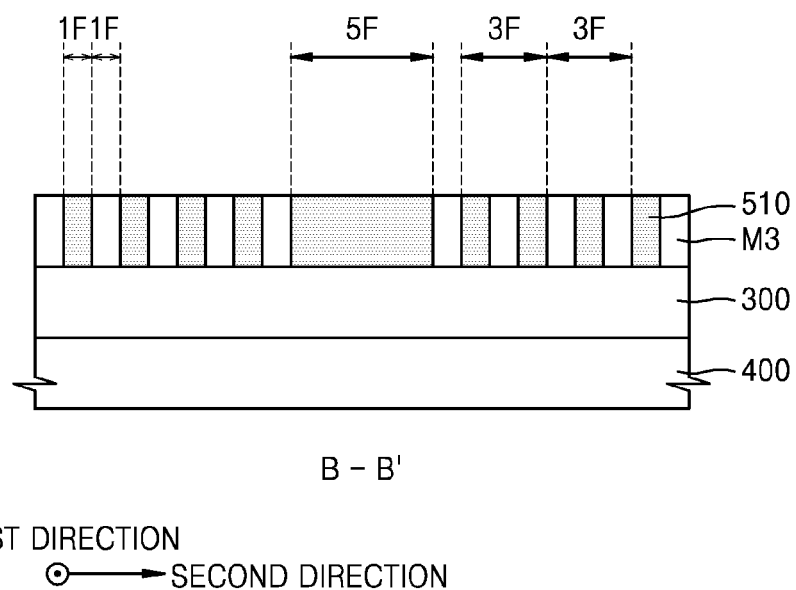

Referring to FIGS. 14A and 14B, the conductive layer (refer to 500 in FIG. 13B) formed on the exposed surface of the third mask layer 300 and the entire surface of the third mask pattern M3 may be removed to form a plurality of conductive line patterns 510. The removal process may be performed by using the third mask pattern M3 as an etch stop layer. For example, a top surface of the third mask pattern M3 may be exposed by planarizing the conductive layer (refer to 500 in FIG. 13B) by using the removal process. For example, top surfaces of the plurality of conductive line patterns 510 may be coplanar with the top surface of the third mask pattern M3. The plurality of conductive line patterns 510 may be electrically insulated from one another by the third mask pattern M3.

The removal process may be performed by using a chemical mechanical polishing (CMP) process or an etchback process. The removal of the conductive layer (refer to 500 in FIG. 13B) may be performed under a condition where the etching of the third mask pattern M3 is inhibited. When the conductive layer 500 is removed by using a CMP process, the etching of the third mask pattern M3 may be inhibited by adjusting slurry, a polishing pad, and a polishing condition.

As described above, an ultrafine pattern that may exceed the resolution limit may be formed by using QPT. For example, the first mask pattern (refer to M1 in FIG. 4B) having a width greater than a minimum feature size (1F) may be formed by using a one-time photolithography process. By using the first mask pattern M1 and through the second mask pattern M2, as described above, a third mask pattern M3 having a width of 1F may be formed. Four mask line patterns constituting the third mask pattern M3 may be formed by and may correspond to one mask line pattern included in the first mask pattern M1. A damascene process may be performed by using the third mask pattern M3 as an insulating line pattern so that a plurality of conductive line patterns 510 having a width of 1F may be finally formed.

The plurality of conductive line patterns 510 may include a first conductive line pattern L1, second conductive line patterns L2, third conductive line patterns L3, fourth conductive line patterns L4, and dummy conductive line patterns LD. The plurality of conductive line patterns 510 may have the same width.

Portions of the first conductive line pattern L1 may include protrusions P11, each of which may have a width W12 in the second direction and a width W13 in the first direction. A width W12 of the protrusion P11 may be greater than a width W1 of the first conductive line pattern L1. The protrusion P11 may be formed in a cell array region and/or a page buffer region. The protrusion P11 may be a contact pad. The protrusion P11 and a similar shapes described in this disclosure may also be referred to as a wider portion throughout this disclosure.

The protrusions P11 may be formed on both side walls of the first conductive line pattern L1, and the width W12 of each of the protrusions P11 may have a size of 5F.

A plurality of second conductive line patterns L2 may be formed adjacent to the first conductive line pattern L1 and include bent portions P12 that surround the protrusions P11, respectively. The bent portion P12 of each of the second conductive line patterns L2 may have a width W14 in a first direction, and the width W14 of the bent portion P12 may be greater than the width W13 of the protrusion P11.

During the formation of the protrusion P11 of the first conductive line pattern L1 by using the varied width portion PM of the first mask pattern (refer to M1 in FIG. 4A), the second conductive line patterns L2 adjacent to the first conductive line pattern L1 may be formed to include the bent portion P12.

A plurality of third conductive line patterns L3 may be formed adjacent to the second conductive line patterns L2 and have end portions P13 that face the bent portions P12 of the second conductive line patterns L2, respectively.

Due to the bent portion P12 of the second conductive line patterns L2, a length of the third conductive line patterns L3 may be less than each length of the first conductive line pattern L1 and the second conductive line patterns L2 in the first direction.

For example, due to the bent portions P12 of the second conductive line patterns L2, dummy conductive line patterns LD may be formed in an opposite direction to a direction in which the end portions P13 of the third conductive line patterns L3 face the bent portions P12 of the second conductive line patterns L2. For example, a dummy conductive line pattern LD may be formed at one side apart from a bent portion P12 of a second conductive line pattern L2, and an end portion P13 of a third conductive line pattern L3 may be formed at the opposite side apart from the bent portion P12. The dummy conductive line patterns LD may have a first width and be parallel to the first direction. The third conductive line patterns L3 and the dummy conductive line patterns LD may be located in straight lines, respectively.

For example, the third conductive line patterns L3 and the dummy conductive line patterns LD may be disposed in the same line but in different locations disconnected from each other. Positions of the third conductive line patterns L3 and the dummy conductive line patterns LD may be exchanged.

For example, a plurality of third conductive line patterns L3 may be spaced apart from a plurality of dummy conductive line patterns LD with the bent portions P12 of the second conductive line patterns L2 therebetween.

A plurality of the dummy conductive line patterns LD may be formed adjacent to the second conductive line patterns L2 and have end portions PD1 that face the bent portions P12 of the second conductive line patterns L2, respectively.

The fourth conductive line patterns L4 may be formed adjacent to the third conductive line patterns L3. A minimum space between the fourth conductive line patterns L4 and the bent portions P12 of the second conductive line patterns L2 may be equal or similar to the width W1 of the first conductive line pattern L1. For example, since the third mask pattern M3 is formed between the plurality of conductive line patterns 510 and the width of the third mask pattern M3 is equal or similar to the width of the plurality of conductive line patterns 510, the minimum space between the fourth conductive line patterns L4 and the bent portions P12 of the second conductive line patterns L2 may be equal or similar to the width of the third mask pattern M3.

FIGS. 15A to 15F are plan views of a process of forming patterns of a semiconductor device according to some exemplary embodiments.

Detailed descriptions of the same elements and functions as described in FIGS. 4A to 14B will be omitted.

Figure 15A:
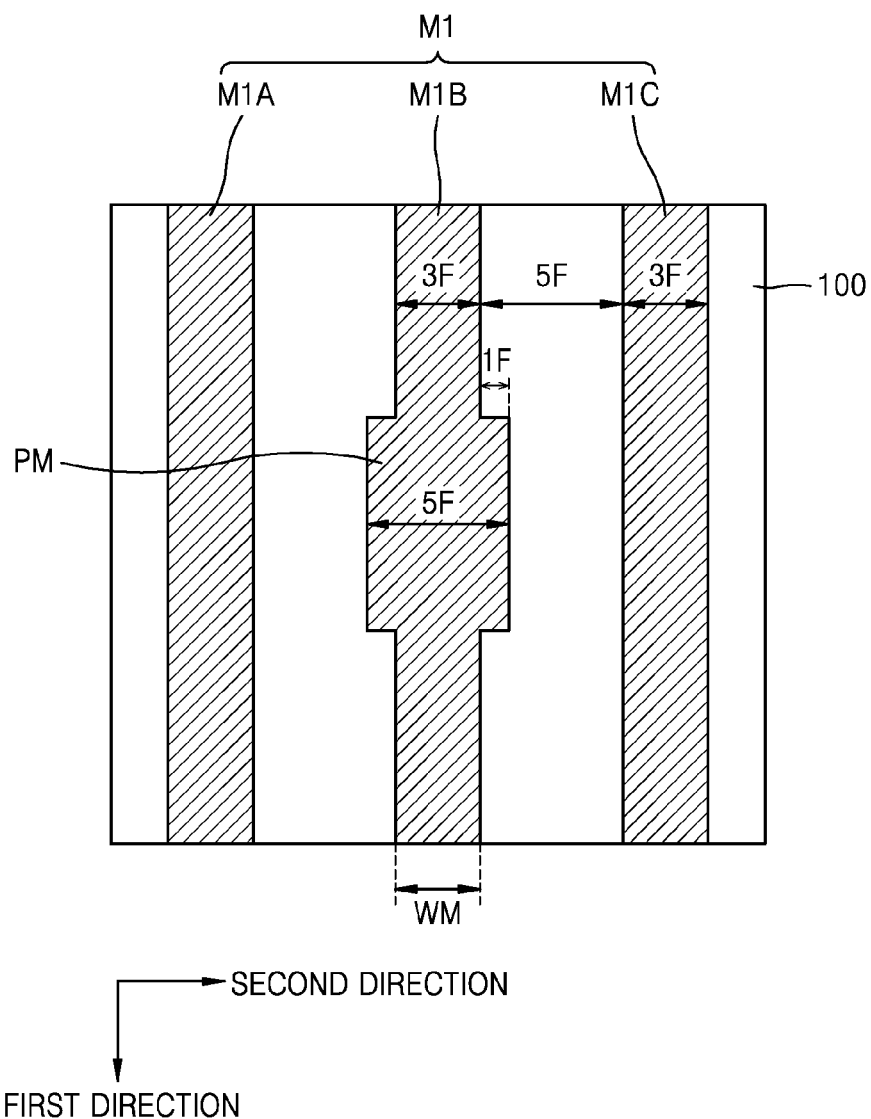
FIGS. 15A to 15F are plan views of a process of forming a pattern of a semiconductor device, according to an exemplary embodiment.

Referring to FIG. 15A, a first mask pattern M1 may be formed on a first mask layer 100 or a material layer formed on the first mask layer 100. The first mask pattern M1 may include a plurality of mask line patterns M1A, M1B, and M1C. A mask line width WM of the plurality of mask line patterns M1A, M1B, and M1C may be greater than 1F. 1F may be a target width of the eventual conductive line patterns which are subsequently formed by multiple step of process using the first mask pattern M1 and subsequent patterns. Distances between the plurality of mask line patterns M1A, M1B, and M1C may be greater than the mask line width WM. The mask line width WM and the distance between the plurality of mask line patterns M1A, M1B, and M1C may be modified according to sizes and arrangements of conductive line patterns and contact pads to be finally formed. For example, the mask line width WM and the distance between the mask line patterns M1A, M1B, and M1C may have other values and/or forms than those in the FIG. 15A.

A varied width portion PM may be formed in a portion of the first mask line pattern M1B. The varied width portion PM may protrude to the second direction by a width of 1F from both sidewalls of the first mask line pattern M1B and have a total width of 5F. For example, the varied width portion PM may have a rectangular shape with a predetermined length in the first direction. Since positions, sizes, and shapes of contact pads to be finally formed depend on a position, size, and shape of the varied width portion PM, the shape of the varied width portion PM may vary. For example, the positions, sizes, and shapes of the varied width portions PM may have other values and/or forms than those of FIG. 15A.

Figure 15B:
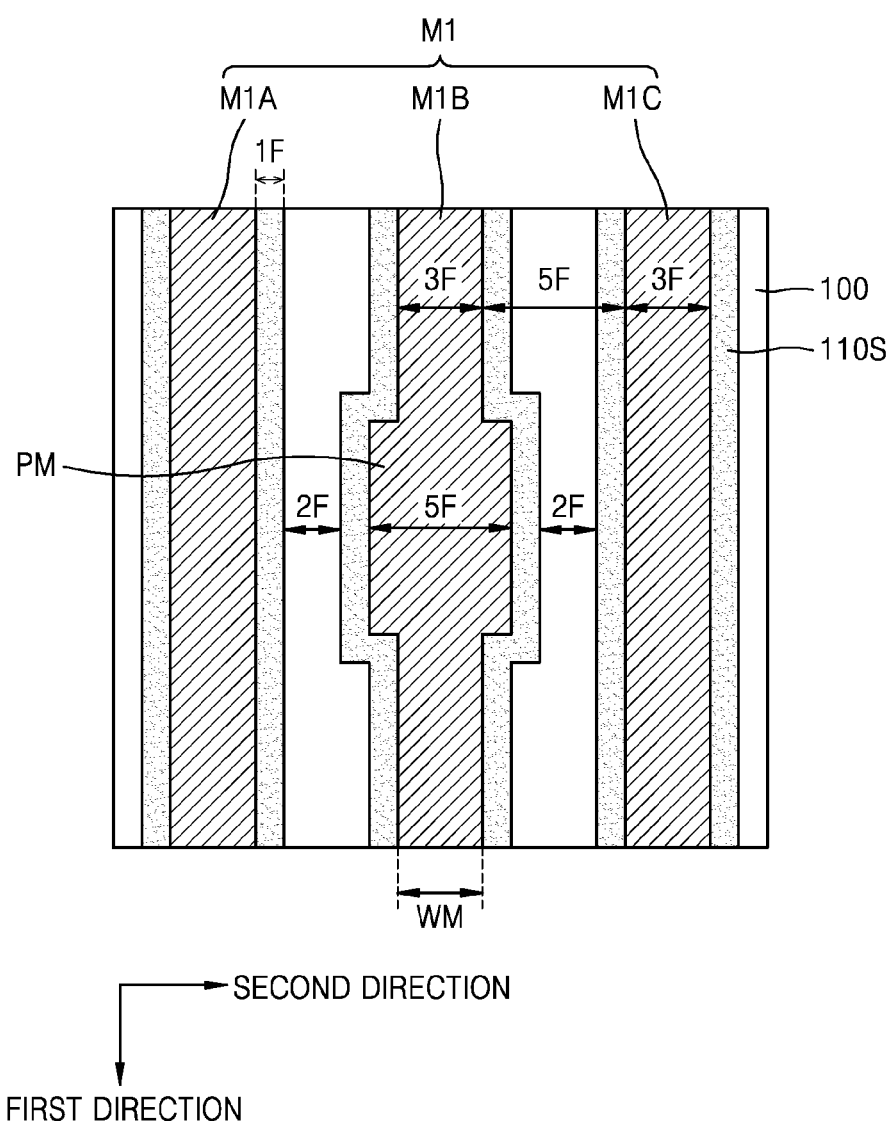

Referring to FIG. 15B, a first spacer layer may be conformally formed on an exposed surface of the first mask layer 100 and the entire surface of the first mask pattern M1 and anisotropically etched to form first spacers 110S.

A width of the first spacers 110S may be equal or similar to a thickness of the first spacer layer. The width of the first spacers 110S may be ⅓ of the mask line width WM of the plurality of mask line patterns M1A, M1B, and M1C. For example, the first spacers 110S may be formed to a width equal or similar to the width (i.e., 1F) of the conductive line pattern to be finally formed.

Figure 15C:
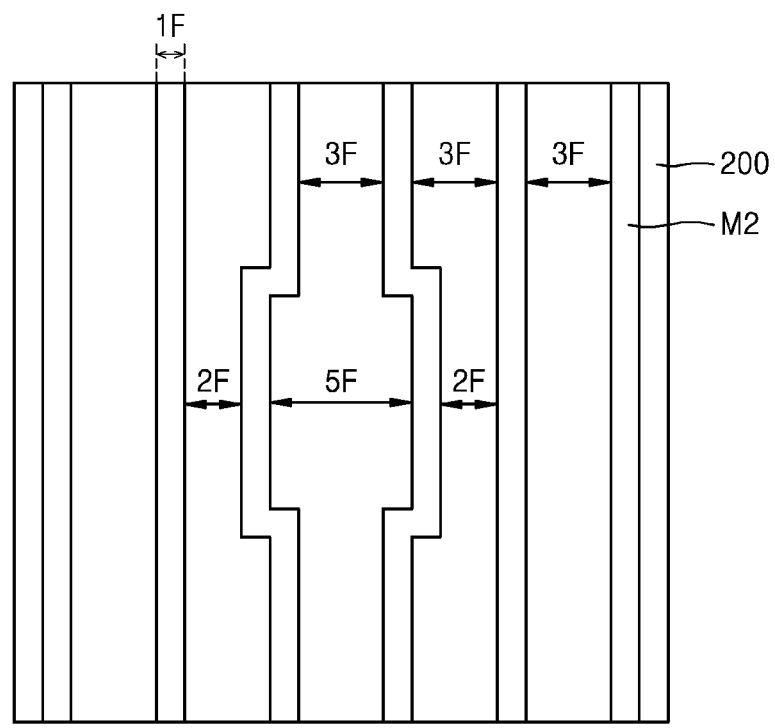

Referring to FIG. 15C, after the first spacers (refer to 110S in FIG. 15B) are formed, the first mask pattern (refer to M1 in FIG. 15B) may be removed. Thereafter, the first mask layer (refer to 100 in FIG. 15B) may be anisotropically etched by using the first spacers 110S as an etch mask so that a second mask pattern M2 may be formed on a second mask layer 200.

Figure 15D:
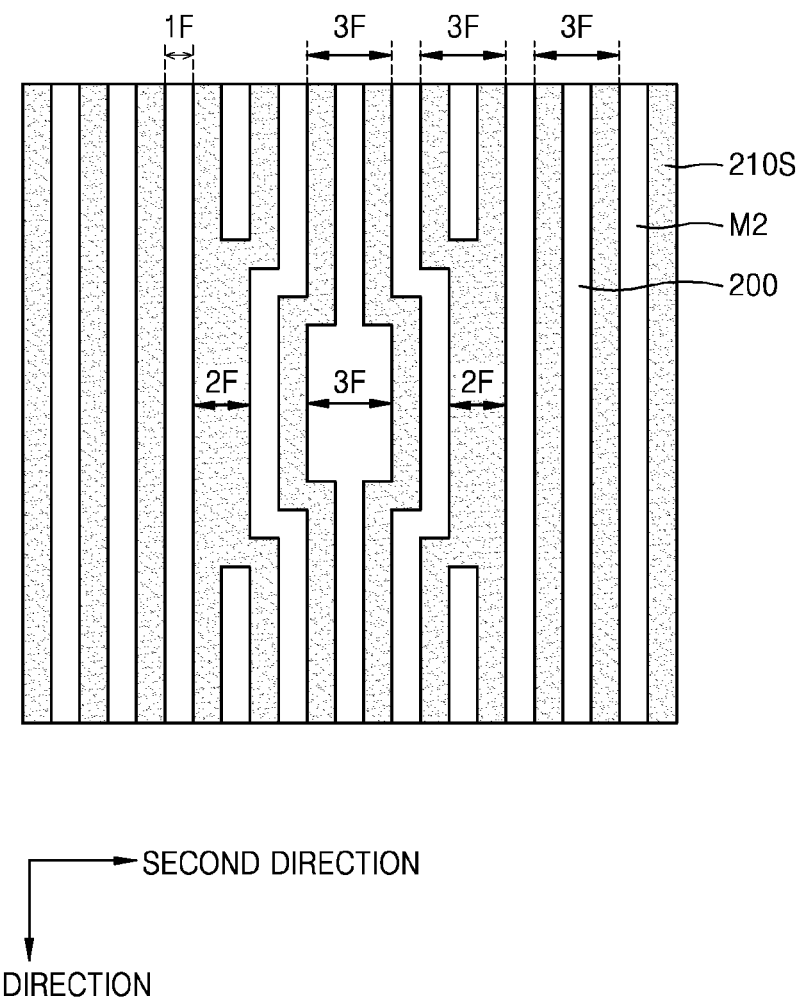

Referring to FIG. 15D, a second spacer layer may be conformally formed on an exposed surface of the second mask layer 200 and the entire surface of the second mask pattern M2 and anisotropically etched to form second spacers 210S.

A width of the second spacers 210S may be equal or similar to a thickness of the second spacer layer. The width of the second spacers 210S may be ⅓ of the mask line width WM of the plurality of mask line patterns M1A, M1B, and M1C. For example, the second spacers 210S may be formed to a width equal or similar to the width (i.e., 1F) of the conductive line pattern to be finally formed.

Figure 15E:
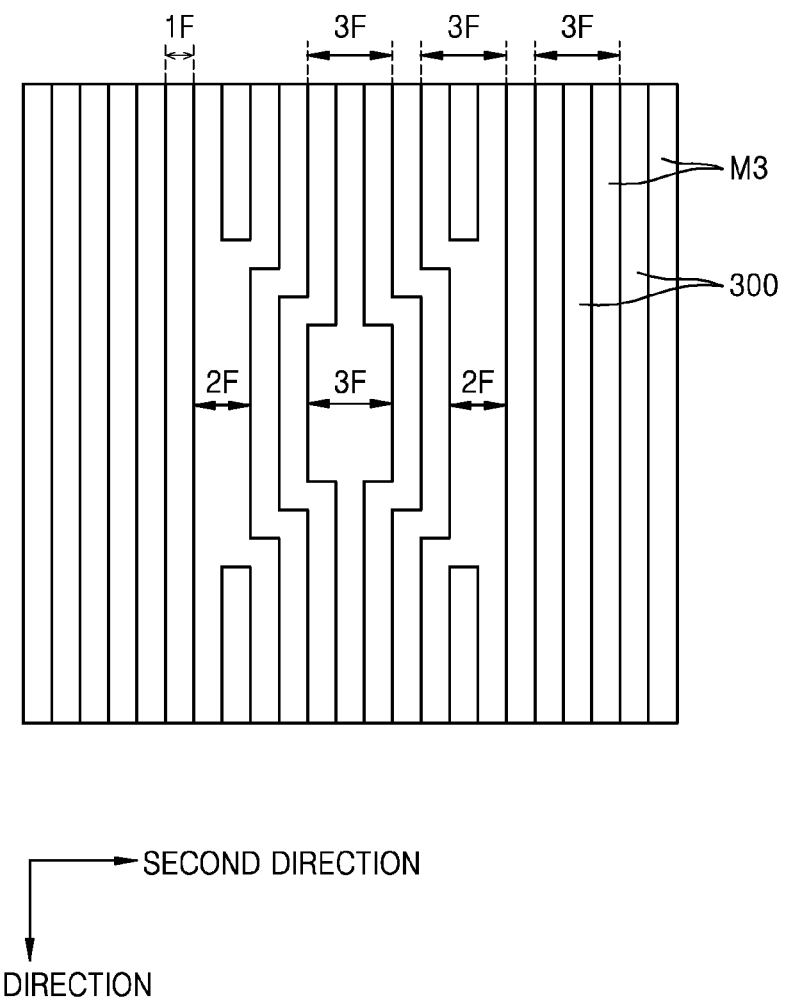

Referring to FIG. 15E, the second mask layer (refer to 200 in FIG. 15D) may be anisotropically etched by using the second spacer (refer to 210S in FIG. 15D) as an etch mask so that a third mask pattern M3 may be formed on third mask layer 300.

Figure 15F:
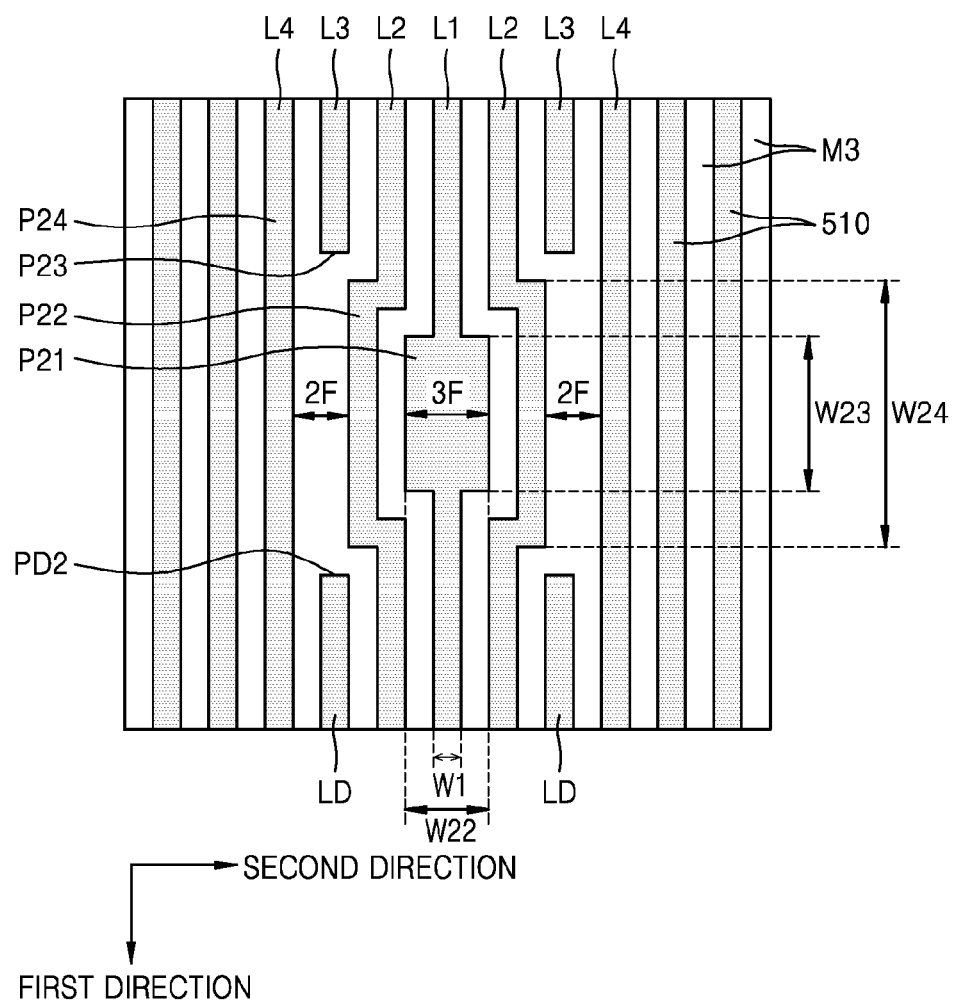

Referring to FIG. 15F, an ultrafine pattern that may exceed the resolution limit may be formed by using QPT. For example, the first mask pattern (refer to M1 in FIG. 15A) having a width greater than 1F, the target width of the eventual conductive line patterns, may be formed by using a one-time photolithography process. By using the first mask pattern M1 and through the second mask pattern M2, as described above, a third mask pattern M3 having a width of 1F may be formed. Four mask line patterns constituting the third mask pattern M3 may be formed by and may correspond to one mask line pattern included in the first mask pattern M1. A damascene process may be performed by using the third mask pattern M3 as an insulating line pattern so that a plurality of conductive line patterns 510 having a width of 1F may be finally formed.

The plurality of conductive line patterns 510 may include a first conductive line pattern L1, second conductive line patterns L2, third conductive line patterns L3, fourth conductive line patterns L4, and dummy conductive line patterns LD. The plurality of conductive line patterns 510 may have the same width.

Portions of the first conductive line pattern L1 may include protrusions P21, each of which may have a width W22 in the second direction and a width W23 in the first direction. The width W22 of the protrusion P21 may be greater than the width W1 of the first conductive line pattern L1. The protrusions P21 may be formed in the cell array region and/or the page buffer region. The protrusions P21 may be contact pads.

The protrusions P21 may be formed on both sidewalls of the first conductive line pattern L1, and the width W22 of the protrusions P21 may have a size of 3F, three times of the width of the conductive line pattern L1.

A plurality of the second conductive line patterns L2 may be formed adjacent to the first conductive line pattern L1 and include bent portions P22 that surround the protrusions P21, respectively. The bent portion P22 of each of the second conductive line patterns L2 may have a width W24 in the first direction, and the width W24 of each of the bent portions P22 may be greater than the width W23 of the protrusions P21.

During a process of forming the protrusions P21 of the first conductive line pattern L1 by using the varied width portion PM of the first mask pattern (refer to M1 in FIG. 15A), the second conductive line patterns L2 adjacent to the first conductive line pattern L1 may be formed to include the bent portions P22.

A plurality of the third conductive line patterns L3 may be formed adjacent to the second conductive line patterns L2. Each of the third conductive line patterns L3 may have an end portion P23 located in a line apart from the bent portion P22 of the second conductive line pattern L2. For example, the end portion P23 of the third conductive line pattern L3 may be disposed near the bent portion P22, and electrically insulated from the bent portion P22.

Due to the bent portions P22 of the second conductive line patterns L2, the third conductive line patterns L3 may have a length smaller than each length of the first conductive line pattern L1 and the second conductive line patterns L2 in the first direction. For example, the bent portions P22 of the second conductive line patterns L2 may block the third conductive line patterns L3 in the first direction.

For example, due to the bent portions P22 of the second conductive line patterns L2, dummy conductive line patterns LD may be formed opposite the end portions P23 of the third conductive line patterns L3 across the bent portions P22 of the second conductive line patterns L2. The dummy conductive line patterns LD may have the first width and be parallel to the first direction. The third conductive line patterns L3 and the dummy conductive line patterns LD may be located in straight lines, respectively. For example, the third conductive line patterns L3 and the dummy conductive line patterns LD may be disposed in the same line but in different locations disconnected from each other.

A plurality of dummy conductive line patterns LD may be formed adjacent to the second conductive line patterns L2. Each of the dummy conductive line patterns LD may have an end portion PD2 that is located in a line apart from the bent portion P22 of the second conductive line pattern L2. For example, the plurality of dummy conductive line patterns LD may be parallel and formed next to the second conductive line patterns L2 other than the bent portion P22.

The fourth conductive line patterns L4 may be adjacent to the third conductive line patterns L3, and a minimum space between the fourth conductive line patterns L4 and the bent portions P22 of the second conductive line patterns L2 may be equal or similar to twice the width W1 of the first conductive line pattern L1. For example, the third mask pattern M3 may be formed between the plurality of conductive line patterns 510, a width of the third mask pattern M3 may be equal or similar to a width of the plurality of conductive line patterns 510, and the third mask patterns M3 may contact and be unified with each other between the fourth conductive line pattern L4 and the bent portion P22 of the second conductive line pattern L2. Thus, a minimum space between the fourth conductive line patterns L4 and the bent portion P22 of the second conductive line patterns L2 may be equal or similar to twice the width of the other parts of the third mask pattern M3. For example, the distance between the fourth conductive line pattern L4 and the bent portion P22 of the second conductive line pattern L2 may be about 2W or 2F.

FIGS. 16A to 16F are plan views of a process of forming patterns of a semiconductor device according to some exemplary embodiments.

Detailed descriptions of the same elements and functions as described in FIGS. 4A to 14B will be omitted.

Figure 16A:
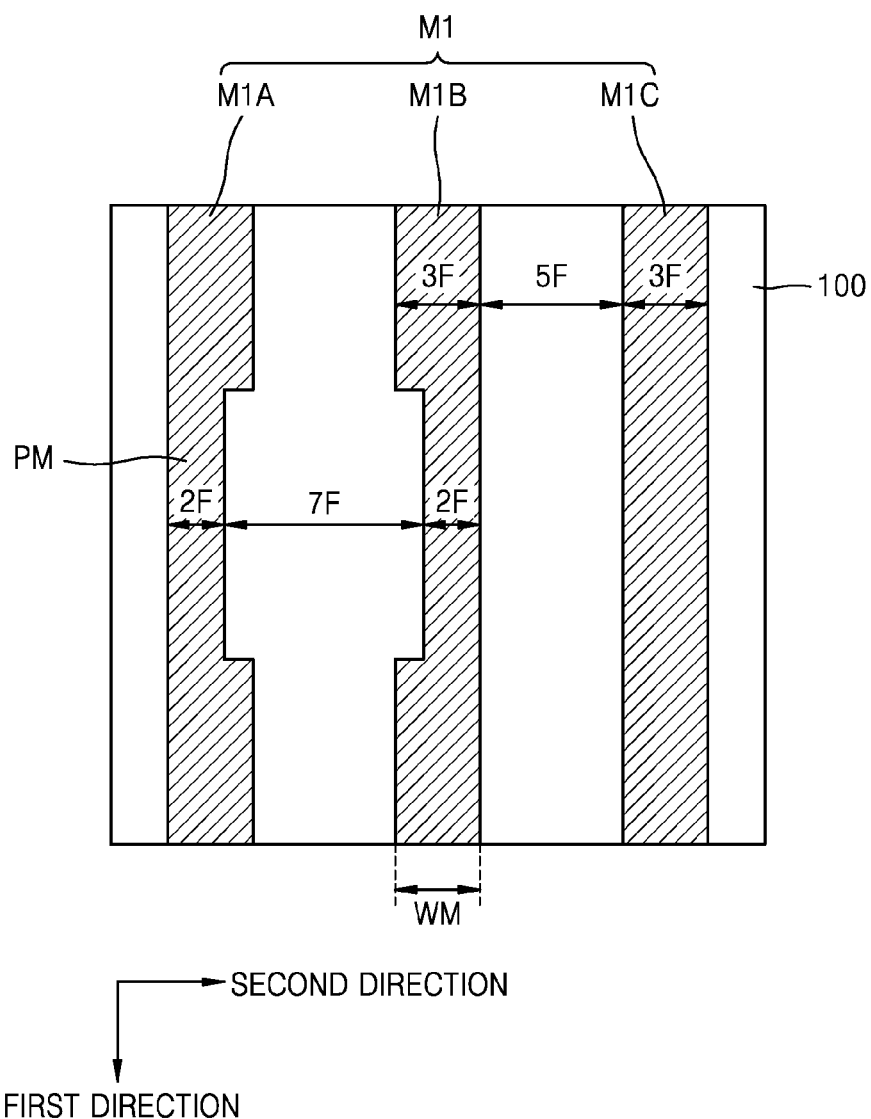
FIGS. 16A to 16F are plan views of a process of forming a pattern of a semiconductor device, according to an exemplary embodiment.

Referring to FIG. 16A, a first mask pattern M1 may be formed on a first mask layer 100 or a material layer formed on the first mask layer 100. The first mask pattern M1 may include a plurality of mask line patterns, for example, mask line patterns M1A, M1B, and M1C. A mask line width WM of the plurality of mask line patterns M1A, M1B, and M1C may be greater than 1F, the target width of the final conductive line patterns formed by using the mask line pattern M1. Distances between the plurality of mask line patterns M1A, M1B, and M1C may be greater than the mask line width WM. The mask line width WM and the distance between the plurality of mask line patterns M1A, M1B, and M1C may be modified according to sizes and arrangements of conductive line patterns and contact pads to be finally formed. For example, the mask line width WM and the distance between the mask line patterns M1A, M1B, and M1C may have other values and/or forms than those in the FIG. 16A.

For example, the width of the first line patterns M1A, M1B, and M1C may be 3F, and the distance between the first line patterns M1A, M1B, and M1C may be 5F. Varied width portions PM may be formed in portions of the first mask line patterns M1A and M1B. For example, each of the varied width portions PM may be formed by recessing one sidewall of one of the first mask line patterns M1A and M1B to a width of 1F, each of the varied width portions PM of the first mask line patterns M1A and M1B may have a width of 2F, and a distance between the varied width portions PM may be 7F. Thus, a rectangular shape having a predetermined length in the first direction may be formed. For example, an empty rectangular shape may be formed between and by the first mask line patterns M1A and M1B, which has a 7F width in the second direction and the predetermined length in the first direction. The varied width portions PM may be recessed such that adjacent first line patterns M1A and M1B are located symmetrically in mirror-image relations. Since positions, sizes, and shapes of contact pads to be finally formed depend on positions, sizes, and shapes of the varied width portions PM, the shapes of the varied width portions PM may vary. For example, the positions, sizes, and shapes of the varied width portions PM may have other values and/or forms than those of FIG. 16A.

Figure 16B:
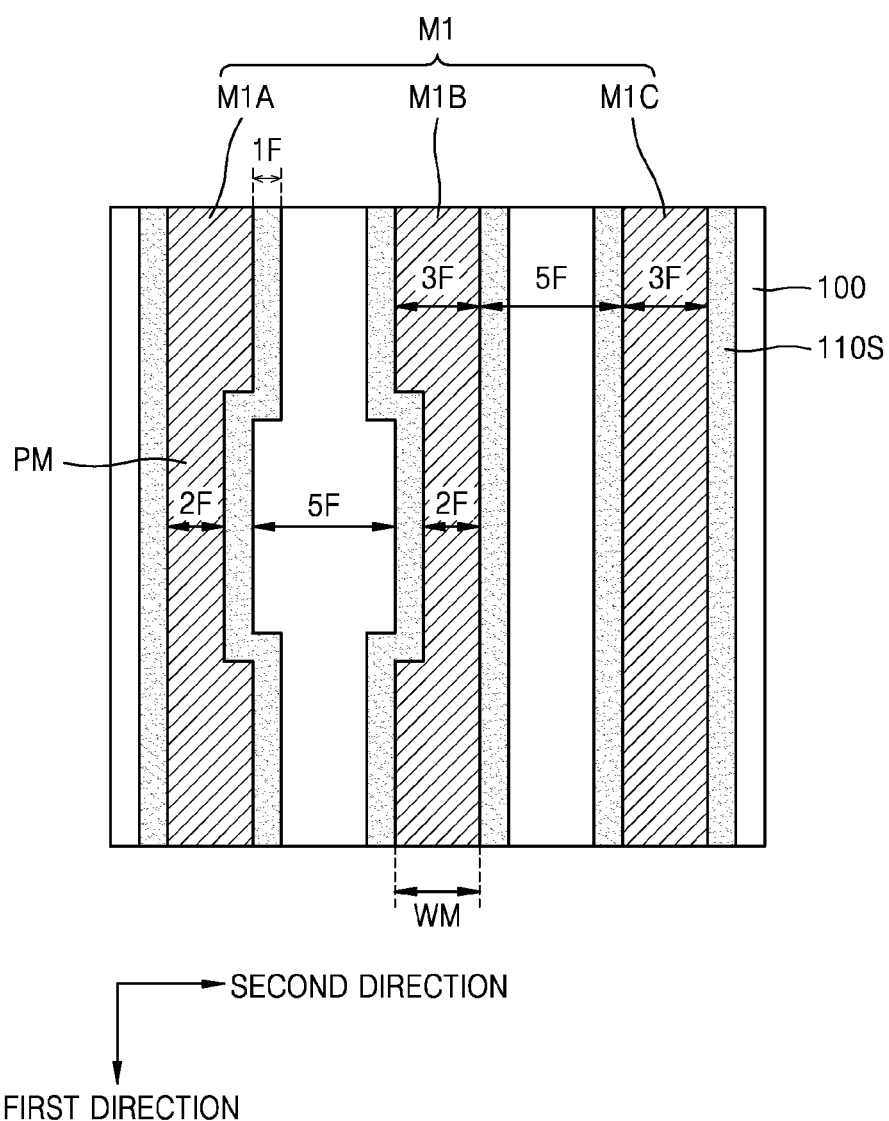

Referring to FIG. 16B, a first spacer layer may be conformally formed on an exposed surface of the first mask layer 100 and the entire surface of the first mask pattern M1 and anisotropically etched to form first spacers 110S.

A width of the first spacers 110S may be equal or similar to a thickness of the first spacer layer. The width of the first spacers 110S may be about ⅓ a mask line width WM of the plurality of mask line patterns M1A, M1B, and M1C. For example, the first spacers 110S may be formed to a width equal or similar to the width (i.e., 1F) of conductive line patterns to be finally formed.

Figure 16C:
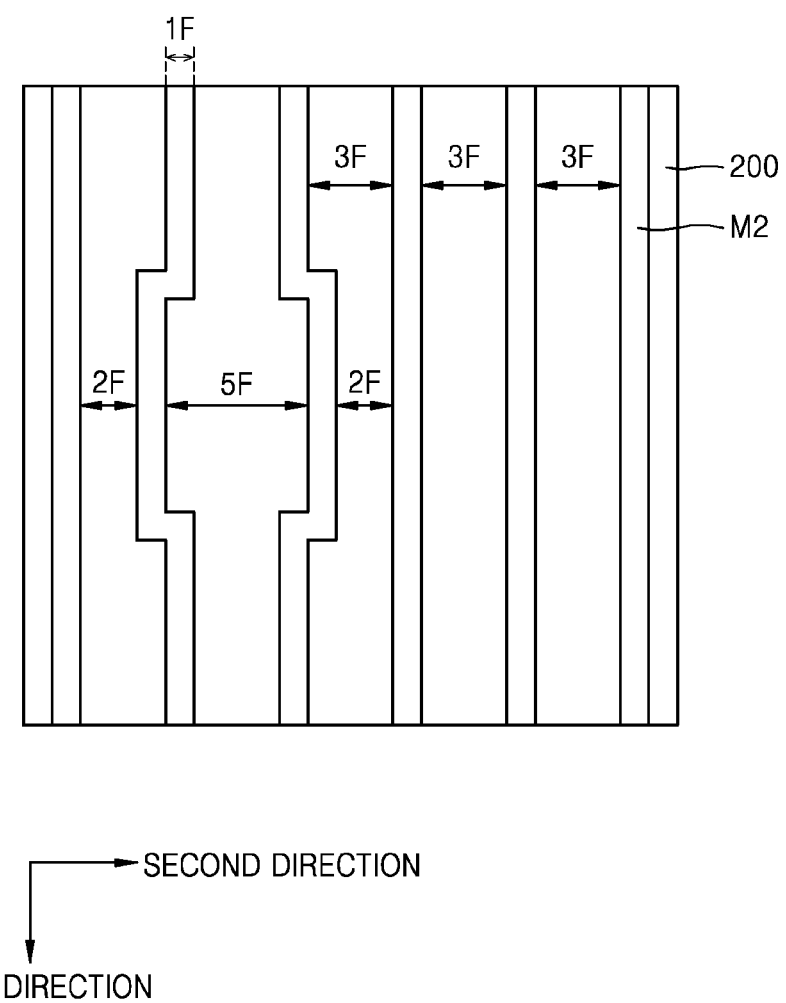

Referring to FIG. 16C, after the first spacers (refer to 110S in FIG. 16B) are formed, the first mask pattern (refer to M1 in FIG. 16B) may be removed. Afterwards, the first mask layer (refer to 100 in FIG. 16B) may be anisotropically etched by using the first spacers (refer to 110S in FIG. 16B)

as an etch mask, thereby forming a second mask pattern M2 on the second mask layer 200.

Figure 16D:
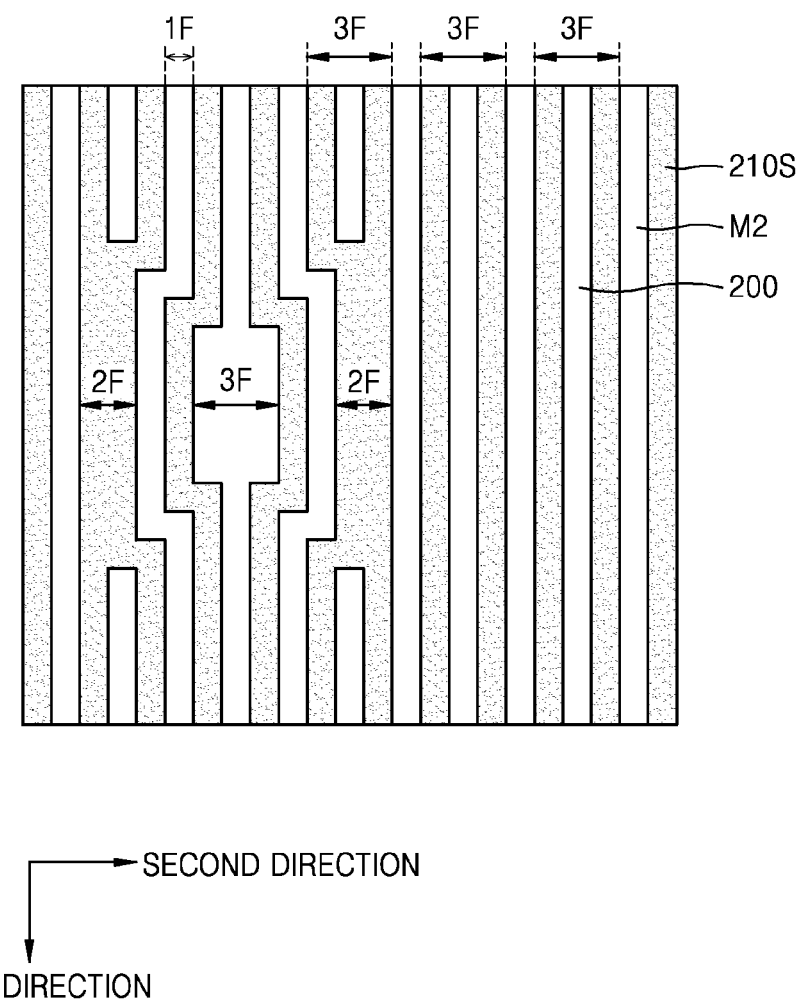

Referring to FIG. 16D, a second spacer layer may be conformally formed on an exposed surface of the second mask layer 200 and the entire surface of the second mask pattern M2 and anisotropically etched to form second spacers 210S.

A width of the second spacers 210S may be equal or similar to a thickness of the second spacer layer. The width of the second spacers 210S may be about ⅓ the mask line width WM of the plurality of mask line patterns M1A, M1B, and M1C. For example, the second spacers 210S may be formed to a width equal or similar to the width (i.e., 1F) of the conductive line patterns to be finally formed.

Figure 16E:
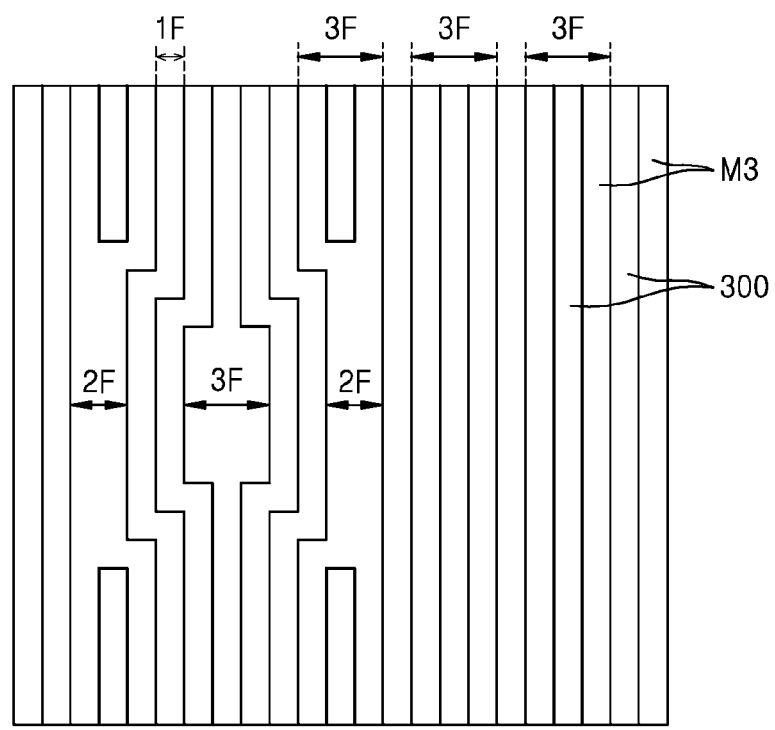
Figure 16E:
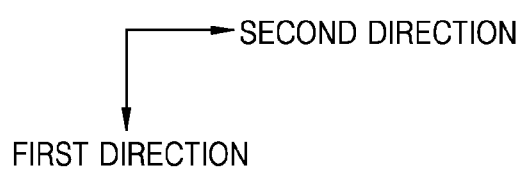

Referring to FIG. 16E, the second mask layer (refer to 200 in FIG. 16D) may be anisotropically etched by using the second spacers (refer to 210S in FIG. 16D) as an etch mask so that a third mask pattern M3 may be formed on a third mask layer 300.

Figure 16F:
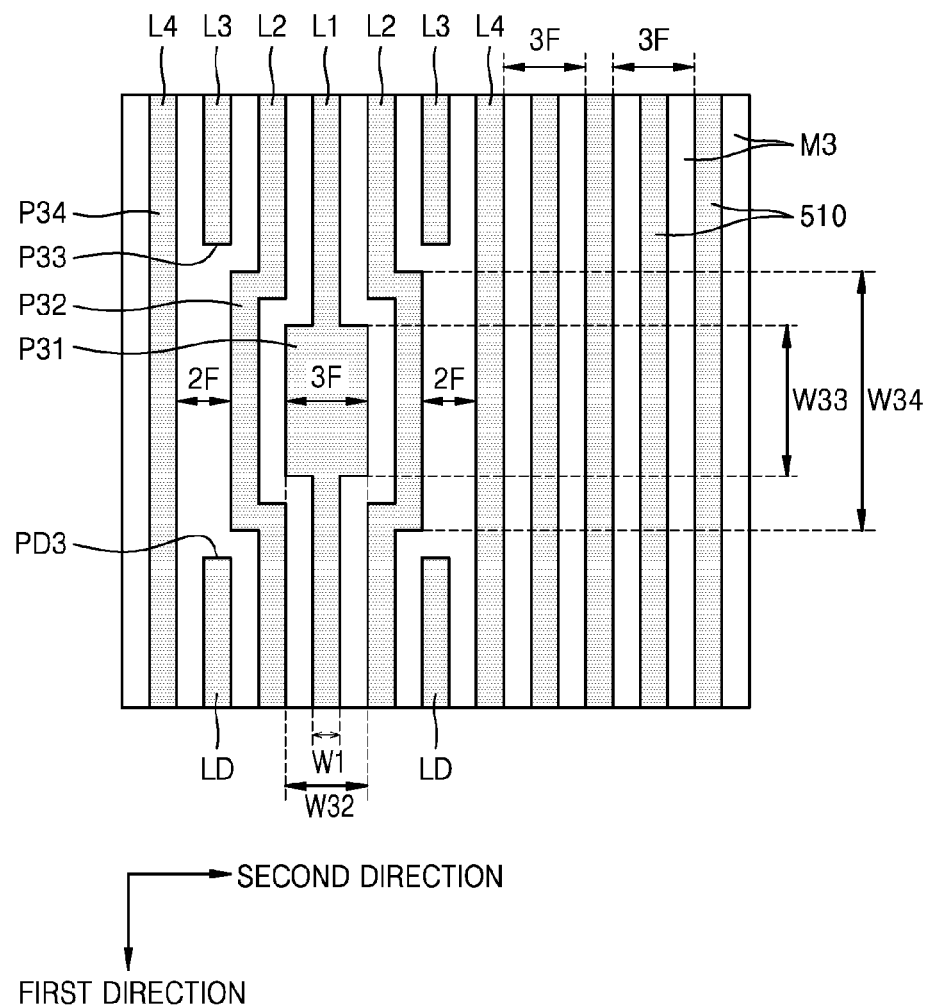

Referring to FIG. 16F, an ultrafine pattern that may exceed the resolution limit may be formed by using QPT. For example, the first mask pattern (refer to M1 in FIG. 16A) having a width greater than 1F, the target width of the eventual conductive line patterns, may be formed by using a one-time photolithography process. By using the first mask pattern M1 and through the second mask pattern M2, as described above, a third mask pattern M3 having a width of 1F may be formed. Four mask line patterns constituting the third mask pattern M3 may be formed by and may correspond to one mask line pattern included in the first mask pattern M1. A damascene process may be performed by using the third mask pattern M3 as an insulating line pattern so that a plurality of conductive line patterns 510 having a width of 1F may be finally formed.

The plurality of conductive line patterns 510 may include a first conductive line pattern L1, second conductive line patterns L2, third conductive line patterns L3, fourth conductive line patterns L4, and dummy conductive line patterns LD. The plurality of conductive line patterns 510 may have the same width.

Portions of the first conductive line pattern L1 may include protrusions P31, each of which may have a width W32 in the second direction and a width W33 in the first direction. The width W32 of the protrusions P31 may be greater than a width W1 of the first conductive line pattern L1. The protrusion P31 may be formed in the cell array region and/or the page buffer region. The protrusions P31 may be contact pads.

The protrusions P31 may be formed on both sidewalls of the first conductive line pattern L1, and the width W32 of the protrusion P31 may have a size of 3F, three times of the width of the conductive line patterns L1-L4.

A plurality of the second conductive line patterns L2 may be formed adjacent to the first conductive line pattern L1 and include bent portions P32 that surround the protrusions P31, respectively. Each of the bent portions P32 of the second conductive line patterns L2 may have a width W34 in the first direction, and the width W34 of the bent portion P32 may be greater than the width W33 of the protrusion P31.

During a process of forming the protrusions P31 of the first conductive line pattern L1 by using the varied width portions PM of the first mask pattern (refer to M1 in FIG. 16A), the second conductive line patterns L2 adjacent to the first conductive line pattern L1 may be formed to include the bent portions P32, respectively.

A plurality of third conductive line patterns L3 may be formed adjacent to the second conductive line patterns L2.

Each of the third conductive line patterns L3 may have an end portion P33 located in a line apart from the bent portion P32 of the second conductive line patterns L2.

Due to the bent portion of the second conductive line patterns L2, the third conductive line patterns L3 may have a length less than each length of the first conductive line pattern L1 and the second conductive line patterns L2 in the first direction.

For example, due to the bent portions P32 of the second conductive line patterns L2, dummy conductive line patterns LD may be formed opposite end portions P33 of the third conductive line patterns L3 across the bent portions P32 of the second conductive line patterns L2. The dummy conductive line LD may have the first width and be parallel to the first direction. The third conductive line patterns L3 and the dummy conductive line patterns LD may be located in straight lines, respectively. For example, the third conductive line patterns L3 and the dummy conductive line patterns LD may be disposed in the same line but in different locations disconnected from each other.

A plurality of the dummy conductive line patterns LD may be formed adjacent to the second conductive line patterns L2. Each of the dummy conductive line patterns LD may have an end portion PD3 located in a line apart from the bent portion P32 of the second conductive line patterns L2.

The fourth conductive line patterns L4 may be formed adjacent to the third conductive line patterns L3, and a minimum space between the fourth conductive line patterns L4 and the bent portion P32 of the second conductive line patterns L2 may be equal or similar to twice the width W1 of the first conductive line pattern L1. For example, the third mask patterns M3 may be located among the plurality of conductive line patterns 510, a width of the third mask patterns M3 may be equal or similar to a width of the plurality of conductive line patterns 510, and the third mask patterns M3 may contact and be unified with each other between the fourth conductive line patterns L4 and the bent portions P32 of the second conductive line patterns L2. Thus, a minimum space between the fourth conductive line patterns L4 and the bent portion P32 of the second conductive line patterns L2 may be equal or similar to twice the width of the other parts of the third mask patterns M3. For example, the distance between the fourth conductive line pattern L4 and the bent portion P22 of the second conductive line pattern L2 may be about 2W or 2F.

FIGS. 17A to 17F are plan views of a process of forming patterns of a semiconductor device according to some exemplary embodiments.

Detailed descriptions of the same elements and functions as described in FIGS. 4A to 14B will be omitted.

Figure 17A:
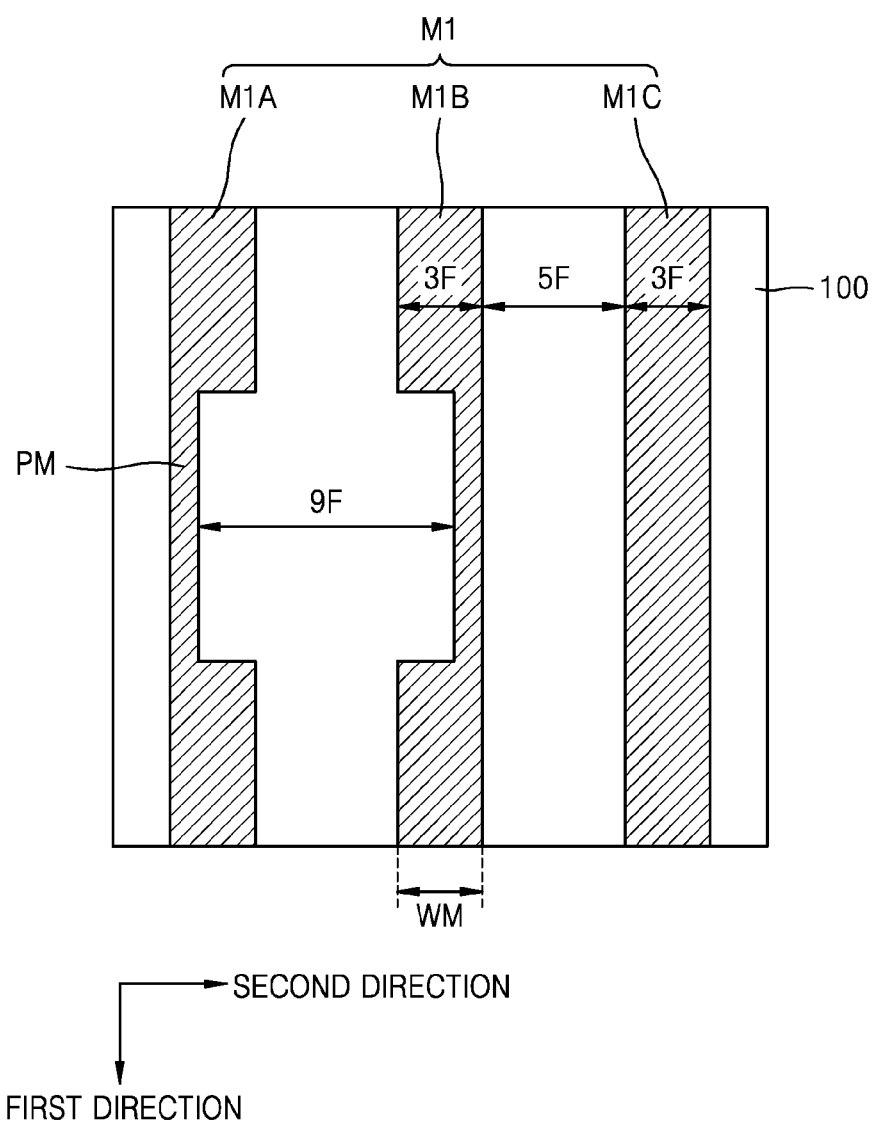
FIGS. 17A to 17F are plan views of a process of forming a pattern of a semiconductor device, according to an exemplary embodiment.

Referring to FIG. 17A, a first mask pattern M1 may be formed on a first mask layer 100 or a material layer formed on the first mask layer 100. The first mask pattern M1 may include a plurality of mask line patterns M1A, M1B, and M1C. A mask line width WM of the plurality of mask line patterns M1A, M1B, and M1C may be greater than 1F, the target width of the eventual conductive line patterns. Distances between the plurality of mask line patterns M1A, M1B, and M1C may be greater than the mask line width WM. The mask line width WM and the distance between the plurality of mask line patterns M1A, M1B, and M1C may be modified according to sizes and arrangements of conductive line patterns and contact pads to be finally formed. For example, the mask line width WM and the distance between the mask line patterns M1A, M1B, and M1C may have other values and/or forms than those in the FIG. 17A.

Varied width portions PM may be formed in portions of first mask line patterns M1A and M1B. The varied width portions PM may be respectively recessed in sidewalls of the first mask line patterns M1A and M1B to a width of 2F. Thus, each of the varied width portions PM of the first mask line patterns M1A and M1B may have a width of 1F, a distance between the varied width portions PM may be 9F, and a rectangular shape having a predetermined length in the first direction may be formed. For example, an empty rectangular shape may be formed between and by the first mask line patterns M1A and M1B, which has a 9F width in the second direction and the predetermined length in the first direction. The varied width portions PM may be recessed such that first mask line patterns M1A and M1B located adjacent to each other are symmetrical to each other in mirror-image relations. Since positions, sizes, and shapes of contact pads to be finally formed depend on positions, sizes, and shapes of the varied width portions PM, the shapes of the varied width portions PM may vary. For example, the positions, sizes, and shapes of the varied width portions PM may have other values and/or forms than those of FIG. 17A.

Figure 17B:
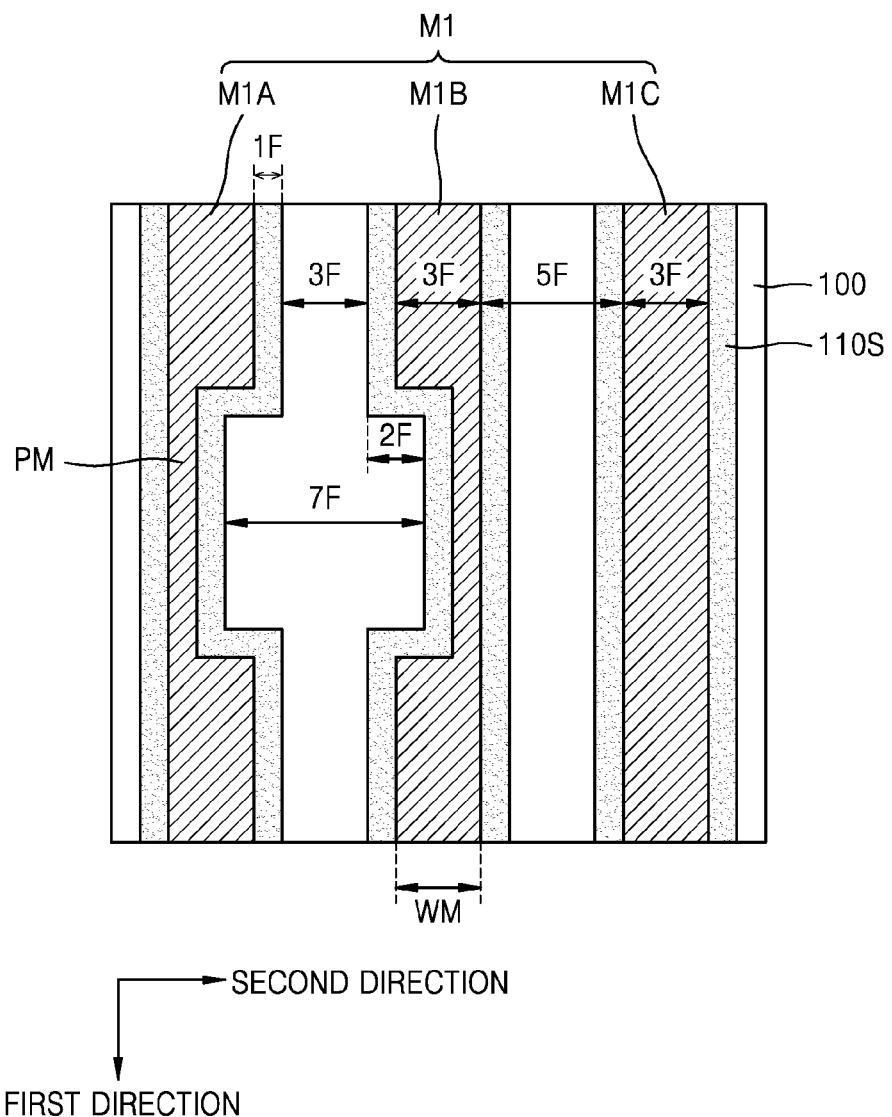

Referring to FIG. 17B, a first spacer layer may be conformally formed on an exposed surface of the first mask layer 100 and the entire surface of the first mask pattern M1 and anisotropically etched to form first spacers 110S.

A width of the first spacers 110S may be equal or similar to a thickness of the first spacer layer. The width of the first spacers 110S may be about ⅓ of a mask line width WM of the plurality of mask line patterns M1A, M1B, and M1C. For example, the first spacers 110S may be formed to a width equal or similar to the width (i.e., 1F) of conductive line patterns to be finally formed.

Figure 17C:
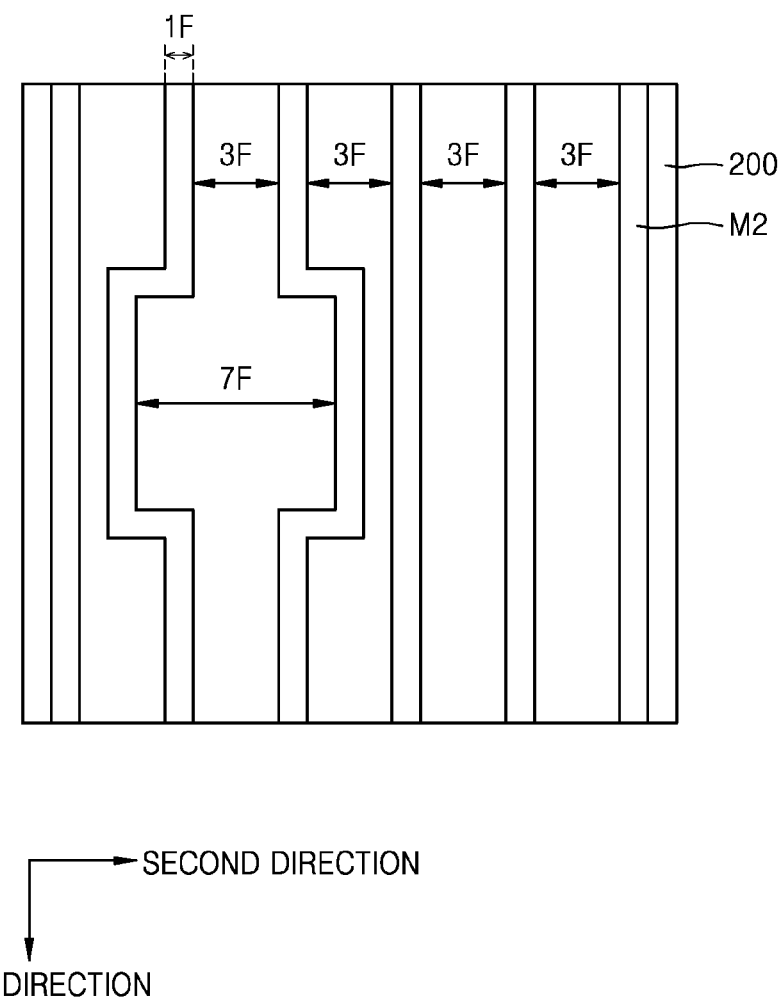

Referring to FIG. 17C, after the first spacers (refer to 110S in FIG. 17B) are formed, the first mask pattern (refer to M1 in FIG. 17B) may be removed. Thereafter, the first mask layer (refer to 100 in FIG. 17B) may be anisotropically etched by using the first spacers 110S as an etch mask so that a second mask pattern M2 may be formed on the second mask layer 200.

Figure 17D:
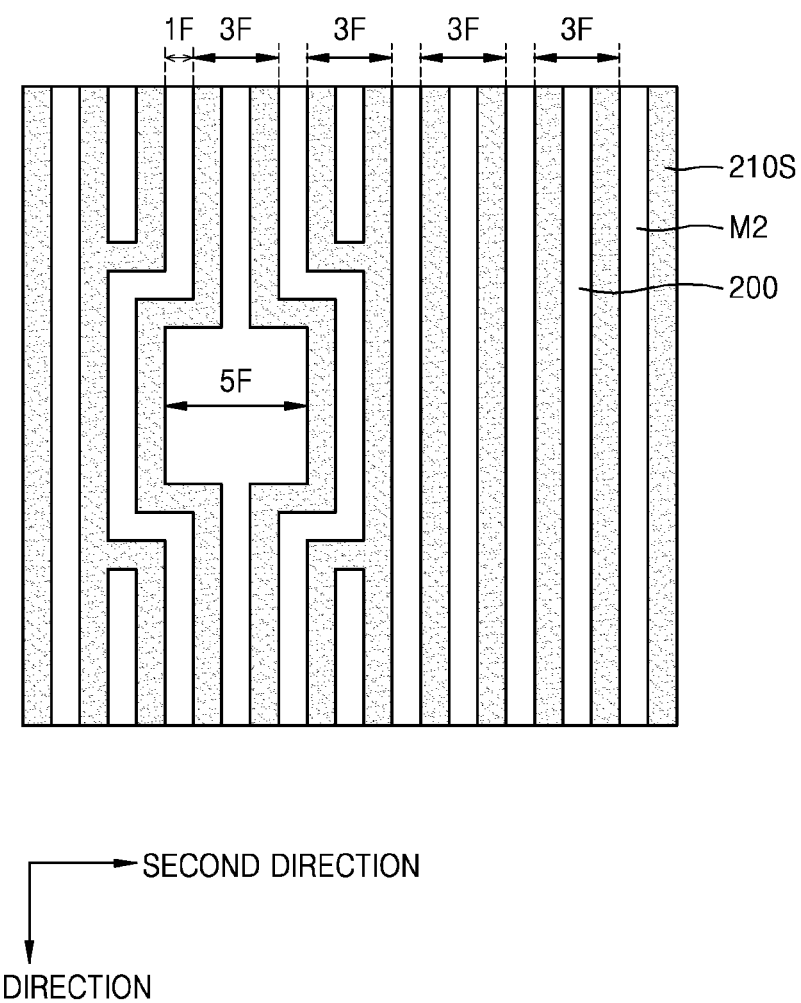

Referring to FIG. 17D, a second spacer layer may be conformally formed on an exposed surface of the second mask layer 200 and the entire surface of the second mask pattern M2 and anisotropically etched to form second spacers 210S.

A width of the second spacers 210S may be equal or similar to a thickness of the second spacer layer. The width of the second spacers 210S may be about ⅓ of the mask line width WM of the plurality of mask line patterns M1A, M1B, and M1C. For example, the second spacers 210S may be formed to a width equal or similar to the width (i.e., 1F) of the conductive line patterns to be finally formed.

Figure 17E:
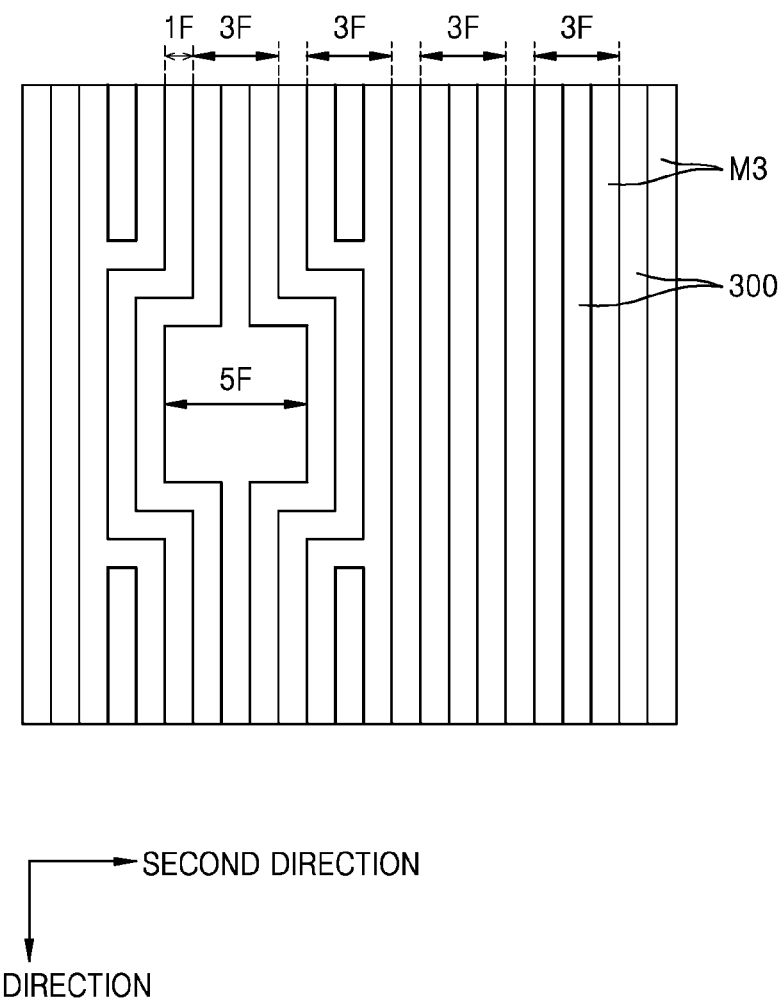

Referring to FIG. 17E, the second mask layer (refer to 200 in FIG. 17D) may be anisotropically etched by using the second spacers (refer to 210S in FIG. 17D) as an etch mask to form a third mask pattern M3 on a third mask layer 300.

Figure 17F:
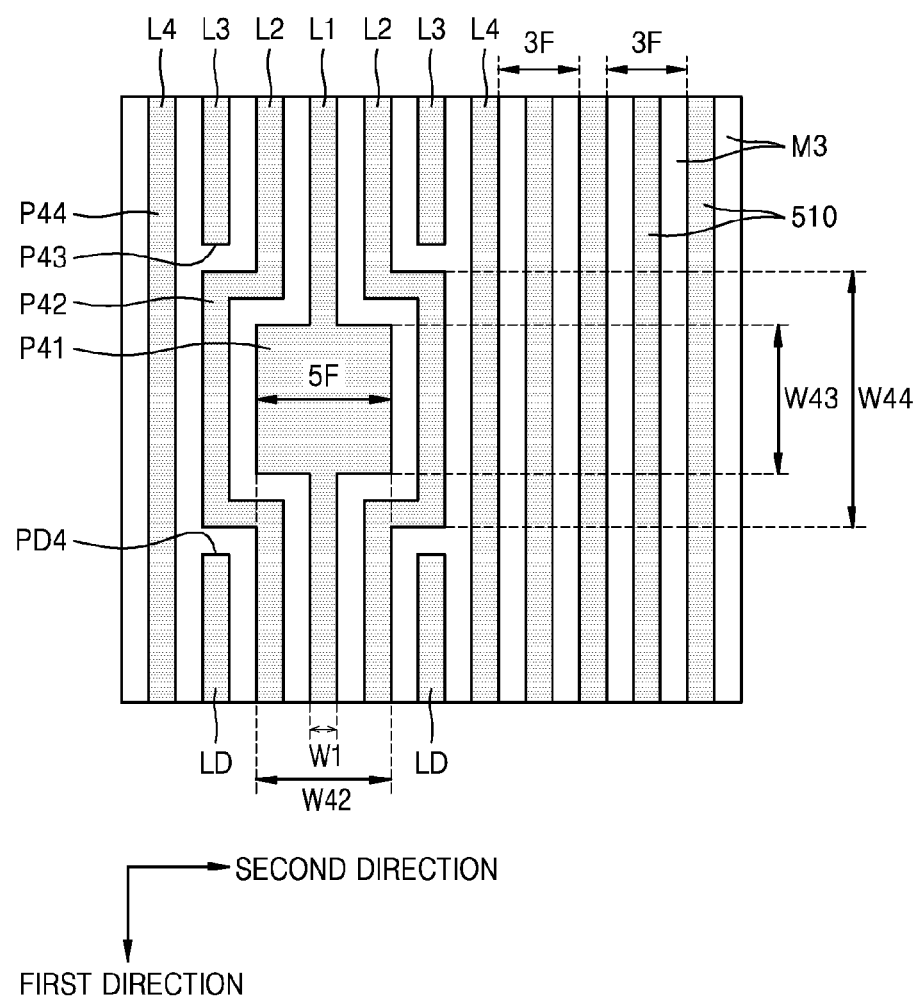

Referring to FIG. 17F, an ultrafine pattern that may exceed the resolution limit may be formed by using QPT. For example, the first mask pattern (refer to M1 in FIG. 17A) having a width greater than 1F may be formed by using a one-time photolithography process. By using the first mask pattern M1 and through the second mask pattern M2, as described above, a third mask pattern M3 having a width of 1F may be formed. Four mask line patterns constituting the third mask pattern M3 may be formed by and may correspond to one mask line pattern included in the first mask pattern M1. A damascene process may be performed by using the third mask pattern M3 as an insulating line pattern so that a plurality of conductive line patterns 510 having a width of 1F may be finally formed.

The plurality of conductive line patterns 510 may include a first conductive line pattern L1, second conductive line patterns L2, third conductive line patterns L3, fourth conductive line patterns L4, and dummy conductive line patterns LD. The plurality of conductive line patterns 510 may have the same width.

Portions of the first conductive line pattern L1 may include protrusions P41, each of which may have a width W42 in the second direction and a width W43 in the first direction. The width W42 of the protrusion P41 may be greater than a width W1 of the first conductive line pattern L1. The protrusions P41 may be formed in a cell array region and/or a page buffer region. The protrusions P41 may be contact pads.

The protrusions P41 may be formed on both sidewalls of the first conductive line pattern L1, and the width W42 of the protrusion P41 may have a size of 5F.

A plurality of second conductive line patterns L2 may be formed adjacent to the first conductive line pattern L1 and include bent portions P42 that surround the protrusions P41, respectively. Each of the bent portions P42 of the second conductive line patterns L2 may have a width W44 in the first direction, and the width W44 of each of the bent portions P42 may be greater than the width W43 of each of the protrusions P41.

During a process of forming the protrusion P41 of the first conductive line pattern L1 by using the varied width portions PM of the first mask pattern (refer to M1 in FIG. 17A), the second conductive line patterns L2 adjacent to the first conductive line pattern L1 may be formed to include the bent portions P42.

A plurality of the third conductive line patterns L3 may be formed adjacent to the second conductive line patterns L2 and include end portions P43 that face the bent portions P42 of the second conductive line patterns L2, respectively.

Due to the bent portion P42 of the second conductive line patterns L2, the third conductive line patterns L3 may have a length less than each length of the first conductive line pattern L1 and the second conductive line patterns L2 in the first direction.

For example, due to the bent portions P42 of the second conductive line patterns L2, dummy conductive line patterns LD may be formed in an opposite direction to a direction in which the end portions P43 of the third conductive line patterns L3 face the bent portions P42 of the second conductive line patterns L2. For example, a dummy conductive line pattern LD may be formed at one side apart from a bent portion P42 of a second conductive line pattern L2, and an end portion P43 of a third conductive line pattern L3 may be formed at the opposite side apart from the bent portion P42. The dummy conductive line patterns LD may have the first width and be parallel to the first direction. The third conductive line patterns L3 and the dummy conductive line patterns LD may be located in straight lines, respectively. For example, the third conductive line patterns L3 and the dummy conductive line patterns LD may be disposed in the same line but in different locations disconnected from each other.

For example, a plurality of third conductive line patterns L3 may be spaced apart from a plurality of dummy conductive line patterns LD with the bent portions P42 of the second conductive line patterns L2 therebetween.

A plurality of dummy conductive line patterns LD may be formed adjacent to the second conductive line patterns L2 and have end portions PD4 that face the bent portions P42 of the second conductive line patterns L2, respectively.

The fourth conductive line patterns L4 may be adjacent to the third conductive line patterns L3, and a minimum space between the fourth conductive line patterns L4 and the bent portions P42 of the second conductive line patterns L2 may be equal or similar to the width W1 of the first conductive line pattern L1. For example, since the third mask pattern M3 is formed between the plurality of conductive line patterns 510 and a width of the third mask pattern M3 is equal or similar to a width of the plurality of conductive line patterns 510, the minimum space between the fourth conductive line patterns L4 and the bent portions P42 of the second conductive line patterns L2 may be equal or similar to the width of the third mask pattern M3.

FIGS. 18A to 18F are plan views of a process of forming patterns of a semiconductor device according to some exemplary embodiments.

Detailed descriptions of the same elements and functions as described in FIGS. 4A to 14B will be omitted.

Figure 18A:
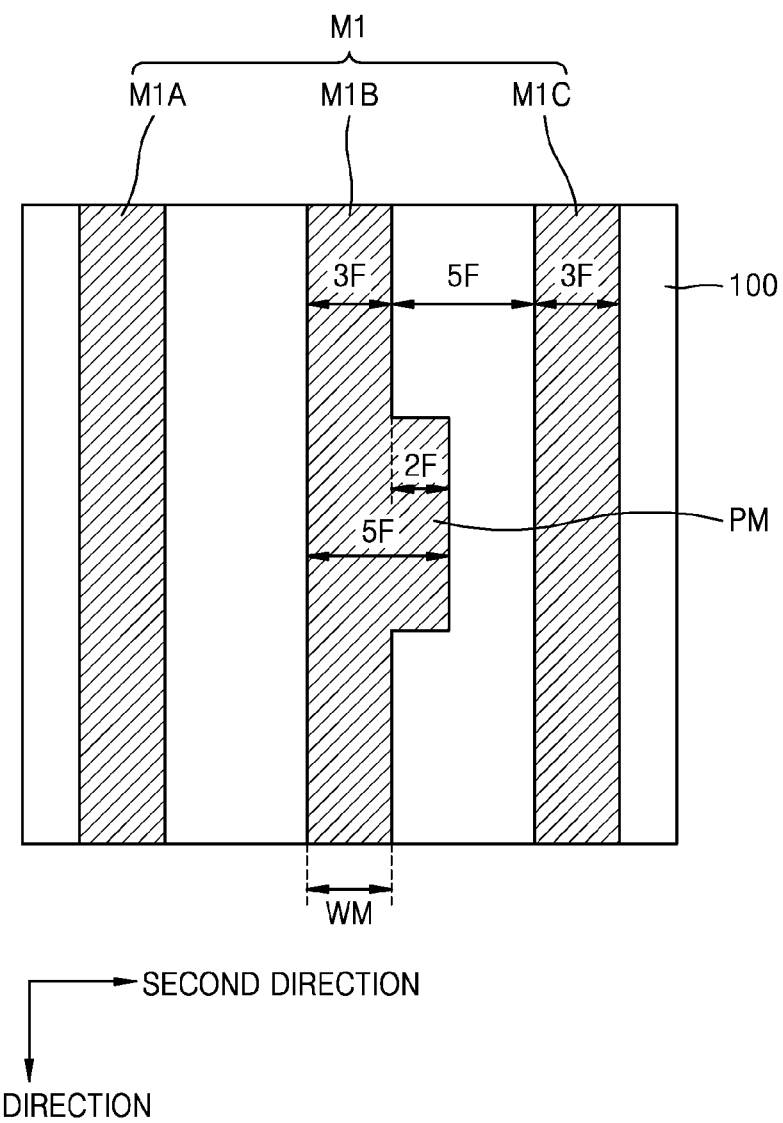
FIGS. 18A to 18F are plan views of a process of forming a pattern of a semiconductor device, according to an exemplary embodiment.

Referring to FIG. 18A, a first mask pattern M1 may be formed on a first mask layer 100 or a material layer formed on the first mask layer 100. The first mask pattern M1 may include a plurality of mask line patterns, for example, mask line patterns M1A, M1B, and M1C. The mask line width WM of the plurality of mask line patterns M1A, M1B, and M1C may be greater than 1F, the target width of the eventual conductive line patterns. Distances between the plurality of mask line patterns M1A, M1B, and M1C may be greater than the mask line width WM. The mask line width WM and the distance between the plurality of mask line patterns M1A, M1B, and M1C may be modified according to sizes and arrangements of conductive line patterns and contact pads to be finally formed. For example, the mask line width WM and the distance between the mask line patterns M1A, M1B, and M1C may have other values and/or forms than those in the FIG. 18A.

A varied width portion PM may be formed in a portion of the first mask line pattern M1B. The varied width portion PM may protrude from one sidewall of the first mask line pattern M1B to a width of 2F and have a total width of 5F. Thus, the varied width portion PM may have a rectangular shape with a predetermined length in the first direction. Since positions, sizes, and shapes of contact pads to be finally formed depend on a position, size, and shape of the varied width portion PM, the shape of the varied width portion PM may vary. For example, the positions, sizes, and shapes of the varied width portions PM may have other values and/or forms than those of FIG. 18A.

Figure 18B:
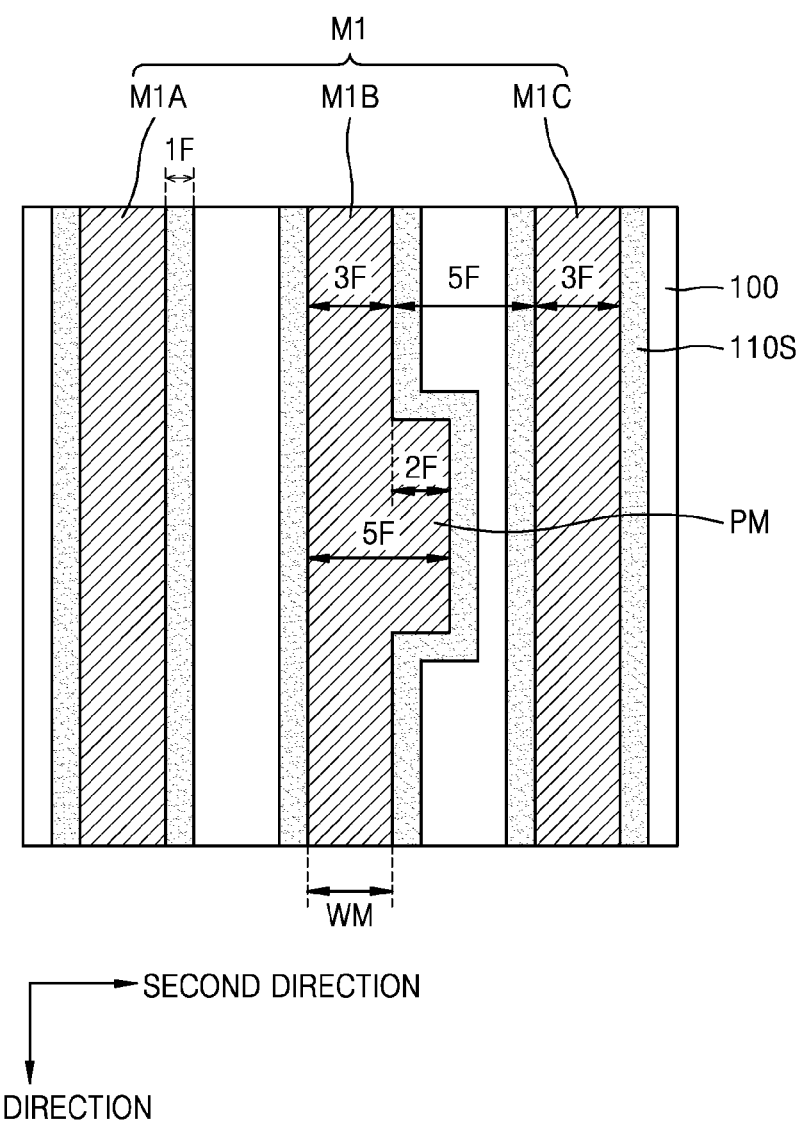

Referring to FIG. 18B, a first spacer layer may be conformally formed on an exposed surface of the first mask layer 100 and the entire surface of the first mask pattern M1 and anisotropically etched to form first spacers 110S.

A width of the first spacers 110S may be equal or similar to a thickness of the first spacer layer. The width of the first spacers 110S may be about ⅓ a mask line width WM of the plurality of mask line patterns M1A, M1B, and M1C. For example, the first spacers 110S may be formed to a width equal or similar to the width (i.e., 1F) of conductive line patterns to be finally formed.

Figure 18C:
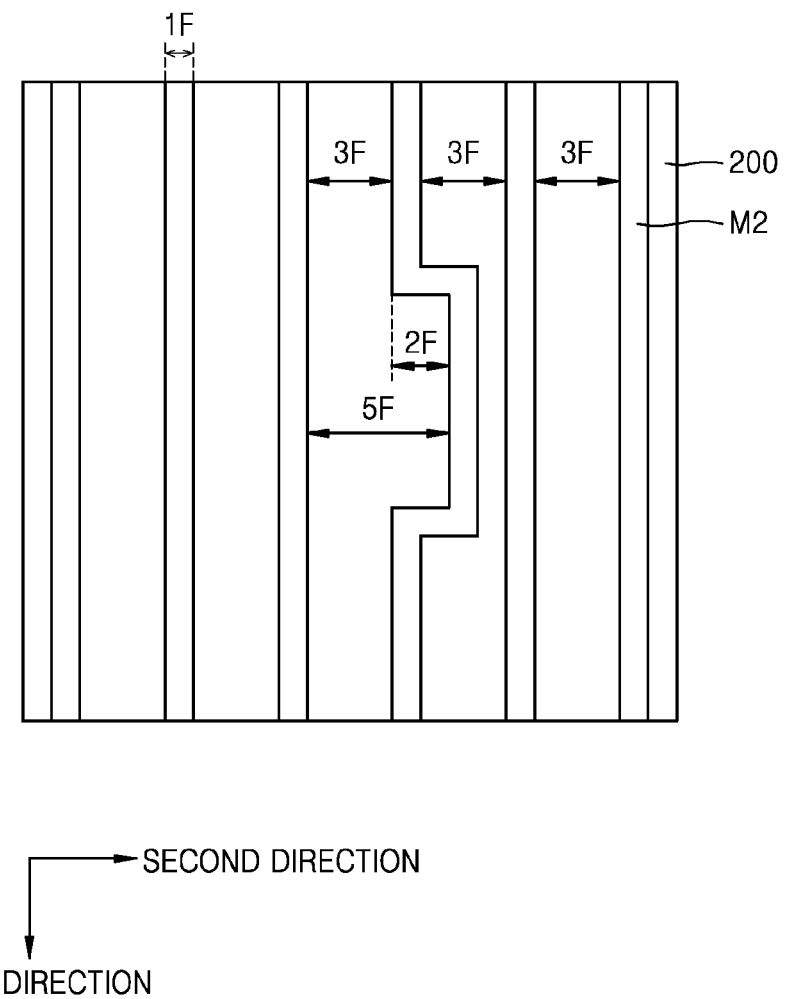

Referring to FIG. 18C, after the first spacers (refer to 110S in FIG. 18B) are formed, the first mask pattern (refer to M1 in FIG. 18B) may be removed. Thereafter, the first mask layer (refer to 100 in FIG. 18B) may be anisotropically etched by using the first spacers 110S as an etch mask to form a second mask pattern M2 on the second mask layer 200.

Figure 18D:
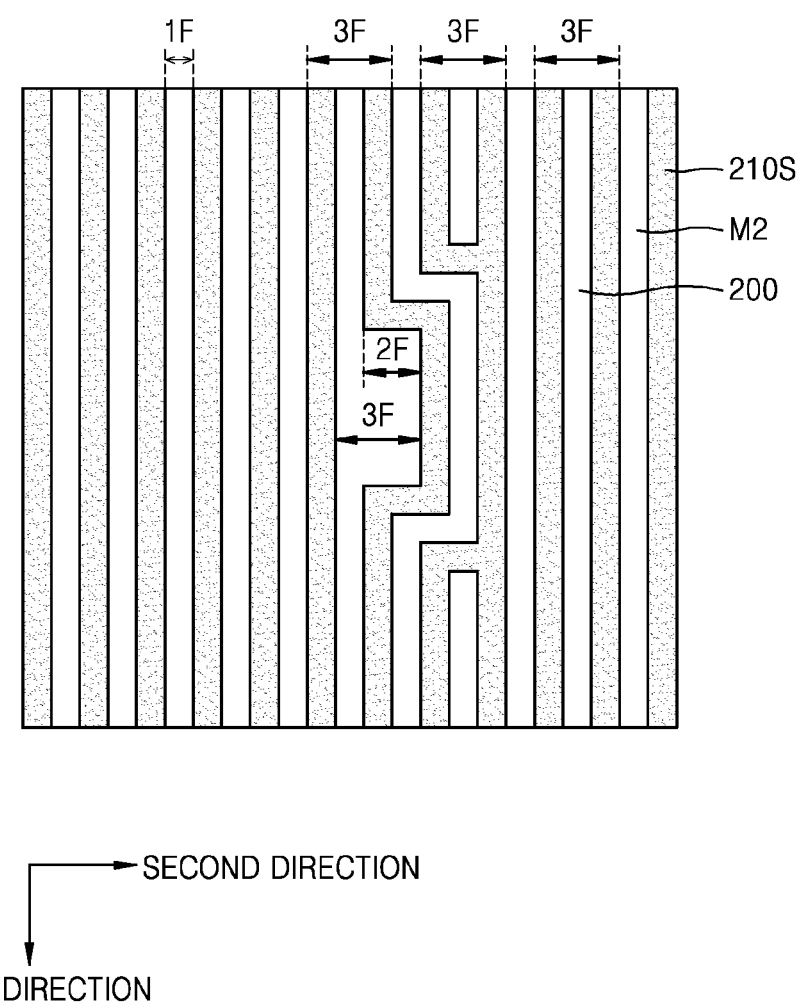

Referring to FIG. 18D, a second spacer layer may be conformally formed on an exposed surface of the second mask layer 200 and the entire surface of the second mask pattern M2 and anisotropically etched to form second spacers 210S.

A width of the second spacers 210S may be equal or similar to a thickness of the second spacer layer. The width of the second spacers 210S may be about ⅓ of a mask line width WM of the plurality of mask line patterns M1A, M1B, and M1C. For example, the second spacers 210S may be formed to a width equal or similar to the width (i.e., 1F) of the conductive line patterns to be finally formed.

Figure 18E:
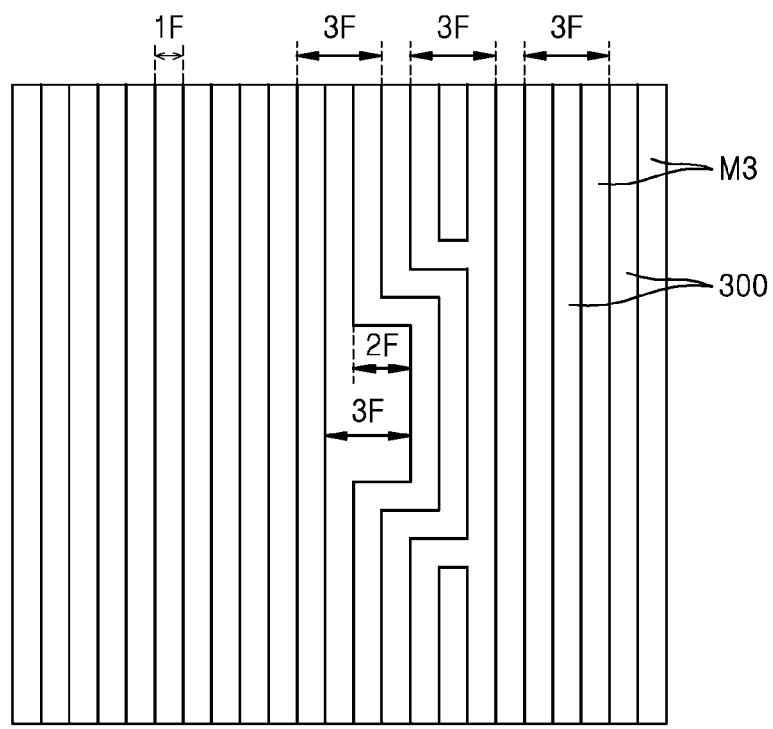

Referring to FIG. 18E, the second mask layer (refer to 200 in FIG. 18D) may be anisotropically etched by using the second spacer (refer to 210S in FIG. 18D) as an etch mask to form a third mask pattern M3 on a third mask layer 300.

Figure 18F:
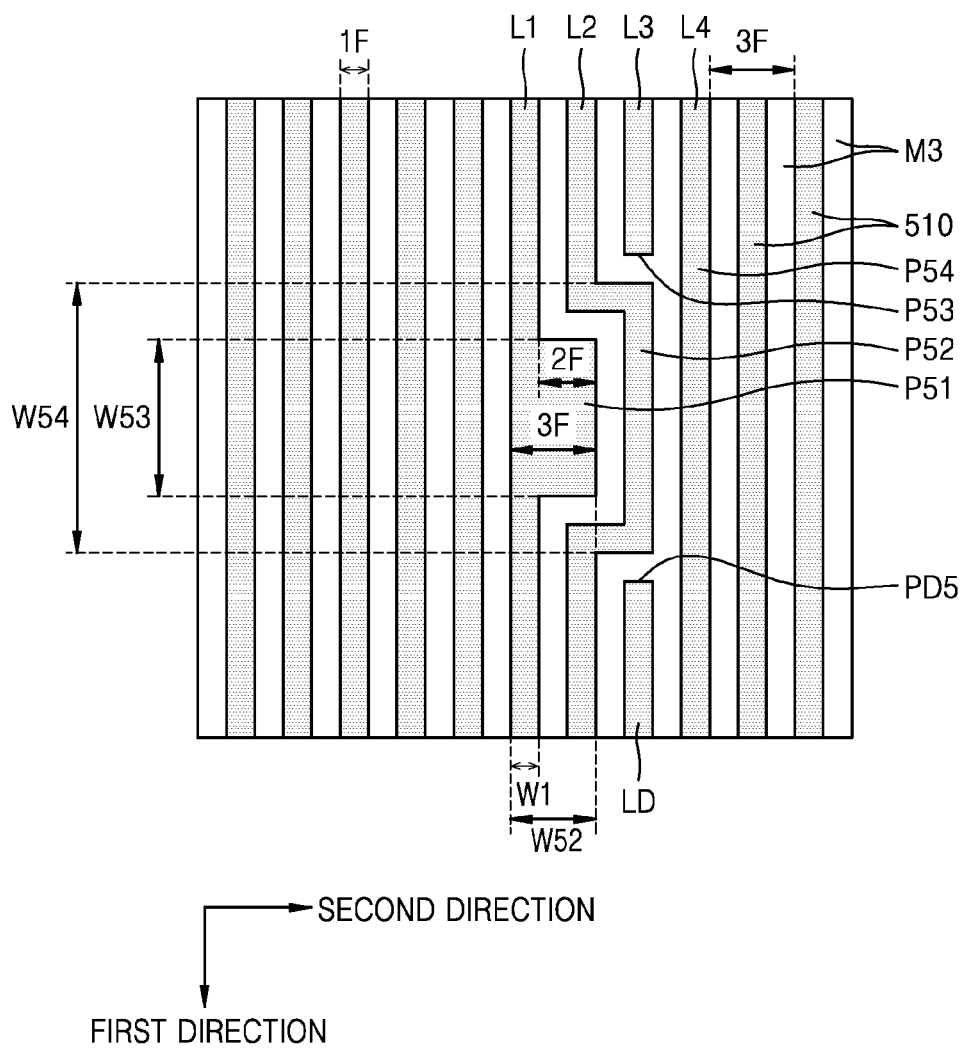

Referring to FIG. 18F, an ultrafine pattern that may exceed the resolution limit may be formed by using QPT. For example, the first mask pattern (refer to M1 in FIG. 18A) having a width greater than 1F may be formed by using a one-time photolithography process. By using the first mask pattern M1 and through the second mask pattern M2, as described above, a third mask pattern M3 having a width of 1F may be formed. Four mask line patterns constituting the third mask pattern M3 may be formed by and may correspond to one mask line pattern included in the first mask pattern M1. A damascene process may be performed by using the third mask pattern M3 as an insulating line pattern so that a plurality of conductive line patterns 510 having a width of 1F may be finally formed.

The plurality of conductive line patterns 510 may include a first conductive line pattern L1, a second conductive line pattern L2, a third conductive line pattern L3, a fourth conductive line pattern L4, and a dummy conductive line pattern LD. The plurality of conductive line patterns 510 may have the same width.

A portion of the first conductive line pattern L1 may include a protrusion P51, which may have a width W52 in the second direction and a width W53 in the first direction. The width W52 of the protrusion P51 may be greater than a width W1 of the first conductive line pattern L1. The protrusion P51 may be formed in the cell array region and/or the page buffer region. The protrusion P51 may be a contact pad.

The protrusion P51 may be formed on one sidewall of the first conductive line pattern L1, and the width W52 of the protrusion P51 may have a size of 3F.

The second conductive line pattern L2 may be formed adjacent to the first conductive line pattern L1 and include a bent portion P52 that may surround the protrusion P51. The bent portion P52 of the second conductive line pattern L2 may have a width W54 in the first direction, and the width W54 of the bent portion P52 may be greater than the width W53 of the protrusion P51.

During a process of forming the protrusion P51 of the first conductive line pattern L1 by using the varied width portion PM of the first mask pattern (refer to M1 in FIG. 18A), the second conductive line pattern L2 adjacent to the first conductive line pattern L1 may be formed to include the bent portion P52.

The third conductive line pattern L3 may be formed adjacent to the second conductive line pattern L2 and have an end portion P53 that may face the bent portion P52 of the second conductive line pattern L2.

Due to the bent portion P52 of the second conductive line pattern L2, the third conductive line pattern L3 may have a length less than each length of the first conductive line pattern L1 and the second conductive line pattern L2 in the first direction.

For example, due to the bent portion P52 of the second conductive line pattern L2, a dummy conductive line pattern LD may be formed in an opposite direction to a direction in which the end portion P53 of the third conductive line pattern L3 faces the bent portion P52 of the second conductive line pattern L2. For example, a dummy conductive line pattern LD may be formed at one side apart from a bent portion P52 of a second conductive line pattern L2, and an end portion P53 of a third conductive line pattern L3 may be formed at the opposite side apart from the bent portion P52. The dummy conductive line pattern LD may have the first width and be parallel to the first direction. The third conductive line pattern L3 and the dummy conductive line pattern LD may be located in a straight line. For example, the third conductive line patterns L3 and the dummy conductive line patterns LD may be disposed in the same line but in different locations disconnected from each other.

For example, the third conductive line pattern L3 and the dummy conductive line pattern LD may be formed apart from each other with the bent portion P52 of the second conductive line pattern L2 therebetween.

The dummy conductive line pattern LD may be formed adjacent to the second conductive line pattern L2 and have an end portion PD5 that may face the bent portion P52 of the second conductive line pattern L2.

The fourth conductive line pattern L4 may be formed adjacent to the third conductive line pattern L3, and a minimum space between the fourth conductive line pattern L4 and the bent portion P52 of the second conductive line pattern L2 may be equal or similar to the width W1 of the first conductive line pattern L1. For example, since the third mask pattern M3 is formed among the plurality of conductive line patterns 510 and a width of the third mask pattern M3 is equal or similar to a width of the plurality of conductive line patterns 510, the minimum space between the fourth conductive line pattern L4 and the bent portion P52 of the second conductive line pattern L2 may be equal or similar to the width of the third mask pattern M3.

FIGS. 19A to 19F are plan views of a process of forming patterns of a semiconductor device according to some exemplary embodiments.

Detailed descriptions of the same elements and functions as described in FIGS. 4A to 14B will be omitted.

Figure 19A:
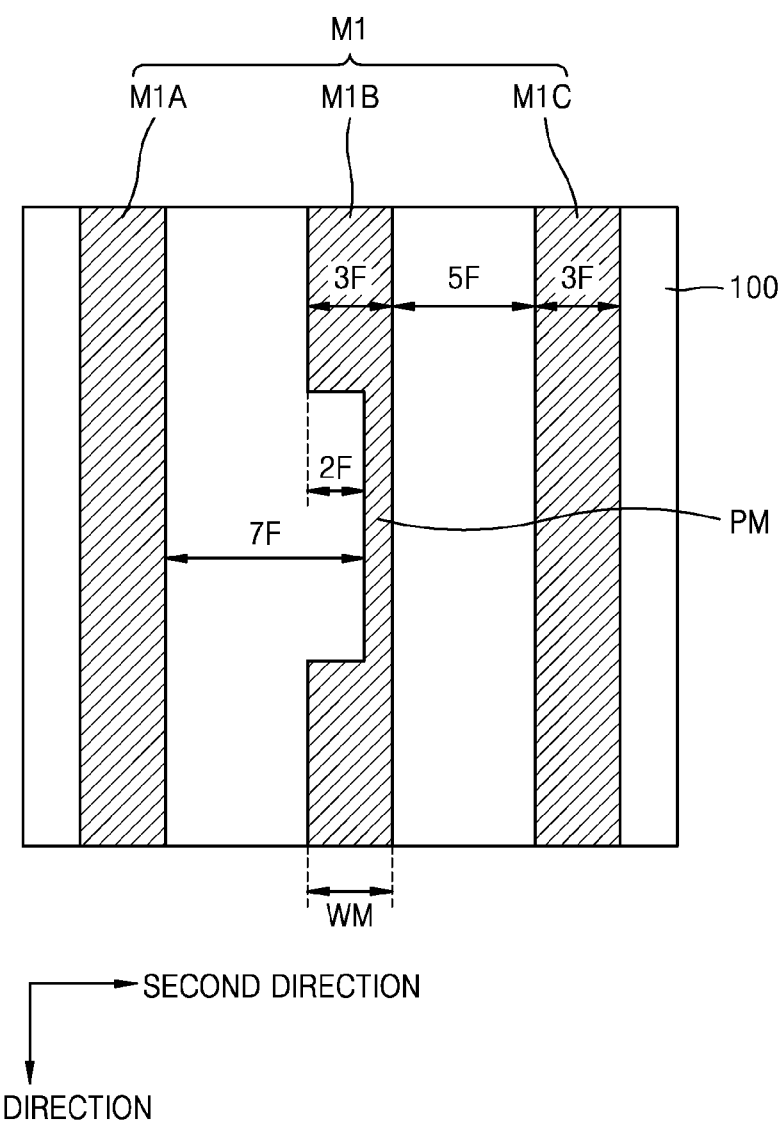
FIGS. 19A to 19F are plan views of a process of forming a pattern of a semiconductor device, according to an exemplary embodiment.

Referring to FIG. 19A, a first mask pattern M1 may be formed on a first mask layer 100 or a material layer formed on the first mask layer 100. The first mask pattern M1 may include a plurality of mask line patterns, for example, mask line patterns M1A, M1B, and M1C. The mask line width WM of the plurality of mask line patterns M1A, M1B, and M1C may be greater than 1F, the target width of the eventual conductive line patterns. Distances between the plurality of mask line patterns M1A, M1B, and M1C may be greater than the mask line width WM. The mask line width WM and a distance between the plurality of mask line patterns M1A, M1B, and M1C may be modified according to sizes and arrangements of conductive line patterns and contact pads to be finally formed. For example, the mask line width WM and the distance between the mask line patterns M1A, M1B, and M1C may have other values and/or forms than those in the FIG. 19A.

A varied width portion PM may be formed in a portion of the first mask line pattern M1B. The varied width portion PM may be formed by recessing one sidewall of the first mask line pattern M1B to a width of 2F. Thus, the varied width portion PM may have a width of 1F and have a rectangular shape with a predetermined length in the first direction. For example, an empty rectangular shape may be formed between and by the first mask line patterns M1A and M1B, which makes a 7F distance between the line pattern M1A and the varied width portion PM in the second direction and the predetermined length in the first direction. Since positions, sizes, and shapes of contact pads to be finally formed depend on a position, size, and shape of the varied width portions PM, the shape of the varied width portion PM may vary. For example, the positions, sizes, and shapes of the varied width portions PM may have other values and/or forms than those of FIG. 19A.

Figure 19B:
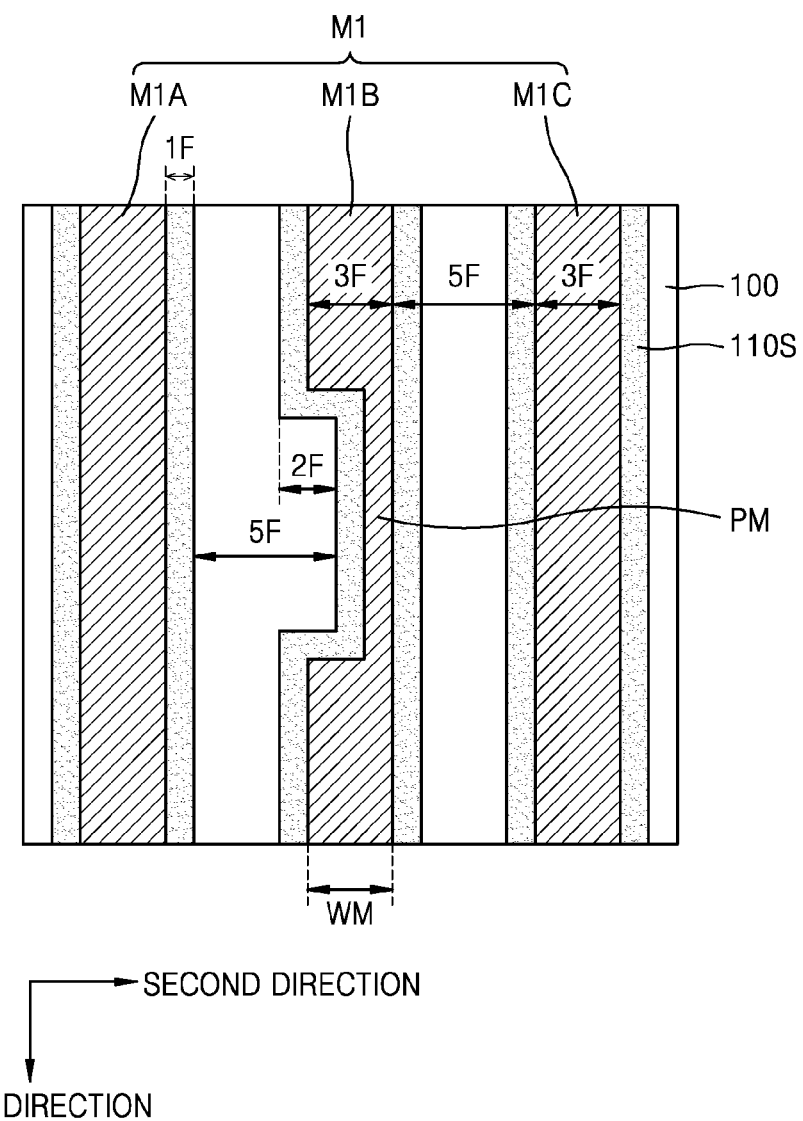

Referring to FIG. 19B, a first spacer layer may be conformally formed on an exposed surface of the first mask layer 100 and the entire surface of the first mask pattern M1 and anisotropically etched to form first spacers 110S.

A width of the first spacers 110S may be equal or similar to a thickness of the first spacer layer. The width of the first spacers 110S may be about ⅓ a mask line width WM of the plurality of mask line patterns M1A, M1B, and M1C. For example, the first spacers 110S may be formed to a width equal or similar to the width (i.e., 1F) of conductive line patterns to be finally formed.

Figure 19C:
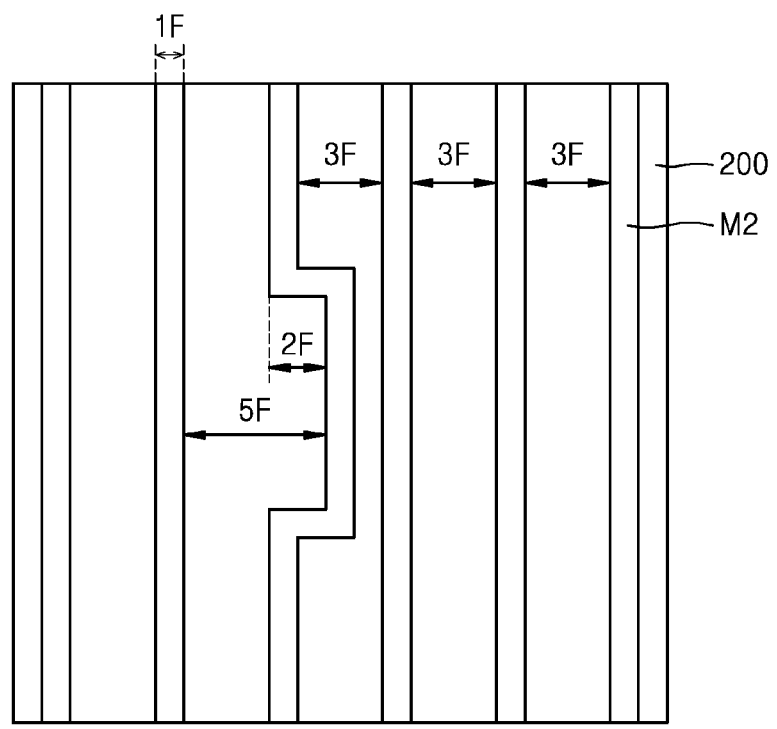
Figure 19C:
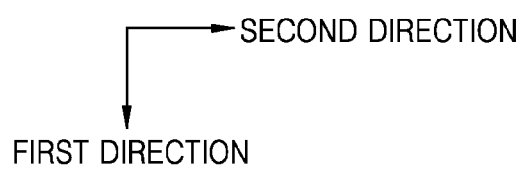

Referring to FIG. 19C, after the first spacers (refer to 110S in FIG. 19B) are formed, the first mask pattern (refer to M1 in FIG. 19B) may be removed. Thereafter, the first mask layer (refer to 100 in FIG. 19B) may be anisotropically etched by using the first spacers (refer to 110S in FIG. 19B) as an etch mask so that a second mask pattern M2 may be formed on a second mask layer 200.

Figure 19D:
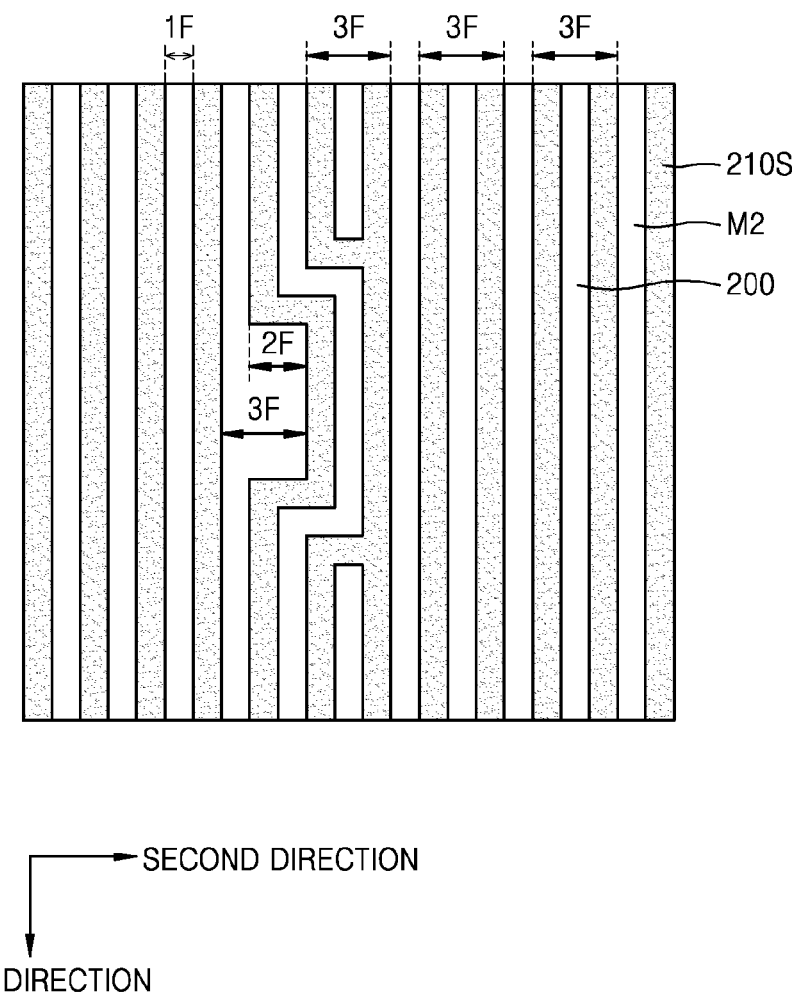

Referring to FIG. 19D, a second spacer layer may be conformally formed on an exposed surface of the second mask layer 200 and the entire surface of the second mask pattern M2 and anisotropically etched to form second spacers 210S.

A width of the second spacers 210S may be equal or similar to a thickness of the second spacer layer. The width of the second spacers 210S may be about ⅓ the mask line width WM of the plurality of mask line patterns M1A, M1B, and M1C. For example, the second spacers 210S may be formed to a width equal or similar to the width (i.e., 1F) of the conductive line patterns to be finally formed.

Figure 19E:
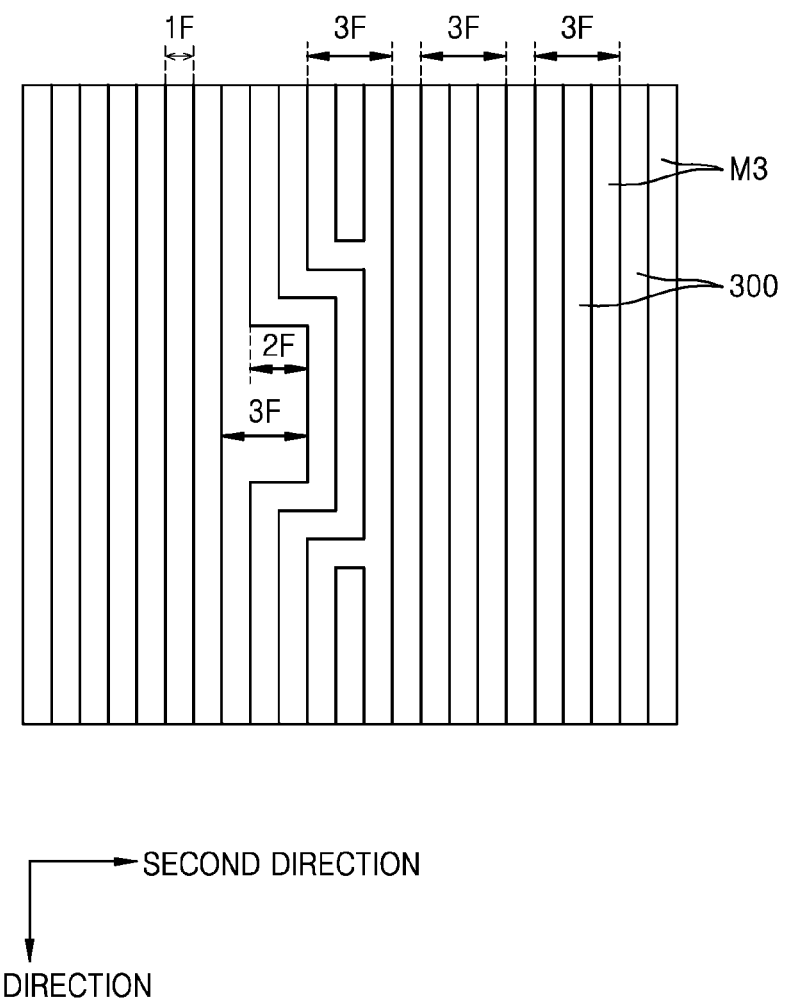

Referring to FIG. 19E, the second mask layer (refer to 200 in FIG. 19D) may be anisotropically etched by using the second spacer (refer to 210S in FIG. 19D) as an etch mask to form a third mask pattern M3 on a third mask layer 300.

Figure 19F:
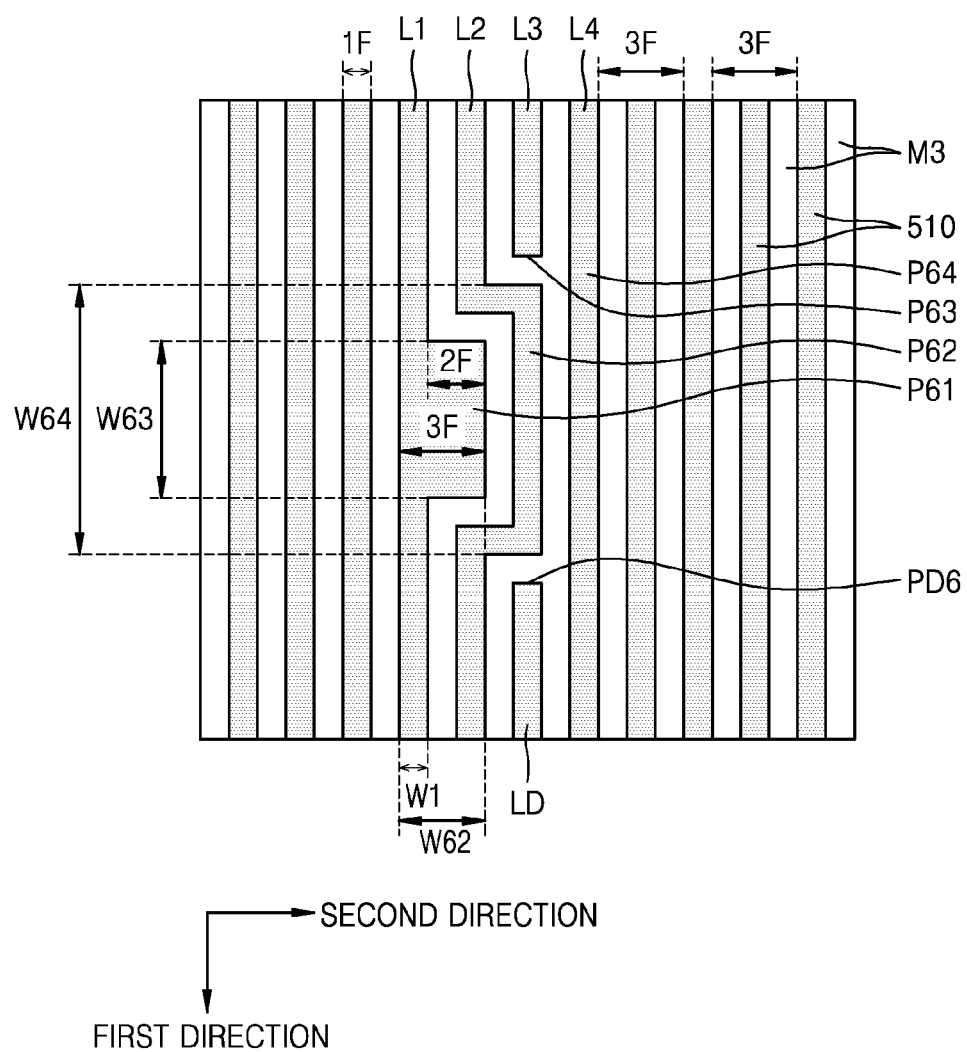

Referring to FIG. 19F, an ultrafine pattern that may exceed the resolution limit may be formed by using QPT. For example, the first mask pattern (refer to M1 in FIG. 19A) having a width greater than 1F may be formed by using a one-time photolithography process. By using the first mask pattern M1 and through the second mask pattern M2, as described above, a third mask pattern M3 having a width of 1F may be formed. Four mask line patterns constituting the third mask pattern M3 may be formed by and may correspond to one mask line pattern included in the first mask pattern M1. A damascene process may be performed by using the third mask pattern M3 as an insulating line pattern so that a plurality of conductive line patterns 510 having a width of 1F may be finally formed.

The plurality of conductive line patterns 510 may include a first conductive line pattern L1, a second conductive line pattern L2, a third conductive line pattern L3, a fourth conductive line pattern L4, and a dummy conductive line pattern LD. The plurality of conductive line patterns 510 may have the same width.

A portion of the first conductive line pattern L1 may include a protrusion P61 may have a width W62 in the second direction and a width W63 in the first direction. The width W62 of the protrusion P61 may be greater than the width W1 of the first conductive line pattern L1. The protrusion P61 may be formed in a cell array region and/or a page buffer region. The protrusion P61 may be a contact pad.

The protrusion P61 may be formed on one sidewall of the first conductive line pattern L1, and the width W62 of the protrusion P61 may have a size of 3F, three times of the width of the conductive line patterns.

The second conductive line pattern L2 may be formed adjacent to the first conductive line pattern L1 and include a bent portion P62 that may surround the protrusion P61. The bent portion P62 of the second conductive line pattern L2 may have a width W64 in the first direction, and the width W64 of the bent portion P62 may be greater than the width W63 of the protrusion P61.

During a process of forming the protrusion P61 of the first conductive line pattern L1 by using the varied width portion PM of the first mask pattern (refer to M1 in FIG. 19A), the second conductive line pattern L2 adjacent to the first conductive line pattern L1 may be formed to include the bent portion P62.

The third conductive line pattern L3 may be formed adjacent to the second conductive line pattern L2 and have an end portion P63 that may face the bent portion P62 of the second conductive line pattern L2.

Due to the bent portion P62 of the second conductive line pattern L2, the third conductive line pattern L3 may have a length less than each length of the first conductive line pattern L1 and the second conductive line pattern L2 in the first direction.

For example, due to the bent portion P62 of the second conductive line pattern L2, a dummy conductive line pattern LD may be formed in an opposite direction to a direction in which the end portion P63 of the third conductive line pattern L3 faces the bent portion P62 of the second conductive line pattern L2. For example, a dummy conductive line pattern LD may be formed at one side apart from a bent portion P62 of a second conductive line pattern L2, and an end portion P63 of a third conductive line pattern L3 may be formed at the opposite side apart from the bent portion P62. The dummy conductive line pattern LD may have the first width and be parallel to the first direction. The third conductive line pattern L3 and the dummy conductive line pattern LD may be located in a straight line. For example, the third conductive line patterns L3 and the dummy conductive line patterns LD may be disposed in the same line but in different locations disconnected from each other.

For example, the third conductive line pattern L3 and the dummy conductive line pattern LD may be formed apart from each other with the bent portion P62 of the second conductive line pattern L2 therebetween.

The dummy conductive line pattern LD may be formed adjacent to the second conductive line pattern L2 and have an end portion PD6 that may face the bent portion P62 of the second conductive line pattern L2.

The fourth conductive line pattern L4 may be formed adjacent to the third conductive line pattern L3, and a minimum space between the fourth conductive line pattern L4 and the bent portion P62 of the second conductive line pattern L2 may be equal or similar to the width W1 of the first conductive line pattern L1. For example, since the third mask pattern M3 is formed among the plurality of conductive line patterns 510 and a width of the third mask pattern M3 is equal or similar to a width of the plurality of conductive line patterns 510, the minimum space between the fourth conductive line pattern L4 and the bent portion P62 of the second conductive line pattern L2 may be equal or similar to the width of the third mask pattern M3.

While the inventive concept has been particularly shown and described with reference to exemplary embodiments thereof, it will be understood that various changes in form and details may be made therein without departing from the spirit of this disclosure, and scope of the invention may be interpreted by the following claims.

What is claimed is:

1. A semiconductor device comprising:
a plurality of line patterns spaced apart from one another formed on a substrate, the plurality of line patterns having a first width and extending parallel to one another in a first direction;
a first line pattern of the plurality of line patterns, the first line pattern including a wider portion having a second width greater than the first width in a second direction perpendicular to the first direction;
a second line pattern of the plurality of line patterns and located adjacent to the first line pattern, the second line pattern being spaced apart from the wider portion of the first line pattern and conformally formed about the wider portion of the first line pattern; and
a third line pattern selected from the plurality of line patterns and located adjacent to the second line pattern, the third line pattern including an end portion,
wherein the plurality of line patterns comprises a plurality of second line patterns and a plurality of third line patterns,
the wider portion of the first line pattern protrude from both sidewalls of the first line pattern in the second direction, and
two second line patterns are respectively located on both sides of the wider portion, and the two second line patterns are spaced apart from the wider portion of the first line pattern and conformally formed about the wider portion of the first line pattern.

2. The device of claim 1, wherein
two third line patterns are located adjacent to the respective second line patterns, and include respective end portions, and, with respect to a line extending in the second direction that intersects the third line pattern at the respective end portions of the third line patterns, the distances between respective first line patterns and respective second line patterns are substantially the same as the distances between the respective second line patterns and the respective third line patterns.

3. The device of claim 2, wherein the two second line patterns are in a mirror-image relationship to each other with respect to the wider portion of the first line pattern.

4. The device of claim 2, wherein the end portions of the two third line patterns face the conformally formed portions of the two second line patterns in the first direction respectively.

5. The device of claim 2, wherein the end portions of the third line patterns are spaced apart from the conformally formed portions of the second line patterns by a substantially same distance as the first width.

6. The device of claim 1, wherein a length of the third line pattern is less than a length of the first line pattern and the second line pattern in the first direction.

7. The device of claim 1, wherein the plurality of line patterns further comprise a dummy line pattern located opposite the end portion of the third line pattern across the conformally formed portion of the second line pattern in the first direction, wherein the dummy line pattern has a substantially same width as the first width and is parallel to the first direction.

8. The device of claim 7, wherein a length of the dummy line pattern is less than a length of the first line pattern and the second line pattern in the first direction.

9. The device of claim 1, wherein the wider portion of the first line pattern has a third width in the first direction, the conformally formed portion of the second line pattern has a fourth width in the first direction, and the fourth width is greater than the third width.

10. The device of claim 1, wherein a fourth line pattern is located adjacent to the third line pattern, and a minimum space between the fourth line pattern and the conformally formed portion of the second line pattern is substantially equal to the first width.

11. The device of claim 1, wherein a fourth line pattern is located adjacent to the third line pattern, and a minimum space between the fourth line pattern and the conformally formed portion of the second line pattern is greater than the first width.

12. The device of claim 1, wherein the plurality of line patterns comprise a plurality of bit lines included in a memory device of the semiconductor device.

13. A semiconductor device comprising:

a plurality of line patterns spaced apart from one another formed on a substrate, the plurality of line patterns having a first width and extending parallel to one another in a first direction;

a first line pattern of the plurality of line patterns, the first line pattern including a wider portion having a second width greater than the first width in a second direction perpendicular to the first direction;

a second line pattern of the plurality of line patterns and located adjacent to the first line pattern, the second line pattern being spaced apart from the wider portion of the first line pattern and conformally formed about the wider portion of the first line pattern; and a third line pattern selected from the plurality of line patterns and located adjacent to the second line pattern, the third line pattern including an end portion, wherein the second line pattern is formed between the first line pattern and the third line pattern, and, with respect to a line extending in the second direction that intersects the third line pattern at the end portion of the third line pattern, the distance between the first line pattern and the second line pattern is substantially the same as the distance between the second line pattern and the third line pattern, wherein the wider portion protrudes from one sidewall of the first line pattern, the second line pattern is located in a position facing the wider portion, and the end portion of the third line pattern is located near the conformally formed portion of the second line pattern, wherein the end portion of the third line pattern is spaced apart from the conformally formed portion of the second line pattern by a substantially same distance as the first width in the first direction.

14. The device of claim 13, wherein the end portion of the third line pattern faces the conformally formed portion of the second line pattern in the first direction.

15. The device of claim 13, wherein the wider portion is a contact pad and the device further comprises a conductive via in contact with the contact pad.

16. A semiconductor device comprising:

a plurality of line patterns formed on a substrate having a first width and extending in a first direction parallel to one another, the plurality of line patterns spaced apart from one another in a second direction perpendicular to the first direction;

a first line pattern of the plurality of line patterns, the first line pattern including a first wider portion having a second width taken in the second direction greater than the first width taken in the second direction;

a second line pattern of the plurality of line patterns located adjacent to the first line pattern, the second line pattern comprising a second wider portion having a third width greater than the first width in the second direction and a first conformal portion conformally formed about the first wider portion and spaced apart from the first wider portion; and a third line pattern of the plurality of line patterns and located adjacent to the second line pattern, the third line pattern comprising a third wider portion having a fourth width in the second direction greater than the first width, a second conformal portion conformally formed about the second wider portion and spaced apart from the second wider portion, and an end portion located near the first conformal portion, wherein the second line pattern is formed between the first line pattern and the third line pattern, and, with respect to a line extending in the second direction that intersects the third line pattern at the end portion of the third line pattern, the distance between the first line pattern and the second line pattern is substantially the same as the distance between the second line pattern and the third line pattern.

17. The device of claim 16, wherein the first wider portion protrudes from one sidewall of the first line pattern, the second wider portion protrudes from one sidewall of the second line pattern, and the third wider portion protrudes from one sidewall of the third line pattern.

18. The device of claim 16, wherein the third line pattern has a length less than each of the first line pattern and the second line pattern in the first direction.

19. The device of claim 16, wherein the end portion of the third line pattern faces the first conformal portion of the second line pattern.

20. The device of claim 16, wherein a distance between the second wider portion of the second line pattern and the first conformal portion in the first direction is substantially equal to a distance between the third wider portion of the third line pattern and the second conformal portion in the first direction.

* * * * *